(12) United States Patent
Lee et al.

(10) Patent No.: US 8,130,067 B2
(45) Date of Patent: Mar. 6, 2012

(54) HIGH FREQUENCY SEMICONDUCTOR TRANSFORMER

(75) Inventors: Dok Won Lee, Mountain View, CA (US); Peter Smeys, San Jose, CA (US); Anuraag Mohan, Fremont, CA (US); Peter J. Hopper, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 92 days.

(21) Appl. No.: 12/777,654

(22) Filed: May 11, 2010

(65) Prior Publication Data
US 2011/0279214 A1 Nov. 17, 2011

(51) Int. Cl.
*H01F 5/00* (2006.01)
*G01R 33/02* (2006.01)
*C21D 1/04* (2006.01)

(52) U.S. Cl. ........ 336/200; 336/212; 336/223; 336/232; 336/221; 324/249; 148/108

(58) Field of Classification Search ............... 336/200, 336/223, 232, 212, 213, 221; 324/249; 148/108, 148/311
See application file for complete search history.

(56) References Cited

U.S. PATENT DOCUMENTS

| | | | |
|---|---|---|---|
| 1,774,856 A * | 9/1930 | Deventer | 336/219 |
| 3,131,078 A * | 4/1964 | Fuller et al. | 427/599 |
| 4,253,127 A * | 2/1981 | Kodama et al. | 360/125.15 |
| 4,547,961 A | 10/1985 | Bokil et al. | |
| 4,780,795 A | 10/1988 | Meinel | |
| 4,845,454 A * | 7/1989 | Watanabe et al. | 336/212 |
| 4,967,156 A * | 10/1990 | Seitz | 324/249 |
| 5,199,178 A * | 4/1993 | Tong et al. | 33/361 |
| 5,335,127 A | 8/1994 | Nagata et al. | |
| 5,609,946 A * | 3/1997 | Korman et al. | 428/209 |
| 5,995,342 A * | 11/1999 | Cohen et al. | 360/125.35 |
| 6,160,721 A * | 12/2000 | Kossives et al. | 363/15 |
| 6,611,191 B2 * | 8/2003 | Nishimizu et al. | 336/212 |
| 6,700,371 B2 | 3/2004 | Witcraft et al. | |
| 6,769,169 B2 * | 8/2004 | Nishimizu et al. | 29/602.1 |
| 7,107,666 B2 * | 9/2006 | Hiatt et al. | 29/602.1 |
| 7,518,248 B2 | 4/2009 | Li et al. | |
| 7,544,995 B2 | 6/2009 | Lotfi et al. | |
| 7,605,092 B2 | 10/2009 | Chen et al. | |
| 2003/0070282 A1 * | 4/2003 | Hiatt et al. | 29/602.1 |

OTHER PUBLICATIONS

Gao et al., "An integrated solenoid-type inductor with electroplated Ni-Fe magnetic core", 12th Biennial IEEE Conference on Electromagnetic Field Computation, 2006, p. 138.

Lee et al., "Design and Fabrication of Integrated Solenoid Inductors with Magnetic Cores", 2008 Electronic Components and Technology Conference, 2008, pp. 701-705.

Gao et al., "Fabrication of solenoid-type inductor with electroplated NiFe magnetic core", Journal of Magnetism and Magnetic Materials, 305, 2006, pp. 207-211.

(Continued)

*Primary Examiner* — Anh Mai
*Assistant Examiner* — Joselito Baisa
(74) *Attorney, Agent, or Firm* — Mark C. Pickering

(57) ABSTRACT

A semiconductor transformer provides high frequency operation by forming the primary windings of the transformer around a section of magnetic material that has a hard axis that lies substantially parallel to the direction of the magnetic field generated by the primary windings. The core can also be formed to have a number of sections where the magnetic flux follows the hard axis through each section of the core.

20 Claims, 77 Drawing Sheets

OTHER PUBLICATIONS

Lee et al., "Embedded Integrated Inductors with a Single Layer Magnetic Core: A Realistic Option", International Workshop on Power Supply on Chip, Sep. 22-24, 2008, pp. 1-37.

Lee et al., "Composite-anisotrophy amorphous magnetic materials for high-frequency devices", Journal of Applied Physics, 97, 10F911, 2005, pp. 10F911-1 through 10F911-3.

Lee, "Integrated Inductor with Magnetic Core: A Realistic Option", A Dissertation Submitted to the Department of Materials Science and Engineering and the Committee on Graduate Studies of Stanford University in Partial Fulfillment of the Requirements for the Degree of Doctor of Philosophy, Dec. 2008, pp. i-xiv and 1-99.

Gan, "On-Chip Transformer Modeling, Characterization, and Applications in Power and Low Noise Amplifiers", A Dissertation Submitted to the Department of Electrical Engineering and the Committee on Graduate Studies of Stanford University in Partial Fulfillment of the Requirements for the Degree of Doctor of Philosophy, Mar. 2006, pp. i-xv and 1-105.

Kim, "Integrated On-Chip Magnetic Transformer Design and Simulation", A Thesis Submitted to the Department of Electrical Engineering and the Committee on Graduate Studies of Stanford University in Partial Fulfillment of the Requirements for the Degree of Master of Science, Jun. 2008, pp. 1-24.

Wright et al., "Analysis of Integrated Solenoid Inductor with Closed Magnetic Core", Presented at 11th Joint MMM-Intermag Conference, Jan. 2010, IEEE Transactions on Magnetics, vol. 46, No. 6, Jun. 2010, pp. 2387-2390.

* cited by examiner

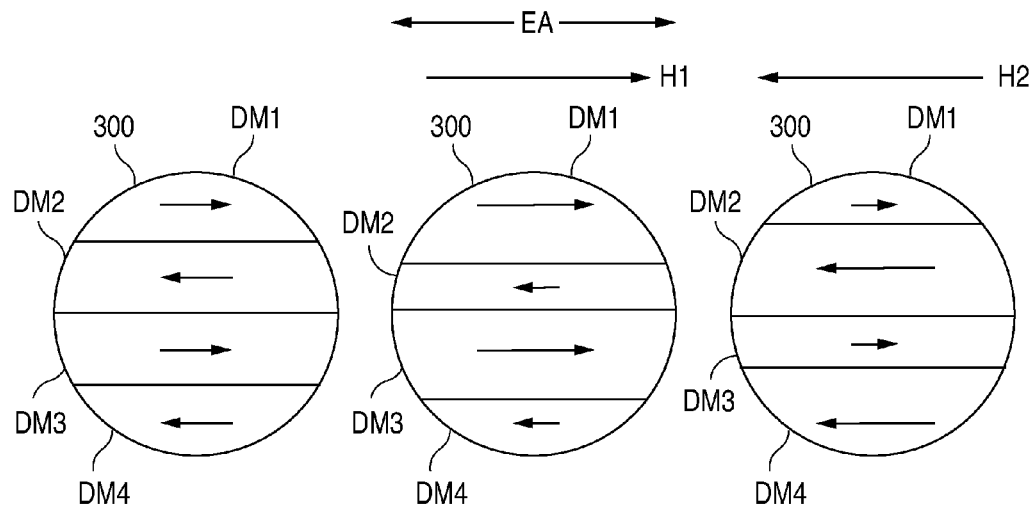
FIG. 3A  FIG. 3B  FIG. 3C
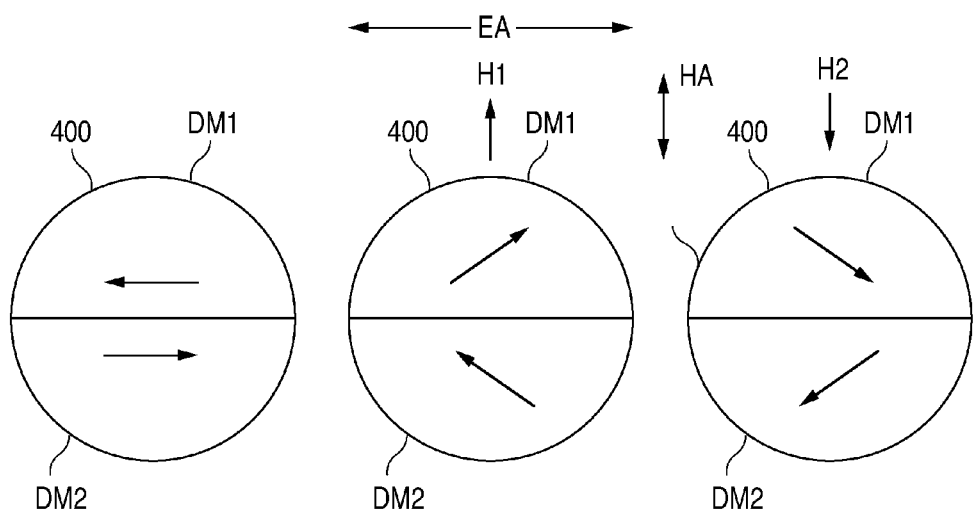
FIG. 4A  FIG. 4B  FIG. 4C

HIGH FREQUENCY SEMICONDUCTOR TRANSFORMER

BACKGROUND OF THE INVENTION

1. Field of the Invention

The present invention relates to transformers and, more particularly, to a high-frequency semiconductor transformer.

2. Description of the Related Art

A transformer is a well-known structure that inductively transfers electrical energy from a primary coil to a secondary coil. Transformers commonly use a magnetic material, known as a core, to increase the inductance and the amount of energy that is transferred from the primary coil to the secondary coil.

BRIEF DESCRIPTION OF THE DRAWINGS

FIG. 1A is a plan view, and FIG. 1B is a cross-sectional view taken along line 1B-1B of FIG. 1A.

FIGS. 3A-3C are views of a portion of a soft magnetic material 300 illustrating the operation of transformer 100 in accordance with the present invention.

FIGS. 4A-4C are views of a portion of a soft magnetic material 400 further illustrating the operation of transformer 100 in accordance with the present invention.

FIG. 8A is a plan view, FIG. 8B is a cross-sectional view taken along line 8B-8B of FIG. 8A, and FIG. 8C is a plan view taken along line 8C-8C of FIG. 8B.

FIG. 9A is a plan view, FIG. 9B is a cross-sectional view taken along line 9B-9B of FIG. 9A, and FIG. 9C is a plan view taken along line 9C-9C of FIG. 9B.

FIG. 10A is a plan view, FIG. 10B is a cross-sectional view taken along line 10B-10B of FIG. 10A, and FIG. 10C is a plan view taken along line 10C-10C of FIG. 10B.

FIG. 11 is a plan view, FIGS. 12A-17A are cross-sectional views taken along line 11A-11A of FIG. 11, FIGS. 12B-17B are cross-sectional views taken along line 11B-11B of FIG. 11, and FIGS. 12C-17C are cross-sectional views taken along line 11C-11C of FIG. 11. FIG. 18 is a plan view, FIGS. 19A-24A are cross-sectional views taken along line 18A-18A of FIG. 18, FIGS. 19B-24B are cross-sectional views taken along line 18B-18B of FIG. 18, and FIGS. 19C-24C are cross-sectional views taken along line 18C-18C of FIG. 18. FIG. 25 is a plan view, FIGS. 26A-31A are cross-sectional views taken along line 25A-25A of FIG. 25, FIGS. 26B-31B are cross-sectional views taken along line 25B-25B of FIG. 25, and FIGS. 26C-31C are cross-sectional views taken along line 25C-25C of FIG. 25.

FIG. 32 is a plan view, FIGS. 33A-38A are cross-sectional views taken along line 32A-32A of FIG. 32, FIGS. 33B-38B are cross-sectional views taken along line 32B-32B of FIG. 32, and FIGS. 33C-38C are cross-sectional views taken along line 32C-32C of FIG. 32. FIG. 39 is a plan view, FIGS. 40A-48A are cross-sectional views taken along line 39A-39A of FIG. 39, FIGS. 40B-48B are cross-sectional views taken along line 39B-39B of FIG. 39, and FIGS. 40C-48C are cross-sectional views taken along line 39C-39C of FIG. 39. FIG. 49 is a plan view, FIGS. 50A-55A are cross-sectional views taken along line 49A-49A of FIG. 49, FIGS. 50B-50B are cross-sectional views taken along line 49B-49B of FIG. 49, and FIGS. 50C-55C are cross-sectional views taken along line 49C-49C of FIG. 49.

FIG. 56 is a plan view, FIGS. 57A-62A are cross-sectional views taken along line 56A-56A of FIG. 56, FIGS. 57B-62B are cross-sectional views taken along line 56B-56B of FIG. 56, and FIGS. 57C-62C are cross-sectional views taken along line 56C-56C of FIG. 56. FIG. 63 is a plan view, FIGS. 64A-69A are cross-sectional views taken along line 63A-63A of FIG. 63, FIGS. 64B-69B are cross-sectional views taken along line 63B-63B of FIG. 63, and FIGS. 64C-69C are cross-sectional views taken along line 63C-63C of FIG. 63. FIG. 70 is a plan view, FIGS. 71A-76A are cross-sectional views taken along line 70A-70A of FIG. 70, FIGS. 71B-76B are cross-sectional views taken along line 70B-70B of FIG. 70, and FIGS. 71C-76C are cross-sectional views taken along line 70C-70C of FIG. 70.

DETAILED DESCRIPTION OF THE INVENTION

Figure 1A:
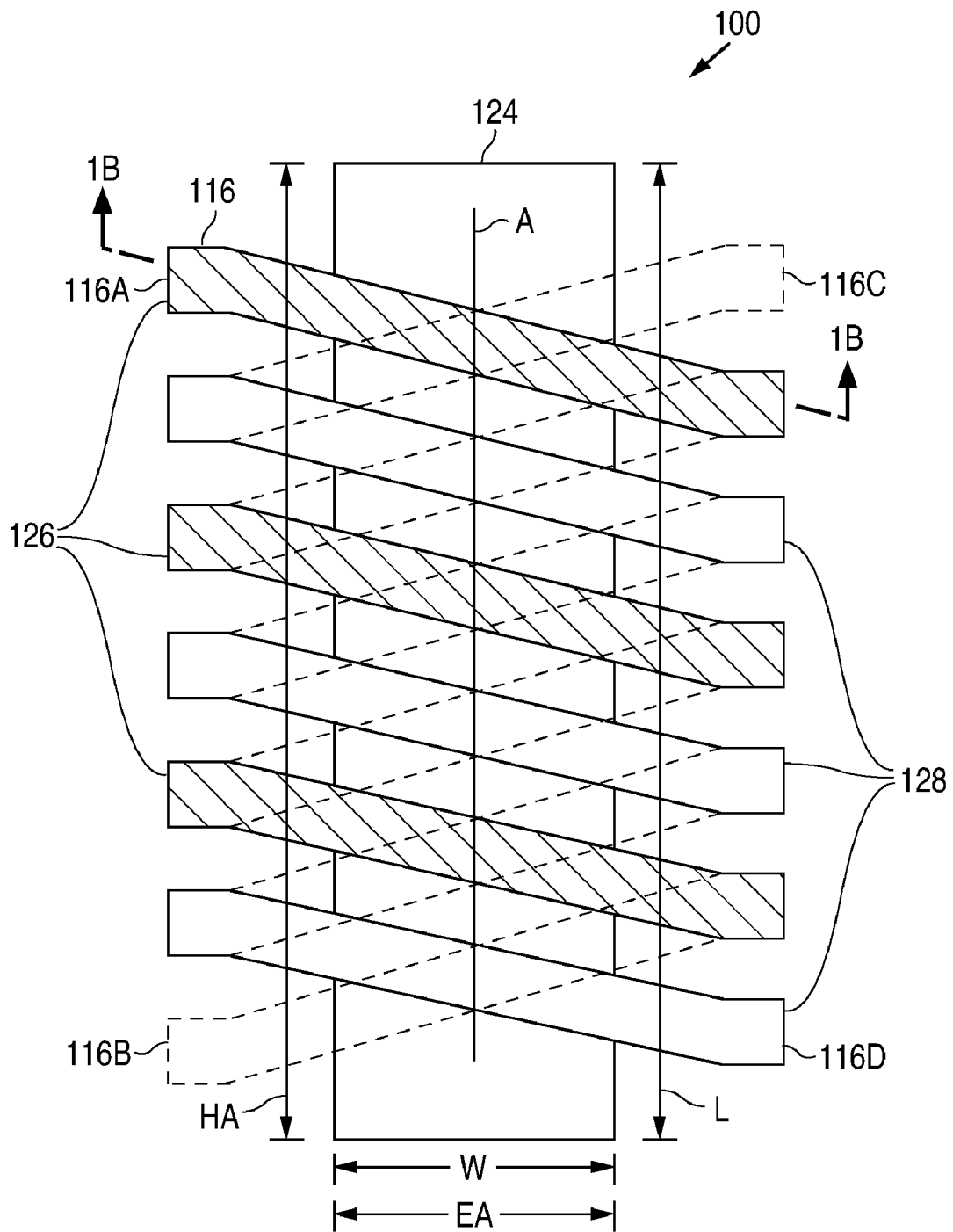
FIGS. 1A-1B are a series of views illustrating a first example of a high-frequency semiconductor transformer 100 in accordance with the present invention.
Figure 1B:
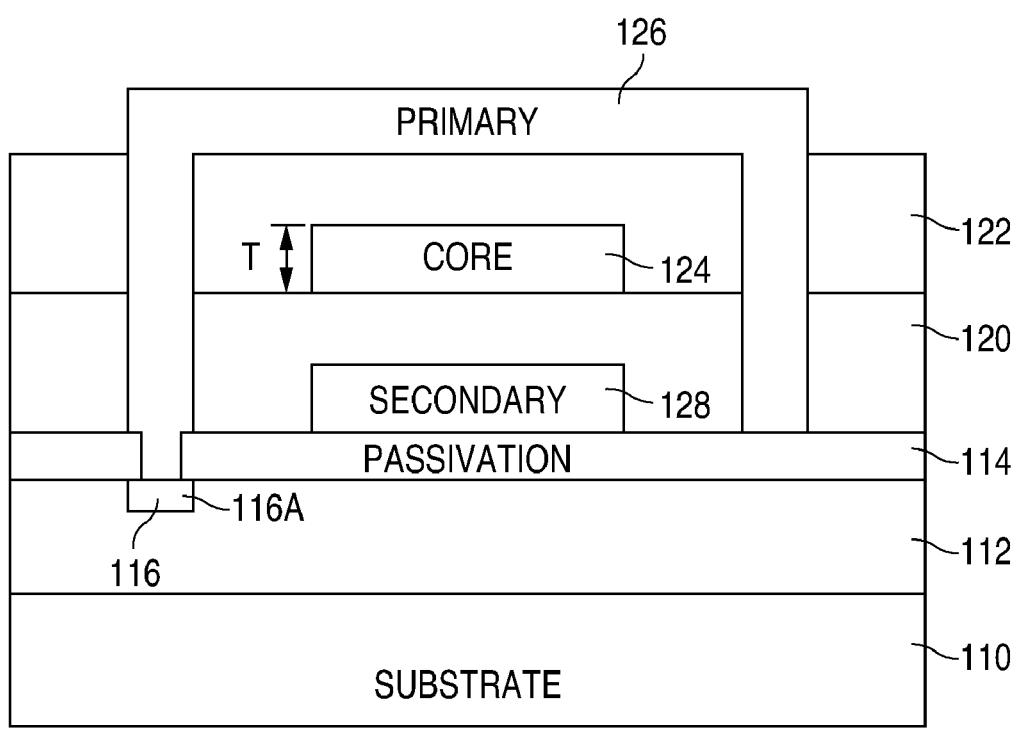

FIGS. 1A-1B show a series of views that illustrate a first example of a high-frequency semiconductor transformer 100 in accordance with the present invention. FIG. 1A shows a plan view, and FIG. 1B shows a cross-sectional view taken along line 1B-1B of FIG. 1A. As described in greater detail below, the present invention describes several examples of semiconductor transformers that provide high-frequency operation by forming the primary windings of the transformer around a section of magnetic material that has a hard axis that lies substantially parallel to the direction of the magnetic field generated by the primary windings. Several examples illustrate the core with multiple sections where the magnetic flux follows the hard axis through each section of the core.

As shown in FIGS. 1A-1B, the transformer 100 includes a semiconductor substrate 110, and a metal interconnect structure 112 that touches the top surface of the substrate 110. The semiconductor substrate 110 includes a large number of electrical devices, such as transistors, resistors, capacitors, and diodes.

The metal interconnect structure 112, which electrically connects the electrical devices together to form a circuit, includes a number of levels of metal traces, a large number of contacts that connect the bottom metal trace to electrically conductive regions on the semiconductor substrate 110, and a large number of inter-metal vias that connect the metal traces in adjacent layers together.

In addition, the metal interconnect structure 112 includes a top passivation layer 114, and a number of conductive pads 116. The pads 116, which include the pads 116A-116D, are selected regions of the metal traces that provide points for external electrical connections, and points for electrical connections to overlying devices. (Only the pads 116A-116D, and not the entire metal interconnect structure, are shown for clarity.)

As further shown in FIGS. 1A-1B, the transformer 100 also includes a first non-conductive layer 120 that touches the top surface of the passivation layer 114, and a second non-conductive layer 122 that touches the top surface of the first non-conductive layer 120. In addition, the transformer 100 includes a core 124, a primary coil 126, and a secondary coil 128. The core 124, in turn, is electrically isolated from all other conductive structures.

The primary coil 126, which has a longitudinal axis A, is wrapped around the core 124. The secondary coil 128, which also has a longitudinal axis A, is also wrapped around the core 124. In the present example, the windings are interleaved so that a winding of the primary coil 126 lies between an adjacent pair of windings of the secondary coil 128.

The primary coil 126, which is connected to the pads 116A and 116B, and the secondary coil 128, which is connected to the pads 116C and 116D, are isolated from each other and from the core 124 by the non-conductive layers 120 and 122.

In operation, an alternating current input to the primary coil 126 generates an alternating magnetic flux in the core 124 which, in turn, generates an alternating magnetic field through the secondary coil 128. The alternating magnetic field through the secondary coil 128 induces an alternating voltage in the secondary coil 128 which, in turn, generates an alternating current in the secondary coil 128 if a load is attached to the secondary coil 128.

The primary coil 126 and the secondary coil 128 can be implemented with, for example, aluminum, aluminum-copper, or copper, including other conductive materials which function as adhesion or barrier layers. In addition, the first non-conductive layer 120 and the second non-conductive layer 122 can be implemented with, for example, silicon dioxide, silicon nitride, or nitride.

The core 124, which is formed as a thin film having a length L, a width, W and a thickness T, can be implemented with any soft magnetic material, but is preferably implemented with amorphous, nanocrystalline, or granular alloys to achieve high permeability and high electrical resistivity. A high resistivity reduces the effects of eddy currents. For example, cobalt tantalum zirconium (CoTaZr) is an amorphous material with a high permeability and a high electrical resistivity.

Laminated structures (e.g., alternating layers of a soft magnetic material and an insulator), which significantly reduce the effects of eddy currents, can alternately be used. In addition, some non-amorphous materials have a relatively high electrical resistivity. For example, an alloy of nickel and iron like permalloy has a relatively high electrical resistivity.

A core that is formed from a thin-film soft magnetic material has one or more magnetic domain patterns that depend on the geometry of the core. Magnetic domains are generated to reduce the magnetostatic energy, but the generation of magnetic domains comes with the cost of domain wall energy.

When a thin-film core is small enough, the core appears to have a single domain pattern, i.e., where the magnetic dipoles within the core are all generally oriented in the same direction. For a larger thin-film core, the magnetic domains within the core appear to alternate, i.e., where the magnetic dipoles within each domain are generally oriented in the same direction, and the magnetic dipoles within each adjacent pair of domains are generally oriented in opposite directions.

The direction of magnetization is defined by the longitudinal axes of the magnetic dipole moments. The direction of magnetization, in turn, has the highest permeability, which is a measure of the response of a soft magnetic material to an external magnetic field. As a result, the direction of magnetization, which has the highest permeability, is known as the easy axis, while the axis perpendicular to the easy axis is known as the hard axis.

In accordance with the present invention, the core 124 has one or more magnetic domain patterns with magnetic dipole moments that lie substantially parallel to the width W and perpendicular to the length L of the core 124. As a result, the core 124 has a direction of magnetization and an easy axis EA that are substantially perpendicular to the length L of the core 124, and a hard axis HA that is substantially parallel to the length L of the core 124.

Figure 2:
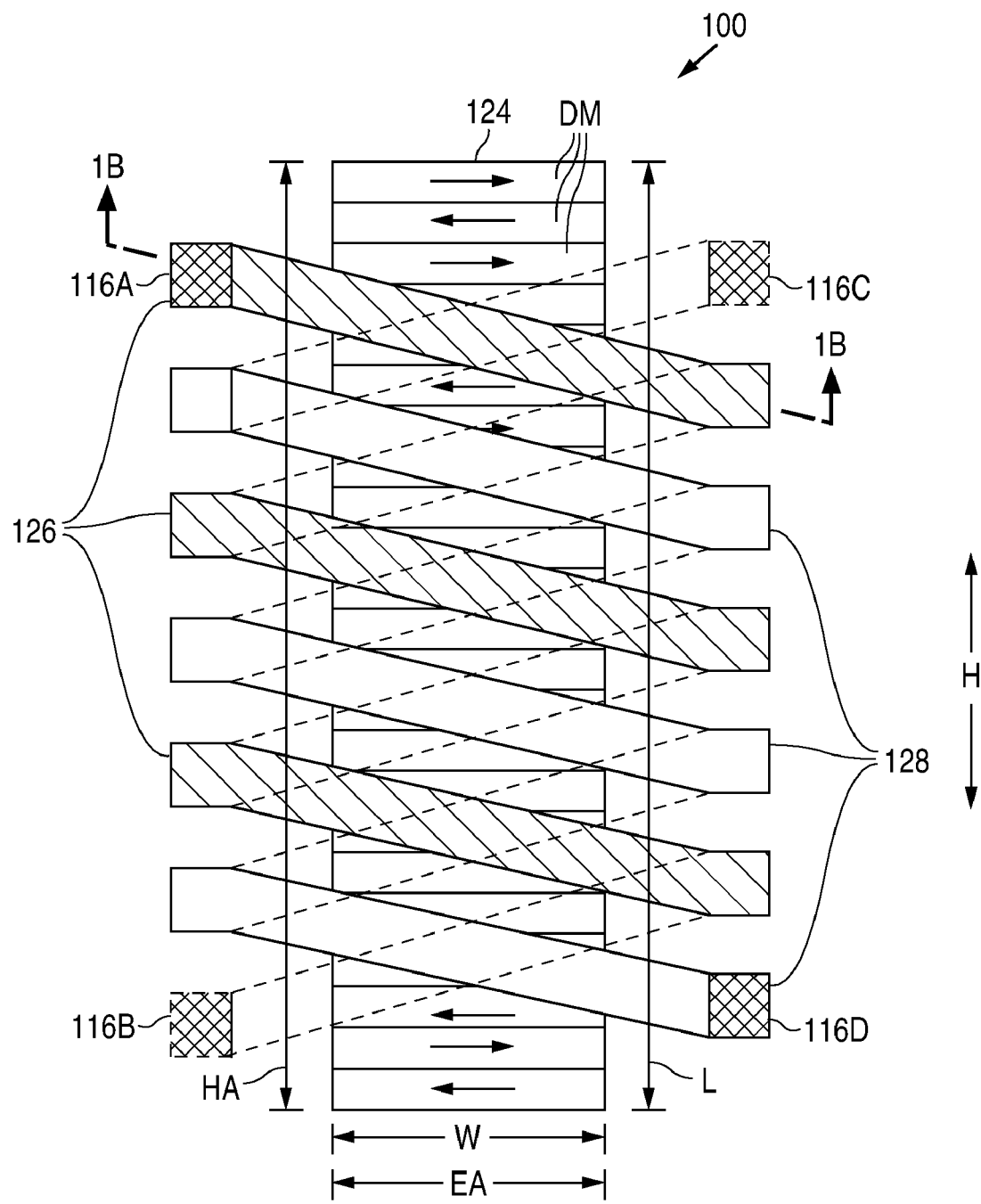
FIG. 2 is a plan view of the transformer 100 illustrating an example of the transformer 100 with a series of magnetic domains in accordance with the present invention.

FIG. 2 shows a plan view of the transformer 100 that illustrates an example of the transformer 100 with a series of magnetic domains in accordance with the present invention. As shown in FIG. 2, the core 124 has a series of magnetic domains DM where the magnetic dipoles within each domain DM are illustrated by a magnetic dipole moment (a vector), and the magnetic dipole moments alternate between pointing to the right and pointing to the left. (Magnetic domains include closure domains at the boundaries which are not illustrated for simplicity.) Alternately, if a single magnetic domain were present, all of the magnetic dipole moments would point either to the right or to the left.

Thus, whether in a single domain pattern or multiple domain patterns, the magnetic dipole moments, the direction of magnetization, and the easy axis EA are horizontal and substantially perpendicular to the length L of the core 124, while the hard axis HA is substantially parallel with the length L of the core 124.

Further, when an alternating current is input to the primary coil 126, the alternating current produces an alternating magnetic field H that, according to the right-hand rule, is substantially parallel to the longitudinal axis A of the primary coil 126, with the direction of the magnetic field H determined by the direction of current flow through the primary coil 126.

The longitudinal axis A of the primary coil 126 and the length L of the core are substantially parallel. As a result, the longitudinal axis A of the primary coil 126 and the magnetic field H produced by an alternating current input to the primary coil 126 are substantially perpendicular to the easy axis EA of the portion of the core 124 that lies within the primary coil 126, and substantially parallel to the hard axis HA of the portion of the core 124 that lies within the primary coil 126.

FIGS. 3A-3C show views of a portion of a soft magnetic material 300 that illustrate the operation of the transformer 100 in accordance with the present invention. As shown in FIGS. 3A-3C, the portion of the soft magnetic material 300 has four domains DM1-DM4 where the magnetic dipoles within each odd domain DM1 and DM3 are illustrated by a magnetic dipole moment that points to the right, and the magnetic dipoles within each even domain DM2 and DM4 are illustrated by a magnetic dipole moment that points to the left. Thus, in the present example, the direction of magnetization and the easy axis EA are horizontal.

In addition, without an external influence, the widths of the domains DM are fixed by the lowest magnetostatic energy level. FIG. 3A shows the widths of the domains DM without an external influence. However, in the presence of a magnetic field that is parallel to the easy axis EA, the widths of the domains change.

As shown in the FIG. 3B example, when the portion of the soft magnetic material 300 comes under the influence of a magnetic field H1 that is parallel to the easy axis EA and points to the right, the widths of the odd domains DM1 and DM3 increase, while the widths of the even domains DM2 and DM4 decrease, thereby increasing the magnitudes of the magnetic dipole moments that point to the right and, in turn, the strength of the magnetic field H1.

Similarly, as shown in the FIG. 3C example, when the portion of the soft magnetic material 300 comes under the influence of an external magnetic field H2 that is parallel to the easy axis EA and points to the left, the widths of the odd domains DM1 and DM3 decrease, while the widths of the even domains DM2 and DM4 increase, thereby increasing the magnitudes of the of magnetic dipole moments that point to the left and, in turn, the strength of the magnetic field H2.

(Although the widths of the domains DM typically change in response to the direction of a magnetic field that is parallel to the easy axis, in some cases it may take less energy for the opposing dipole moments to flip so that the magnetic dipole moments in all of the domains point in the same direction as the magnetic field that is parallel to the easy axis.)

Thus, as illustrated in FIGS. 3A-3C, the widths of the domains DM change in response to the change in the direction of a magnetic field that lies parallel to the easy axis EA. When the direction of the magnetic field parallel to the easy axis EA changes at a rate in the kilohertz range (the domain wall contribution to the permeability is significant in the KHz range and below), the widths of the domains follow the change. As a result, the soft magnetic material 300 increases the strength of the H1 field when the H1 field is present, and increases the strength of the H2 field when the H2 field is present.

The widths of the domains DM, however, do not change instantaneously with a change in the direction of the magnetic field, but have a maximum rate of change. The upper frequency limit is mainly determined by the material properties, with some materials having an upper frequency limit less than 1 MHz while other materials have an upper frequency limit up to 10 MHZ.

Thus, when the direction of the magnetic field parallel to the easy axis EA changes at a rate that exceeds these upper frequency limits, the widths of the domains can no longer keep up with the changing magnetic field. As a result, the wider domains can end up opposing the direction of the magnetic field.

For example, when the direction of the magnetic field parallel to the easy axis changes at a rate of 1 GHz, the direction of the dipole moments in the wider widths of the domains will sometimes coincide with the direction of the magnetic field, and thereby strengthen the magnetic field, and will sometimes oppose the direction of the magnetic field, and thereby weaken the magnetic field.

In the present invention, an alternating current input to the primary coil 126 does not produce an alternating magnetic field that is parallel to the easy axis, but instead produces an alternating magnetic field that lies perpendicular to the easy axis and parallel to the hard axis. An alternating magnetic field that is perpendicular to the easy axis EA and parallel to the hard axis HA has substantially no effect on the widths of the domains DM.

Thus, by forming the core 124 to have an easy axis EA that is substantially perpendicular to the direction of the magnetic field, and a hard axis HA that is substantially parallel to the direction of the magnetic field, the magnetic field can be changed at much higher rates without any detrimental effect from the changing widths of the magnetic domains.

When a magnetic field is applied perpendicular to the easy axis EA and parallel to the hard axis HA, the magnetic field alters the angle of the spin of the electrons within the magnetic material. The alteration of the angle of spin of the electrons within the magnetic material increases the permeability of the magnetic material along the hard axis HA. Further, larger alterations of the spin angle produce higher permeabilities.

FIGS. 4A-4C show views of a portion of a soft magnetic material 400 that further illustrate the operation of transformer 100 in accordance with the present invention. As shown in FIGS. 4A-4C, the portion of the soft magnetic material 400 has two domains DM1-DM2 where the spin angle of the electrons within the first domain DM1 is illustrated by a magnetic dipole moment that points to the right, and the spin angle of the electrons within the second domain DM2 is illustrated by a magnetic dipole moment that points to the left. FIG. 4A shows the spin angles without an external influence.

As shown in the FIG. 4B example, when the portion of the soft magnetic material 400 comes under the influence of a magnetic field H1 that is perpendicular to the easy axis and parallel to the hard axis HA and points up, the spin angle of the electrons within the magnetic material moves in the direction of the magnetic field as illustrated by the changes in the angles of the magnetic dipole moments within the first and second domains DM1 and DM2. The change in the angles, in turn, increases the permeability of the magnetic material along the hard axis HA, thereby increasing the strength of the magnetic field H1.

Similarly, as shown in the FIG. 4C example, when the portion of the soft magnetic material 400 comes under the influence of a magnetic field H2 that is perpendicular to the easy axis and parallel to the hard axis HA and points down, the spin angle of the electrons within the magnetic material moves in the direction of the magnetic field as illustrated by the changes in the angles of the magnetic dipole moments within the first and second domains DM1 and DM2. The change in the angles, in turn, increases the permeability of the magnetic material along the hard axis HA, thereby increasing the strength of the magnetic field H2.

The permeability along the hard axis that results from the change in the spin angle of the electrons within the magnetic material can be relatively less than the permeability of the magnetic material along the easy axis. Although the permeability along the hard axis can be relatively less than the permeability along the easy axis, the permeability along the hard axis is substantially greater than the permeability of air (such as when a transformer is formed without a core). For example, a cobalt tantalum zirconium (CoTaZr) core has a permeability along the hard axis that is approximately 700× greater than the permeability of air.

Further, although the rate of change of the magnetic field along the easy axis is limited by the upper frequency limits of the materials (e.g., up to 10 MHz), the rate of change of the magnetic field along the hard axis is limited by the intrinsic ferromagnetic resonance frequency of the material, which for many materials is typically several gigahertz.

Thus, by insuring that the magnetic field is substantially perpendicular to the easy axis and parallel to the hard axis, the present invention provides a high frequency (greater than 1 MHz) transformer with a permeability that is substantially greater than conventional air-core semiconductor transformers.

The greatest permeability from a given magnetic field is achieved when the angle between the magnetic field and the easy axis is 90°. Although the permeability degrades as the angle between the magnetic field and the easy axis is reduced, substantially improved permeability (compared to air) can also be achieved for angles less than 90°. For example, improved permeability is achievable when the angle between the magnetic field and the easy axis lies within the range of 90° to 45°. Thus, the phrase "substantially parallel" to the hard axis includes the range of angles that provide permeability which is, for example, 100× or more better than air at gigahertz frequencies.

Figure 5A:
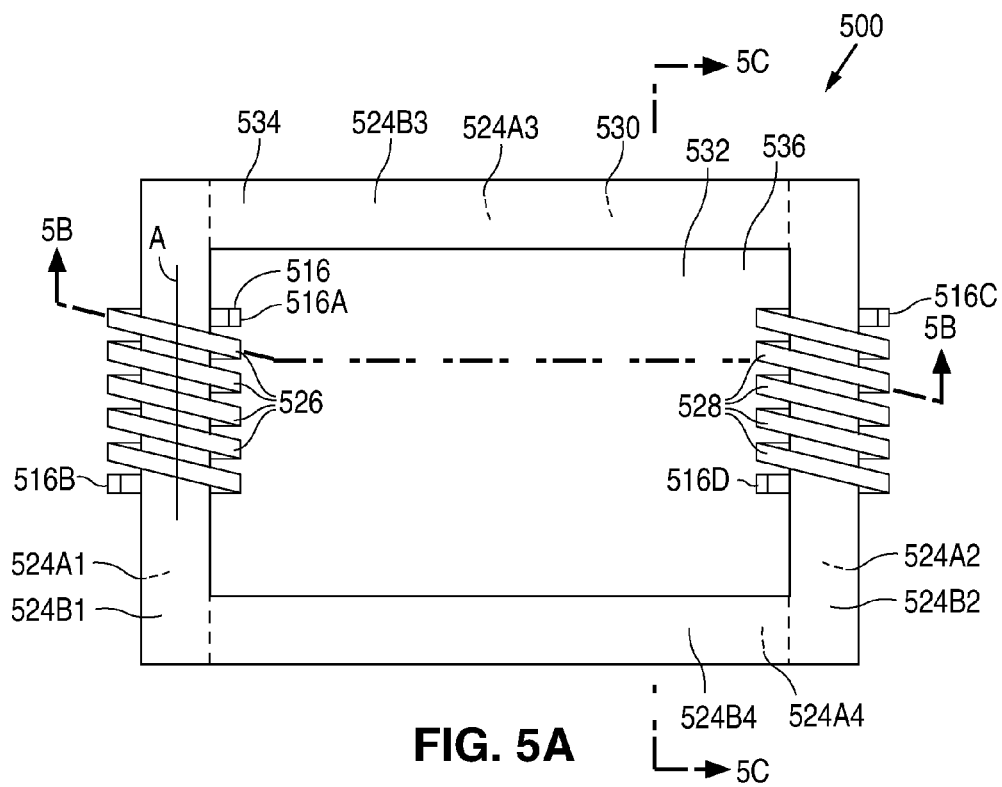
FIGS. 5A-5C are a series of views illustrating a second example of a high-frequency semiconductor transformer 500 in accordance with the present invention.
Figure 5B:
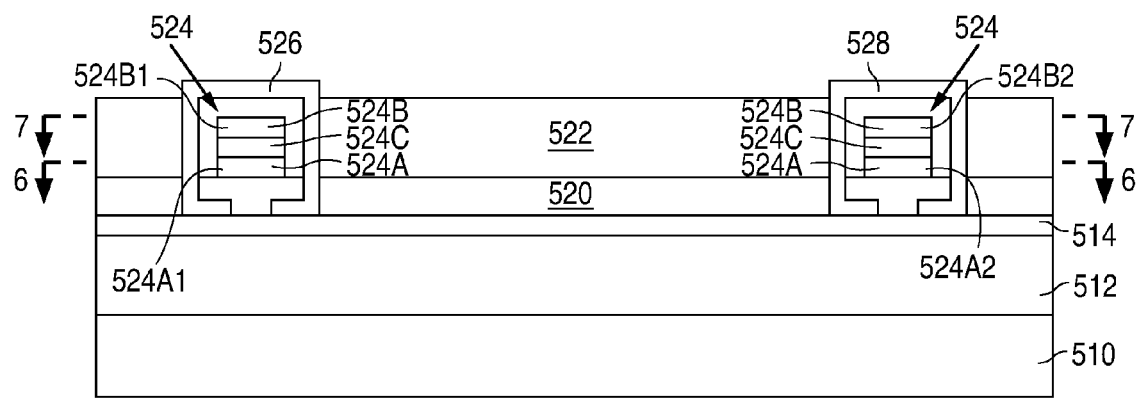
Figure 5C:
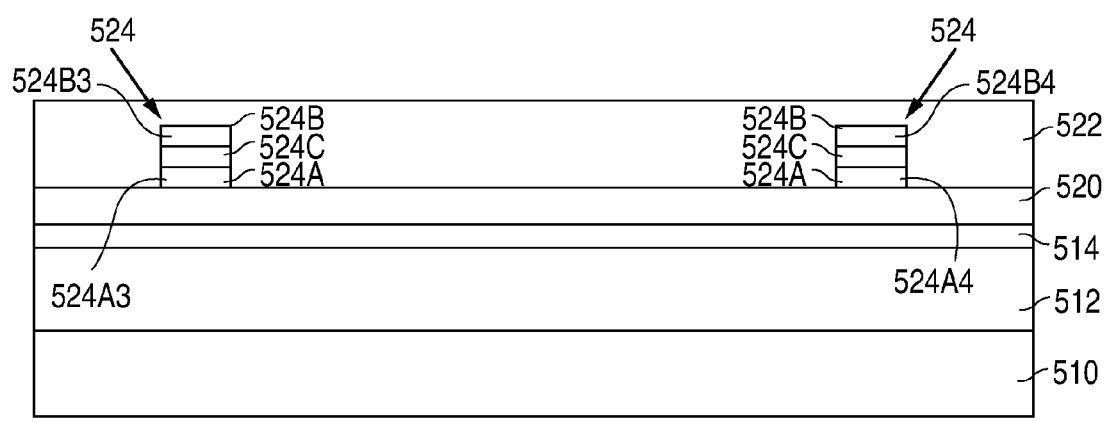

FIGS. 5A-5C show a series of views that illustrate a second example of a high-frequency semiconductor transformer 500 in accordance with the present invention. FIG. 5A shows a plan view, FIG. 5B shows a cross-sectional view taken along line 5B-5B of FIG. 5A, and FIG. 5C shows a cross-sectional view taken along line 5C-5C of FIG. 5A.

As shown in FIGS. 5A-5C, the transformer 500 includes a semiconductor substrate 510, and a metal interconnect structure 512 that touches the top surface of the substrate 510. The semiconductor substrate 510 includes a large number of electrical devices, such as transistors, resistors, capacitors, and diodes.

The metal interconnect structure 512, which electrically connects the electrical devices together to form a circuit, includes a number of levels of metal traces, a large number of contacts that connect the bottom metal trace to electrically conductive regions on the semiconductor substrate 510, and a large number of inter-metal vias that connect the metal traces in adjacent layers together.

In addition, the metal interconnect structure 512 includes a top passivation layer 514, and a number of conductive pads 516. The pads 516, which include the pads 516A-516D, are selected regions of the metal traces that provide points for external electrical connections, and points for electrical connections to overlying devices. (Only the pads 516A-516D, and not the entire metal interconnect structure, are shown for clarity.)

As further shown in FIGS. 5A-5C, the transformer 500 also includes a first non-conductive layer 520 that touches the top surface of the passivation layer 514, and a second non-conductive layer 522 that touches the top surface of the first non-conductive layer 520. In addition, the transformer 500 includes a core stack 524, a primary coil 526, and a secondary coil 528.

The core stack 524, which is formed as a series of thin films, includes a first core layer 524A, a second core layer 524B, and an insulator layer 524C that lies between and separates the first core layer 524A from the second core layer 524B. The first core layer 524A and the second core layer 524B are electrically isolated from all other conductive structures. In addition, the first core layer 524A has two spaced apart core sections 524A1 and 524A2, and two spaced apart core sections 524A3 and 524A4 which are connected to the core sections 524A1 and 524A2 to form a single continuous core structure 530 that lies in a single plane.

The core structure 530 has a center opening 532 that extends through the core structure 530, and is illustrated with a rectangular shape (although other shapes with a center opening can alternately be used). Although the sides of the core structure 530 are illustrated as having equal widths, the widths can be unequal and considered as a variable to control the transformer ratio between coils.

Similarly, the second core layer 524B has two spaced apart core sections 524B1 and 524B2, and two spaced apart core sections 524B3 and 524B4 which are connected to the core sections 524B1 and 524B2 to form a single continuous core structure 534 that lies in a single plane. The core structure 534 has a center opening 536 that extends through the core structure 534, and is illustrated with a rectangular shape (although other shapes with a center opening can alternately be used). Although the sides of the core structure 534 are illustrated as having equal widths, the widths can be unequal and considered as a variable to control the transformer ratio between coils.

The primary coil 526, which has a longitudinal axis A, is only wrapped around the core sections 524A1 and 524B1. The secondary coil 528, in turn, is only wrapped around the core sections 524A2 and 524B2. The primary coil 526, which is connected to the pads 516A and 516B, and the secondary coil 518, which is connected to the pads 516C and 516D, are isolated from each other and from the core stack 524 by the non-conductive layers 520 and 522.

The primary coil 526 and the secondary coil 528 can be implemented with, for example, aluminum, aluminum-copper, or copper, including other conductive materials which function as adhesion or barrier layers. In addition, the first non-conductive layer 520, the second non-conductive layer 522, and the insulator layer 524C can be implemented with, for example, silicon dioxide, silicon nitride, or nitride.

The first core layer 524A and the second core layer 524B can be implemented with any soft magnetic material, but are preferably implemented with amorphous, nanocrystalline, or granular alloys to achieve high permeability and high electrical resistivity. A high resistivity reduces the effects of eddy currents. For example, cobalt tantalum zirconium (CoTaZr) is an amorphous material with a high permeability and a high electrical resistivity.

As noted above, laminated structures (e.g., alternating layers of a soft magnetic material and an insulator), which significantly reduce the effects of eddy currents, can alternately be used. In addition, as further noted above, some non-amorphous materials have a relatively high electrical resistivity. For example, an alloy of nickel and iron like permalloy has a relatively high electrical resistivity.

In accordance with the present invention, the first core layer 524A has one or more magnetic domain patterns with magnetic dipole moments that lie substantially parallel to a length L of the core section 524A1. As a result, the first core layer 524A has magnetic dipole moments, a direction of magnetization, and an easy axis that are substantially parallel to a length of the core section 524A1, and a hard axis that is substantially perpendicular to the length of the core section 524A1.

Further, when an alternating current is input to the primary coil 526, the alternating current produces an alternating magnetic field that, according to the right-hand rule, is substantially parallel to the longitudinal axis A of the primary coil 526, with the direction of the magnetic field determined by the direction of current flow through the primary coil 526.

The longitudinal axis A of the primary coil 526 and the length L of the core section 524A1 are substantially parallel. As a result, the longitudinal axis A of the primary coil 526 and the magnetic field produced by an alternating current input to the primary coil 526 are substantially parallel to the easy axis of the core section 524A1 that lies within the primary coil 526 and substantially perpendicular to the hard axis of core section 524A1 that lies within the primary coil 526.

Figure 6:
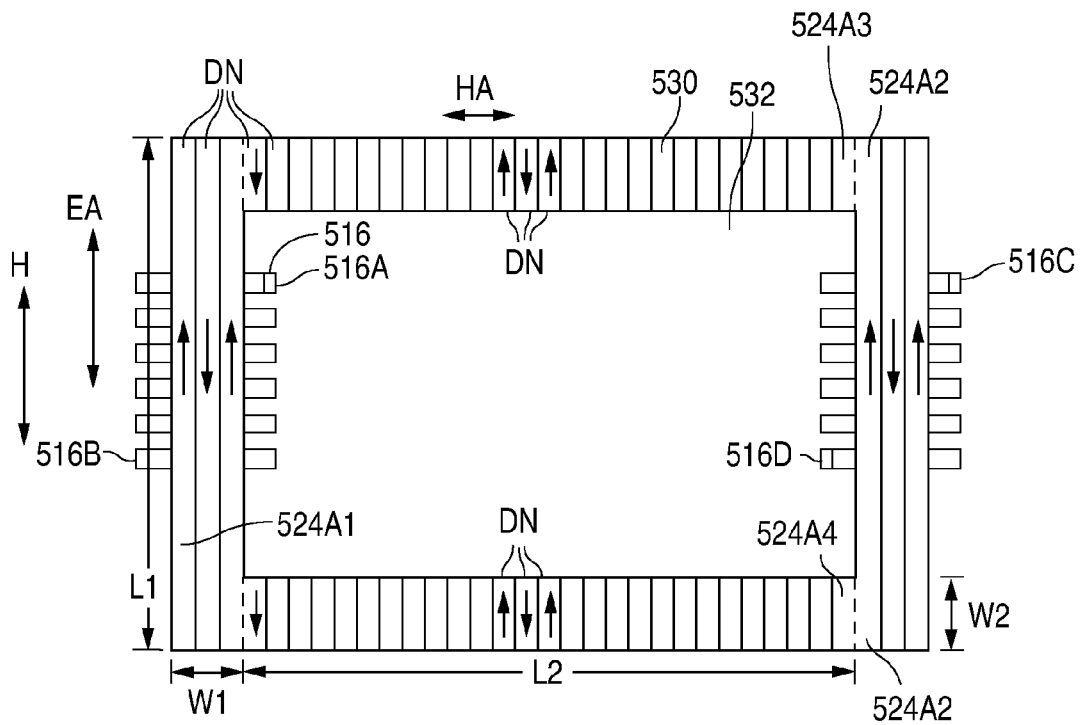
FIG. 6 is a plan view of the transformer 500 taken along line 6-6 of FIG. 5B illustrating the first core layer 524A with a series of magnetic domains in accordance with the present invention.

FIG. 6 shows a plan view of the transformer 500 taken along line 6-6 of FIG. 5B that illustrates the first core layer 524A with a series of magnetic domains in accordance with the present invention. As shown in FIG. 6, the first core layer 524A has a series of magnetic domains DN where the magnetic dipoles within each domain DN are illustrated by a magnetic dipole moment (a vector), and the magnetic dipole moments alternate between pointing up and pointing down.

As further shown in FIG. 6, the core section 524A1 and the core section 524A2 each has a length L1 and a width W1, and the core section 524A3 and the core section 524A4 each has a length L2 and a width W2. Thus, the first core layer 524A has an easy axis EA that lies parallel to the lengths L1 of the core sections 524A1 and 524A2, and perpendicular to the lengths L2 of the core sections 524A3 and 524A4. Further, the first core layer 524A has a hard axis HA that lies perpendicular to the lengths L1 of the core sections 524A1 and 524A2, and parallel to the lengths L2 of the core sections 524A3 and 524A4.

In addition, the first core layer 524A has an easy axis EA that lies parallel to the longitudinal axis A of the primary coil 526 and parallel to the direction of the magnetic field H generated by the primary coil 526, and a hard axis HA that lies perpendicular to the longitudinal axis A of the primary coil 526 and perpendicular to the direction of the magnetic field H generated by the primary coil 526.

In further accordance with the present invention, the second core layer 524B has one or more magnetic domain patterns with magnetic dipole moments that lie substantially perpendicular to a length of the core section 524B1. As a result, the second core layer 524B has magnetic dipole moments, a direction of magnetization, and an easy axis that are substantially perpendicular to the length of the core section 524B1, and a hard axis that is substantially parallel to the length of the core section 524B1.

Further, the longitudinal axis A of the primary coil 526 and the length L of the core section 524B1 are substantially parallel. As a result, the longitudinal axis A of the primary coil 526 and the magnetic field produced by an alternating current input to the primary coil 526 are substantially perpendicular to the easy axis of the core section 524B1 that lies within the primary coil 526 and substantially parallel to the hard axis of the core section 524B1 that lies within the primary coil 526.

Figure 7:
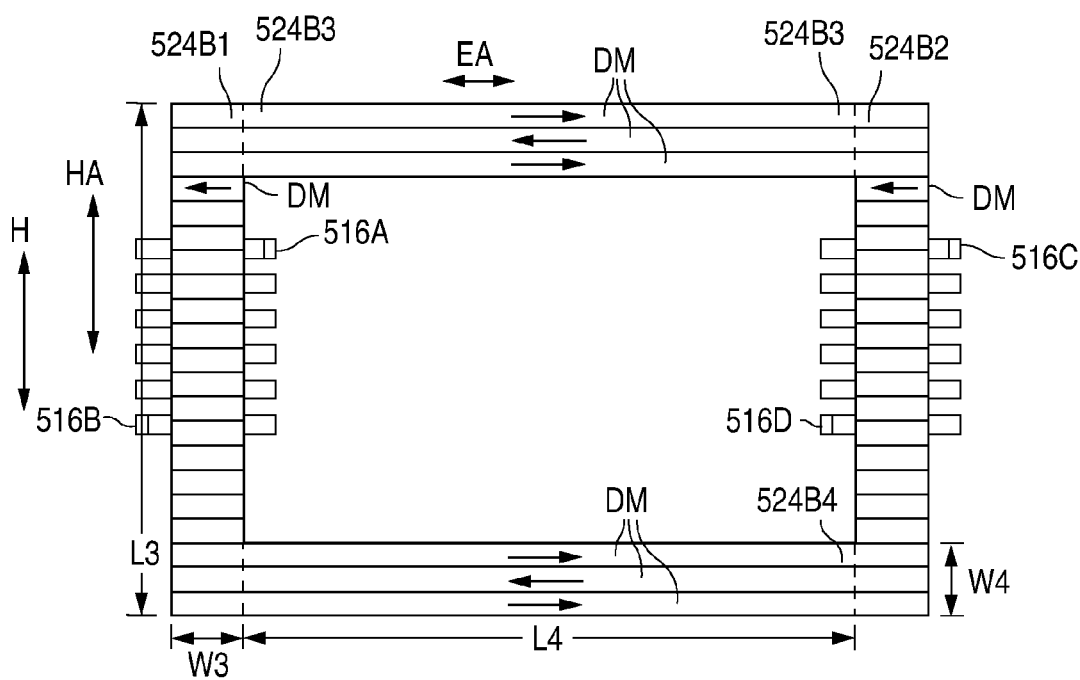
FIG. 7 is a plan view of the transformer 500 taken along line 7-7 of FIG. 5B illustrating the second core layer 524B with a series of magnetic domains in accordance with the present invention.

FIG. 7 shows a plan view of the transformer 500 taken along line 7-7 of FIG. 5B that illustrates the second core layer 524B with a series of magnetic domains in accordance with the present invention. As shown in FIG. 7, the second core 524B has a series of magnetic domains DM where the magnetic dipoles within each domain DM are illustrated by a magnetic dipole moment (a vector), and the magnetic dipole moments alternate between pointing to the right and pointing to the left.

As further shown in FIG. 7, the core section 524B1 and the core section 524B2 each has a length L3 and a width W3, and the core section 524B3 and the core section 524B4 each has a length L4 and a width W4. Thus, the second core layer 524B has an easy axis EA that lies perpendicular to the lengths L3 of the core sections 524B1 and 524B2, and parallel to the lengths L4 of the core sections 524B3 and 524B4. Further, the second core layer 524B has a hard axis HA that lies parallel to the lengths L3 of the core sections 524B1 and 524B2, and perpendicular to the lengths L4 of the core sections 524B3 and 524B4.

In addition, the second core layer 524B has an easy axis EA that lies perpendicular to the longitudinal axis A of the primary coil 526 and perpendicular to the direction of the magnetic field H generated by the primary coil 526, and a hard axis HA that lies parallel to the longitudinal axis A of the primary coil 526 and parallel to the direction of the magnetic field H generated by the primary coil 526.

In operation, an alternating current input to the primary coil 526 generates an alternating magnetic flux in the core stack 524 which, in turn, generates an alternating magnetic field through the secondary coil 528. The alternating magnetic field through the secondary coil induces an alternating voltage in the secondary coil 528 which, in turn, generates an alternating current in the secondary coil 528 if a load is attached to the secondary coil 528.

The alternating magnetic flux follows magnetic field lines that extend along the length of the core section 524B1, along the length of the core section 524A3, along the length of the core section 524B2, and along the length of the core section 524A4. Thus, the core sections 524B1 and 524B2 and the core sections 524A3 and 524A4 each provide a high permeability path for the alternating magnetic flux.

Thus, by insuring that the alternating magnetic flux can extend along a hard axis around core stack 524, the present invention provides a high frequency (greater than 1 MHz) transformer with a permeability that is substantially greater than conventional air-core semiconductor transformers.

Figure 8A:
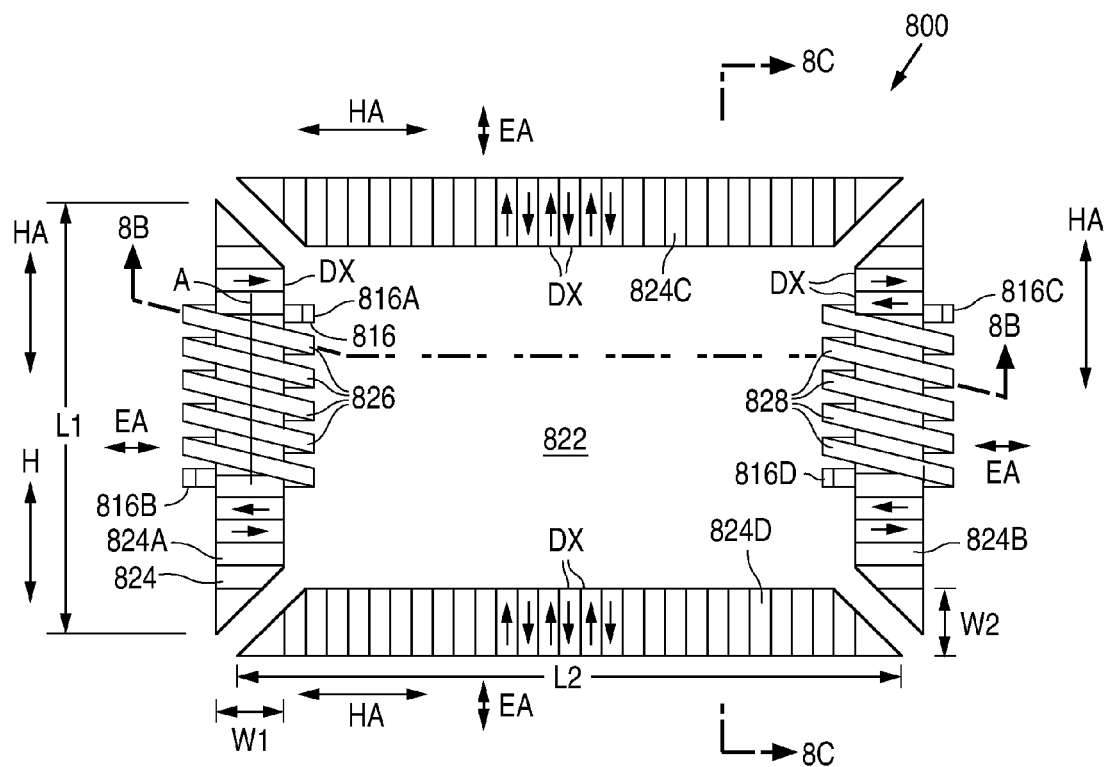
FIGS. 8A-8C are a series of views illustrating a third example of a high-frequency semiconductor transformer 800 in accordance with the present invention.
Figure 8B:
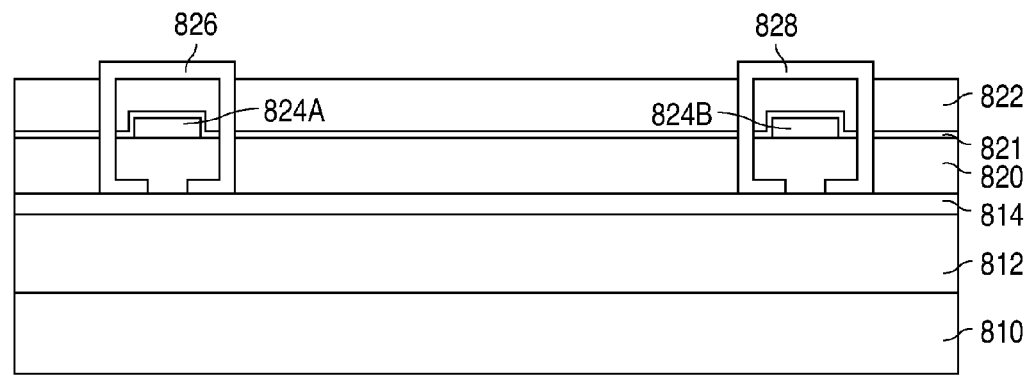
Figure 8C:
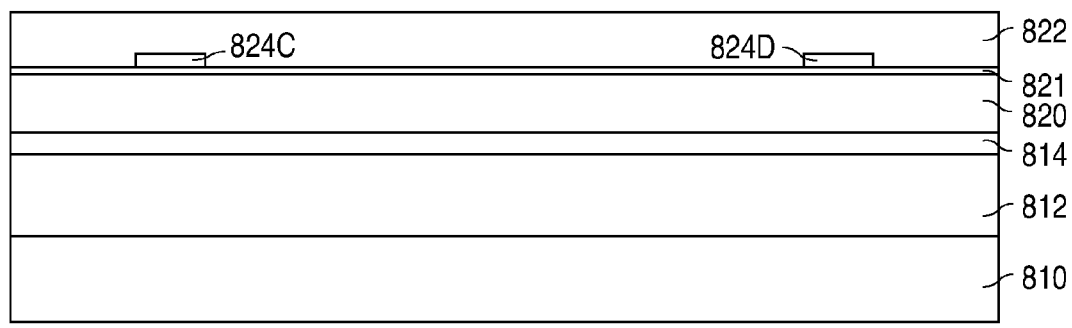

FIGS. 8A-8C show a series of views that illustrate a third example of a high-frequency semiconductor transformer 800 in accordance with the present invention. FIG. 8A shows a plan view, FIG. 8B shows a cross-sectional view taken along line 8B-8B of FIG. 8A, and FIG. 8C shows a plan view taken along line 8C-8C of FIG. 8B.

As shown in FIGS. 8A-8C, the transformer 800 includes a semiconductor substrate 810, and a metal interconnect structure 812 that touches the top surface of the substrate 810. The semiconductor substrate 810 includes a large number of electrical devices, such as transistors, resistors, capacitors, and diodes.

The metal interconnect structure 812, which electrically connects the electrical devices together to form a circuit, includes a number of levels of metal traces, a large number of contacts that connect the bottom metal trace to electrically conductive regions on the semiconductor substrate 810, and a large number of inter-metal vias that connect the metal traces in adjacent layers together.

In addition, the metal interconnect structure 812 includes a top passivation layer 814, and a number of conductive pads 816. The pads 816, which include the pads 816A-816D, are selected regions of the metal traces that provide points for external electrical connections, and points for electrical connections to overlying devices. (Only the pads 816A-816D, and not the entire metal interconnect structure, are shown for clarity.)

As further shown in FIGS. 8A-8C, the transformer 800 also includes a first non-conductive layer 820 that touches the top surface of the passivation layer 814, a thin non-conductive layer 821 that touches the top surface of the first non-conductive layer 820, and a second non-conductive layer 822 that touches the top surface of the thin non-conductive layer 821. In addition, transformer 800 also includes a number of spaced apart core sections 824, a primary coil 826, and a secondary coil 828.

The present example includes four spaced apart core sections 824: a first core section 824A, a second core section 824B, a third core section 824C, and a fourth core section 824D. The first and second core sections 824A and 824B are electrically isolated from all other conductive structures. The four core sections 824 are arranged in a rectangular shape with a region of the thin non-conductive layer 821 separating the first core section 824A from the second core section 824B, a region of the thin non-conductive layer 821 separating the second core section 824B from the third core section 824C, a region of the thin non-conductive layer 821 separating the third core section 824C from the fourth core section 824D, and a region of the thin non-conductive layer 821 separating the fourth core section 824D from the first core section 824A.

Further, the core section 824A and the core section 824B each has a length L1 and a width W1, and the core section 824C and the core section 824D each has a length L2 and a width W2. Alternately, the core sections 824A and 824B can have different widths, and the core sections 824C and 824D can have different widths. The widths can be considered as a variable to control the transformer ratio between coils.

In the present example, a portion of the core sections 824 lie in a single plane, with the bottom surfaces of the core sections 824C and 824D lying above the bottom surfaces of the core sections 824A and 824B by the thickness of the thin non-conductive layer 821. The core sections 824 can be arranged in other than rectangular shapes, and additional core sections 824 can be utilized to form additional shapes.

The primary coil 826, which has a longitudinal axis A, is only wrapped around the core section 824A. The secondary coil 828, in turn, is only wrapped around the core section 824C. The primary coil 826, which is connected to the pads 816A and 816B, and the secondary coil 828, which is connected to the pads 816C and 816D, are isolated from each other and from the core sections 824 by the first non-conductive layer 820, the thin non-conductive layer 821, and the second non-conductive layer 822.

The primary coil 826 and the secondary coil 828 can be implemented with, for example, aluminum, aluminum-copper, or copper, including other conductive materials which function as adhesion or barrier layers. In addition, the first non-conductive layer 820, the thin non-conductive layer 821, and the second non-conductive layer 822 can be implemented with, for example, silicon dioxide, silicon nitride, or nitride.

The core sections 824, which are formed as thin films, can be implemented with any soft magnetic material, but are preferably implemented with amorphous, nanocrystalline, or granular alloys to achieve high permeability and high electrical resistivity. A high resistivity reduces the effects of eddy currents. For example, cobalt tantalum zirconium (CoTaZr) is an amorphous material with a high permeability and a high electrical resistivity.

As noted above, laminated structures (e.g., alternating layers of a soft magnetic material and an insulator), which significantly reduce the effects of eddy currents, can alternately be used. In addition, as further noted above, some non-amorphous materials have a relatively high electrical resistivity. For example, an alloy of nickel and iron like permalloy has a relatively high electrical resistivity.

In accordance with the present invention, the core sections 824 each has one or more magnetic domain patterns where the magnetic dipole moments lie substantially perpendicular to a length L of the core section 824. In the FIG. 8A example, the core sections 824 are each illustrated with magnetic domains DX where the magnetic dipoles within each domain DX are illustrated by a magnetic dipole moment (a vector), and where the magnetic dipole moments alternate directions and lie substantially perpendicular to a length L of the core section 824.

Thus, the core sections 824A and 824B each has magnetic dipole moments, a direction of magnetization, and an easy axis EA that are substantially perpendicular to the lengths L1 of the core sections 824A and 824B, and a hard axis HA that is substantially parallel to the lengths L1 of the core sections 824A and 824B. In addition, the core sections 824C and 824D each has a direction of magnetization and an easy axis EA that are substantially perpendicular to the lengths L2 of the core sections 824C and 824D, and a hard axis HA that is substantially parallel to the lengths L2 of the core sections 824C and 824D.

Further, when an alternating current is input to the primary coil 826, the alternating current produces an alternating magnetic field H that, according to the right-hand rule, is substantially parallel to the longitudinal axis A of the primary coil 826, with the direction of the magnetic field H determined by the direction of current flow through the primary coil 826.

The longitudinal axis A of the primary coil 826 and the length L of the core section 824A are substantially parallel. As a result, the longitudinal axis A of the primary coil 826 and the magnetic field H produced by an alternating current input to the primary coil 826 are substantially perpendicular to the easy axis EA of core sections 824A and 824B and substantially parallel to the hard axis HA of core sections 824A and 824B.

Further, the longitudinal axis A of the primary coil 826 and the magnetic field H produced by an alternating current input to the primary coil 826 are substantially perpendicular to the easy axis EA of core sections 824C and 824D and substantially parallel to the hard axis HA of core sections 824C and 824D.

In operation, an alternating current in the primary coil 826 generates an alternating magnetic flux in the core sections 824 which, in turn, generates an alternating magnetic field through the secondary coil 828. The alternating magnetic field through the secondary coil 828 induces an alternating voltage in the secondary coil 828 which, in turn, generates an alternating current in the secondary coil 828 if a load is attached to the secondary coil 828.

The alternating magnetic flux follows magnetic field lines that extend along the length of the core section 824A, along the length of the core section 824B, along the length of the core section 824C, and along the length of the core section 824D. Thus, each of the core sections 824 provide a high permeability path for the alternating magnetic flux.

Therefore, by insuring that the alternating magnetic flux can extend along a hard axis through each core section 824, the present invention provides a high frequency (greater than 1 MHz) transformer with a permeability that is substantially greater than conventional air-core semiconductor transformers.

Figure 9C:
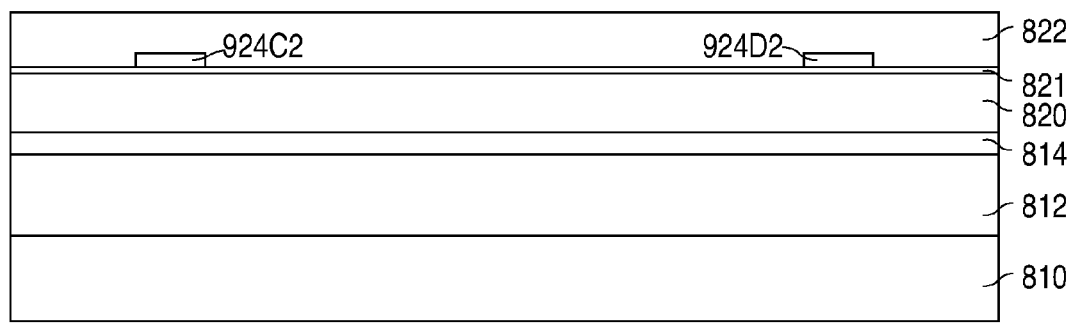
FIGS. 9A-9C are a series of views illustrating a fourth example of a high-frequency semiconductor transformer 900 in accordance with the present invention.
Figure 9A:
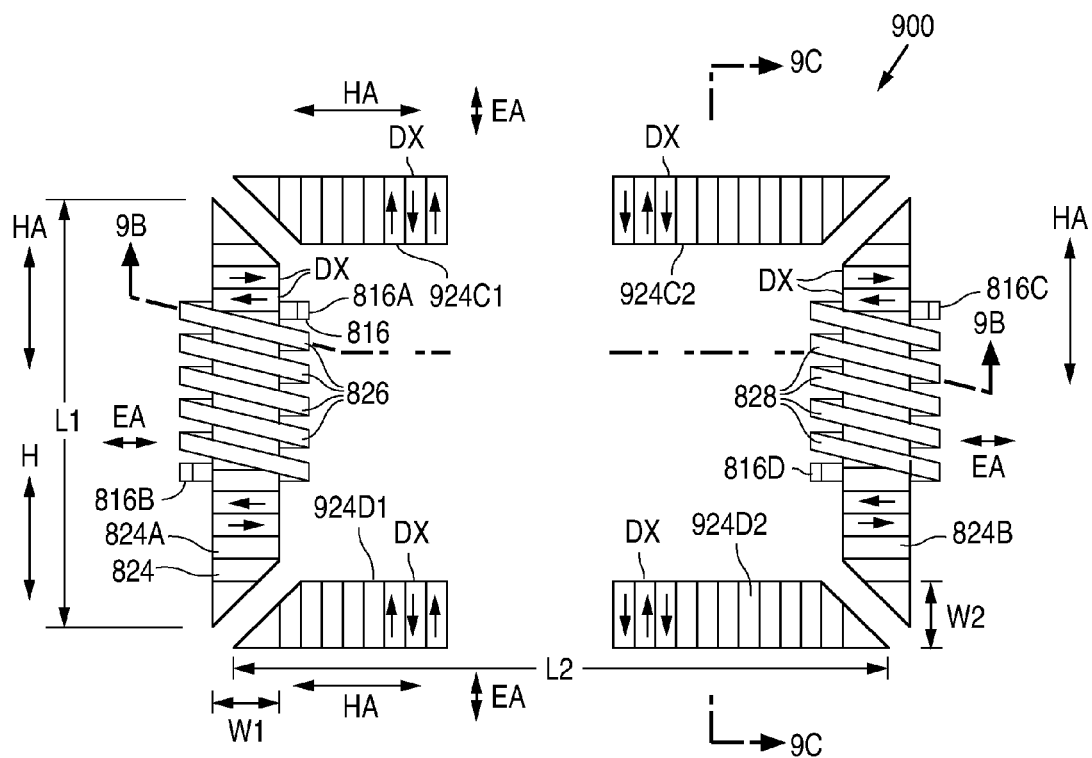
Figure 9B:
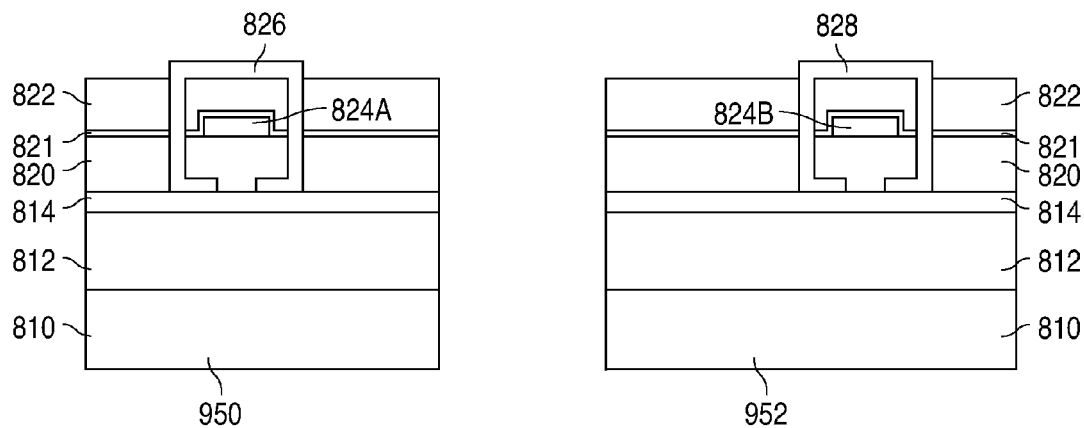

FIGS. 9A-9C show a series of views that illustrate a fourth example of a high-frequency semiconductor transformer 900 in accordance with the present invention. FIG. 9A shows a plan view, FIG. 9B shows a cross-sectional view taken along line 9B-9B of FIG. 9A, and FIG. 9C shows a plan view taken along line 9C-9C of FIG. 9B.

The transformer 900 is similar to transformer 800 and, as a result, utilizes the same reference numerals to designate the structures which are common to both transformers. As shown in FIGS. 9A-9C, transformer 900 differs from transformer 800 in that transformer 900 utilizes two core sections 924C1 and 924C2 in lieu of core section 824C, and utilizes two core sections 924D1 and 924D2 in lieu of core section 84D.

In operation, the core sections 824A, 924C1, and 924D1 can be formed on a first integrated circuit 950 and the core sections 824B, 924C2, and 924D2 can be formed on a second integrated circuit 952 so that the core sections 824A, 924C1, and 924D1 can be physically separated from core sections 824B, 924C2, and 924D2 for remote or wireless power transfer applications.

Figure 10A:
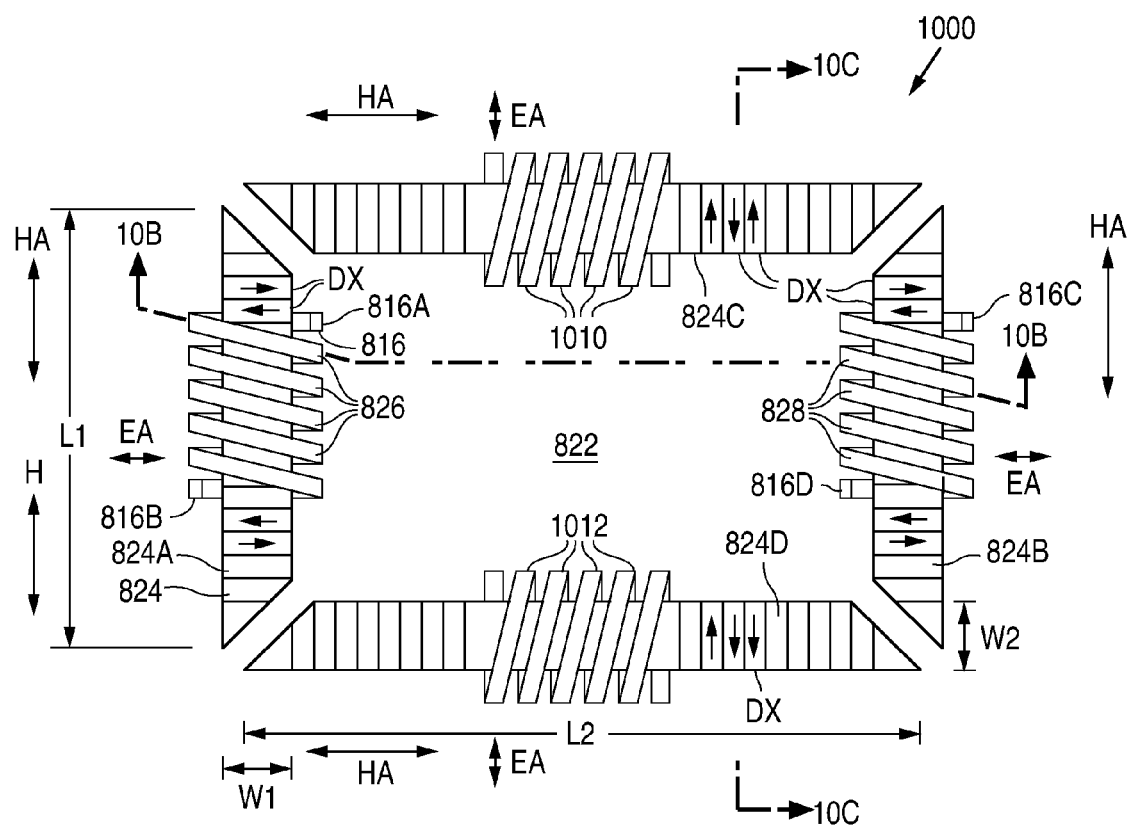
FIGS. 10A-10C are a series of views illustrating a fifth example of a high-frequency semiconductor transformer 1000 in accordance with the present invention.
Figure 10B:
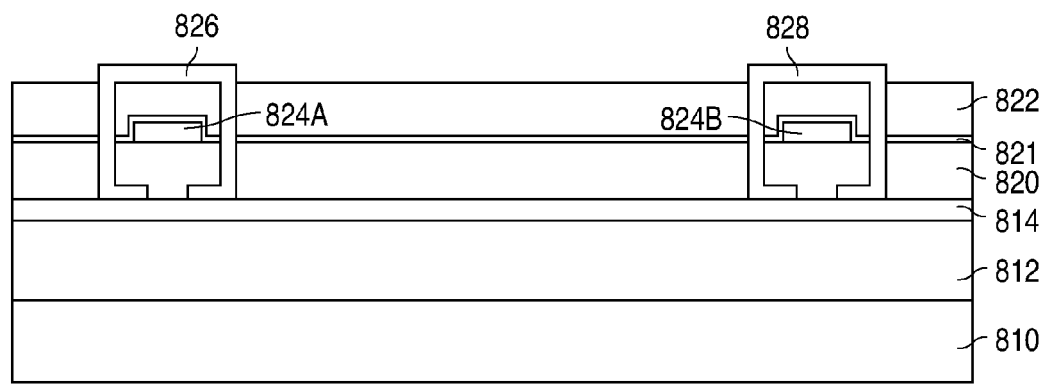
Figure 10C:
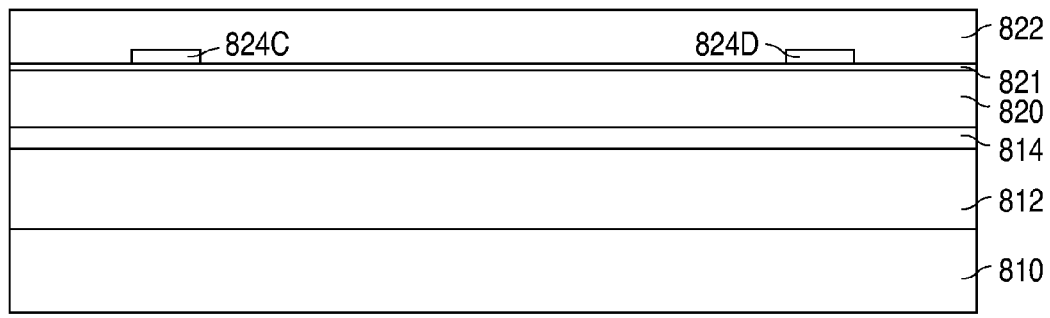

FIGS. 10A-10C show a series of views that illustrate a fifth example of a high-frequency semiconductor transformer 1000 in accordance with the present invention. FIG. 10A shows a plan view, FIG. 10B shows a cross-sectional view taken along line 10B-10B of FIG. 10A, and FIG. 10C shows a plan view taken along line 10C-10C of FIG. 10B.

The transformer 1000 is similar to transformer 800 and, as a result, utilizes the same reference numerals to designate the structures which are common to both transformers. As shown in FIGS. 10A-10C, transformer 1000 differs from transformer 800 in that transformer 1000 includes a third coil 1010 that is wrapped around core section 824C, and a fourth coil 1012 that is wrapped around core section 824D. In a similar manner, transformer 500 can also be formed to have additional coils, with a third coil formed around core sections 524A3 and 524B3, and a fourth coil formed around core sections 524A4 and 524B4.

Figure 11:
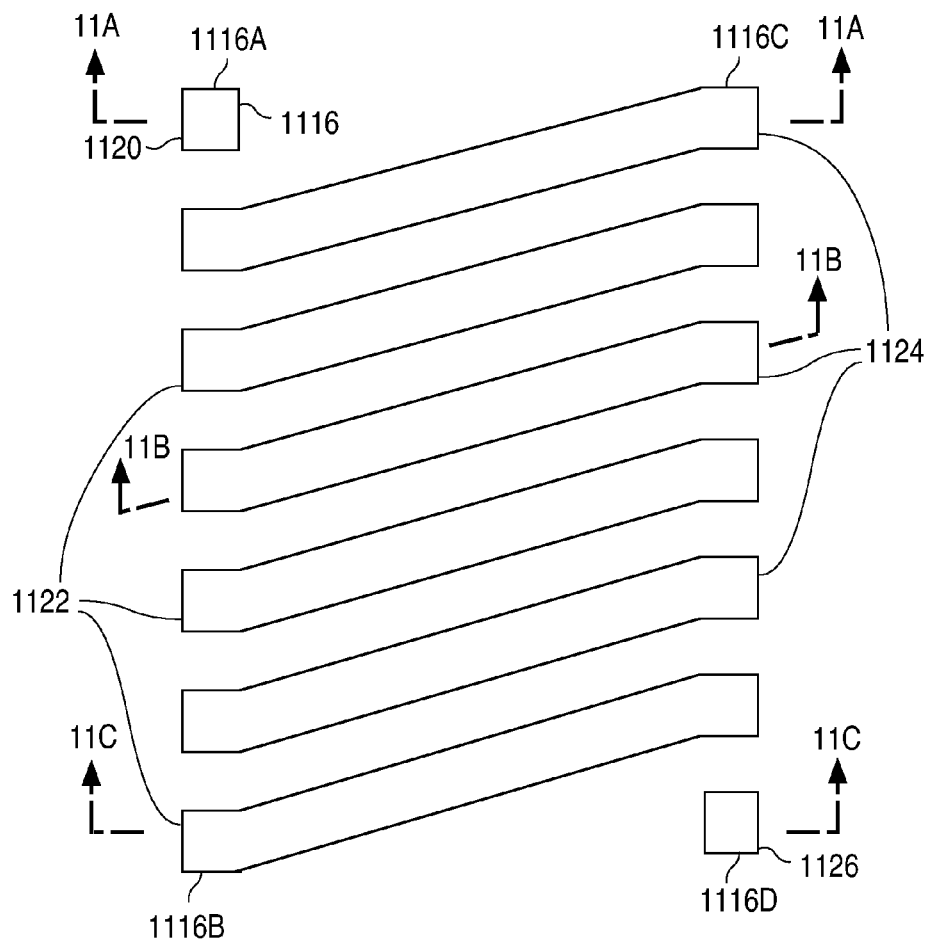
FIG. 11, FIGS. 12A-12C through 17A-17C, FIG. 18, FIGS. 19A-19C through 24A-24C, FIG. 25, FIGS. 26A-26C through 31A-31C are a series of views illustrating an example of a method of forming transformer 100 in accordance with the present invention.
Figure 12A:
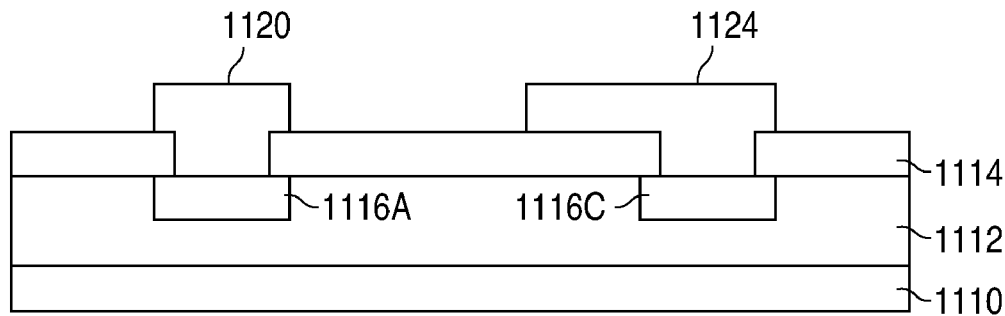
Figure 12B:
Figure 12C:
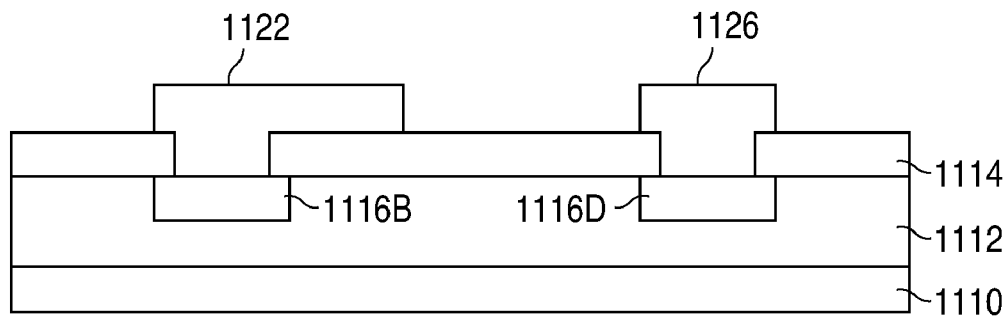

FIG. 11, FIGS. 12A-12C through 17A-17C, FIG. 18, FIGS. 19A-19C through 24A-24C, FIG. 25, FIGS. 26A-26C through 31A-31C show a series of views that illustrate an example of a method of forming transformer 100 in accordance with the present invention. FIG. 11 is a plan view, FIGS. 12A-17A are cross-sectional views taken along line 11A-11A of FIG. 11, FIGS. 12B-17B are cross-sectional views taken along line 11B-11B of FIG. 11, and FIGS. 12C-17C are cross-sectional views taken along line 11C-11C of FIG. 11.

Figure 18:
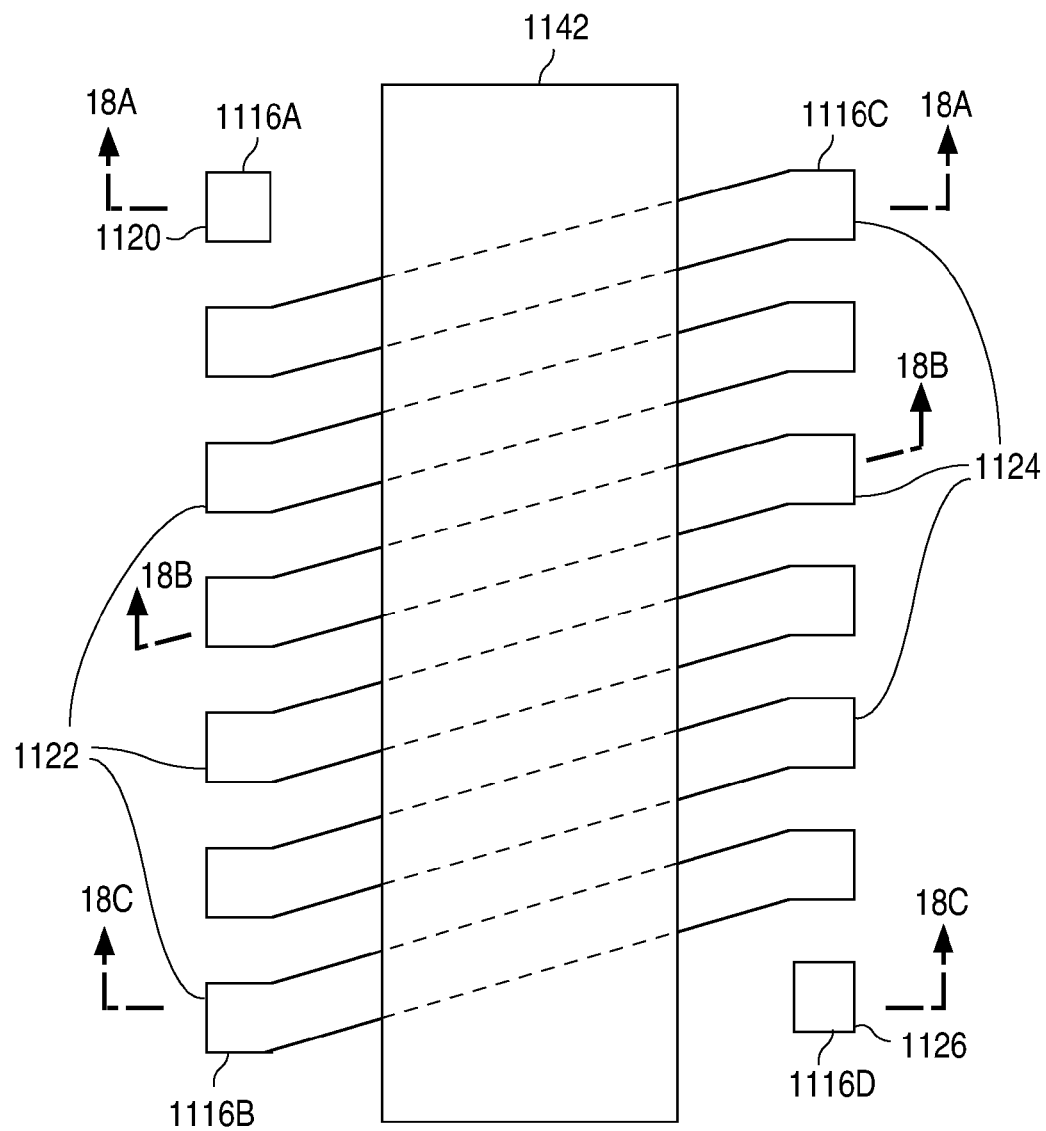
Figure 19A:
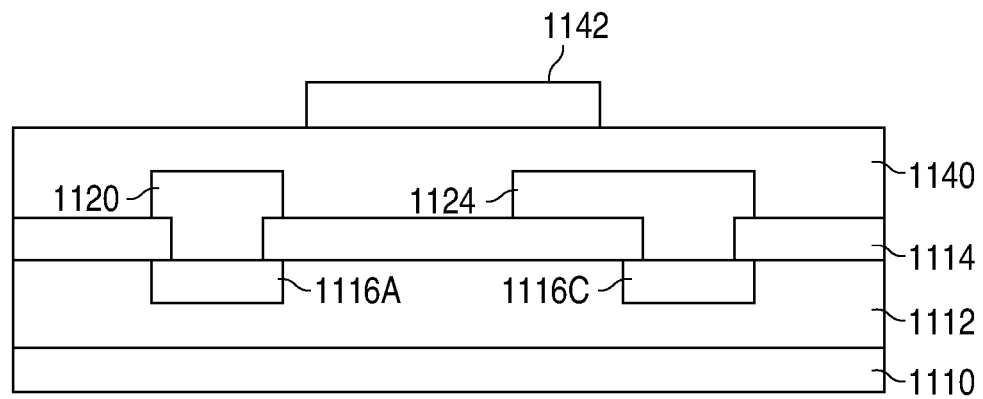
Figure 19B:
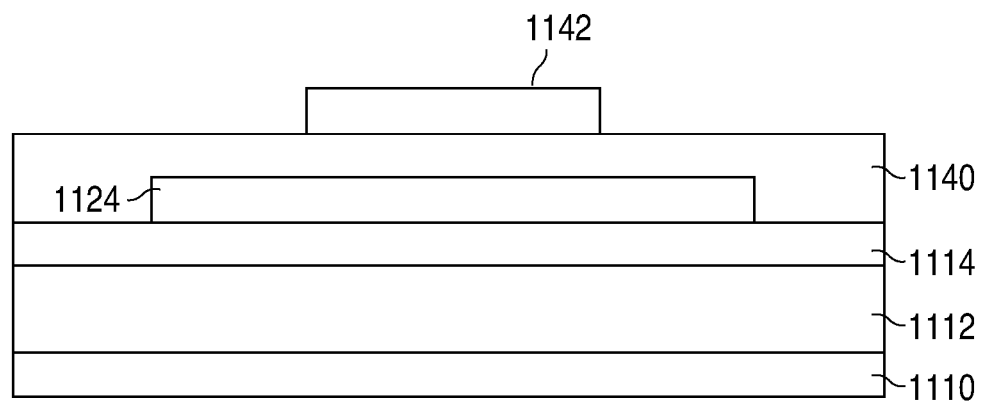
Figure 19C:
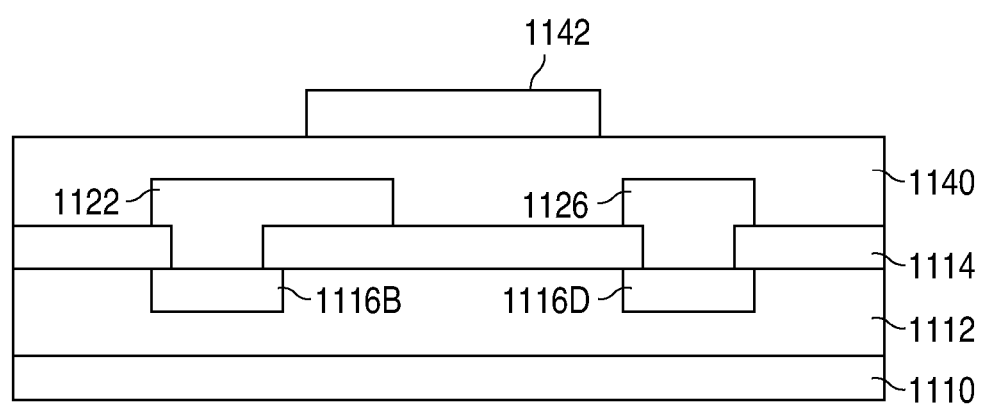
Figure 23A:
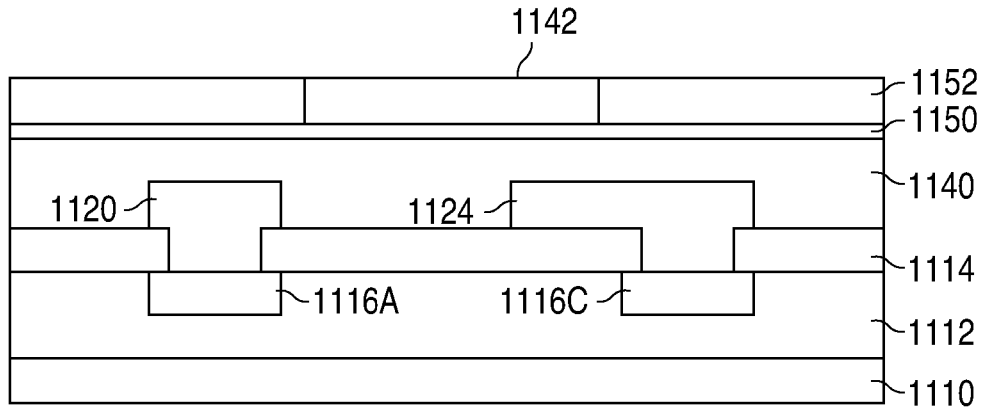
Figure 23B:
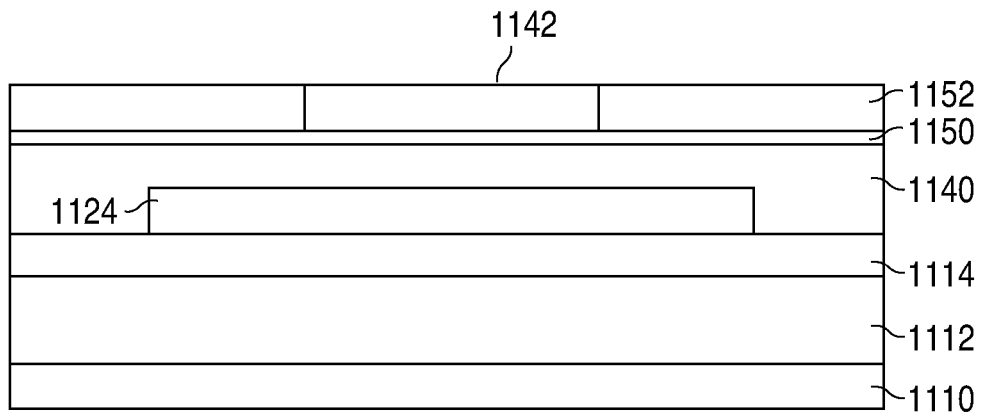
Figure 23C:
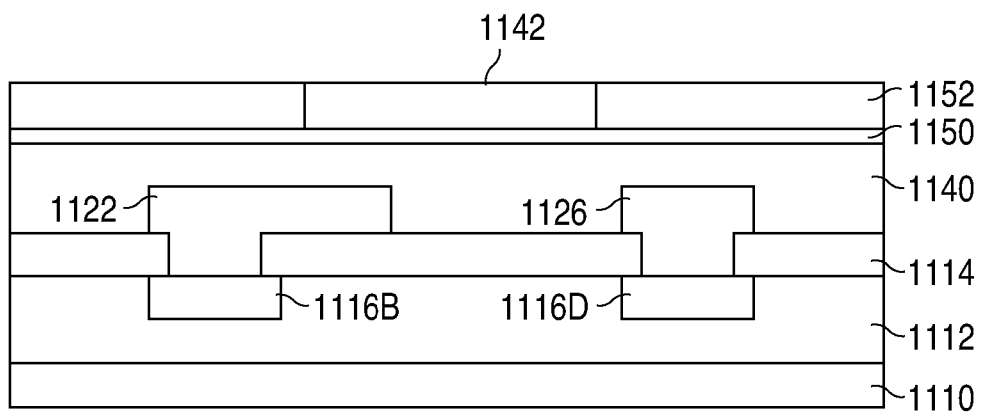
Figure 24A:
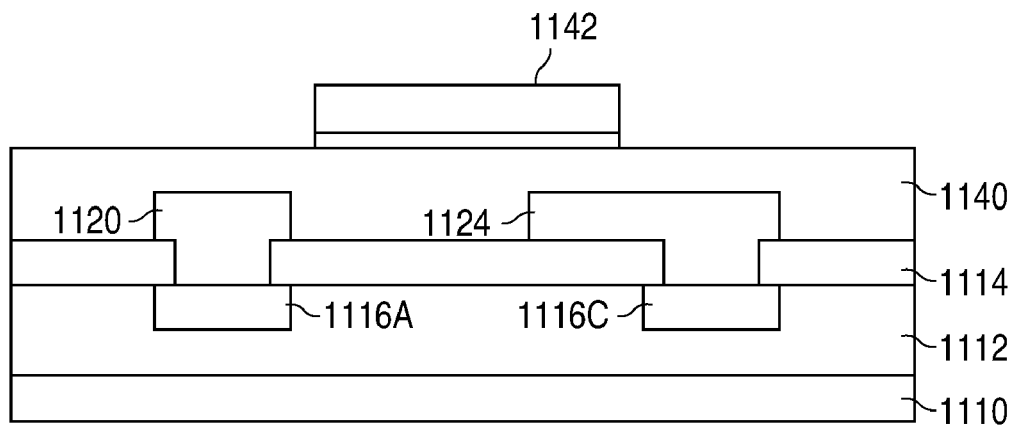
Figure 24B:
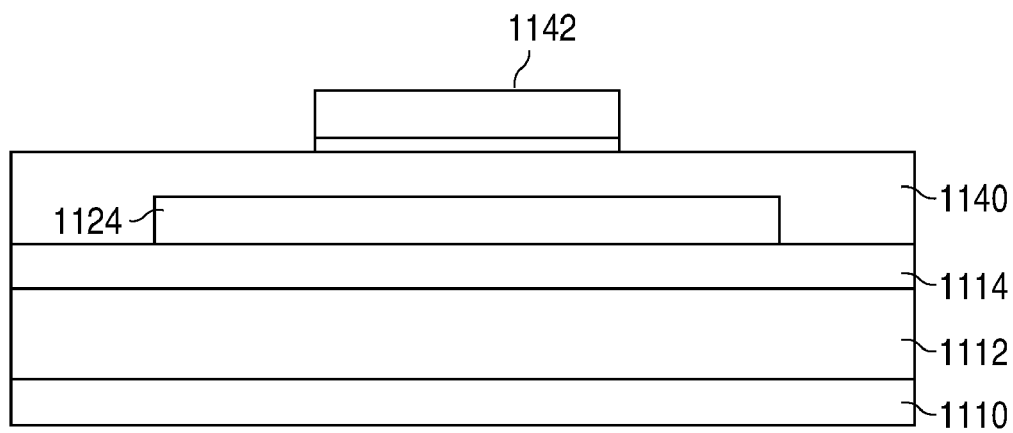
Figure 24C:
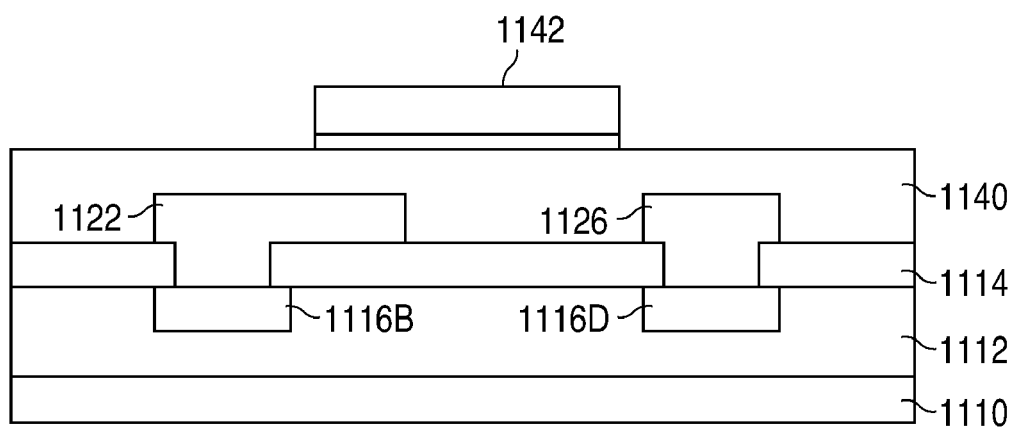
Figure 25:
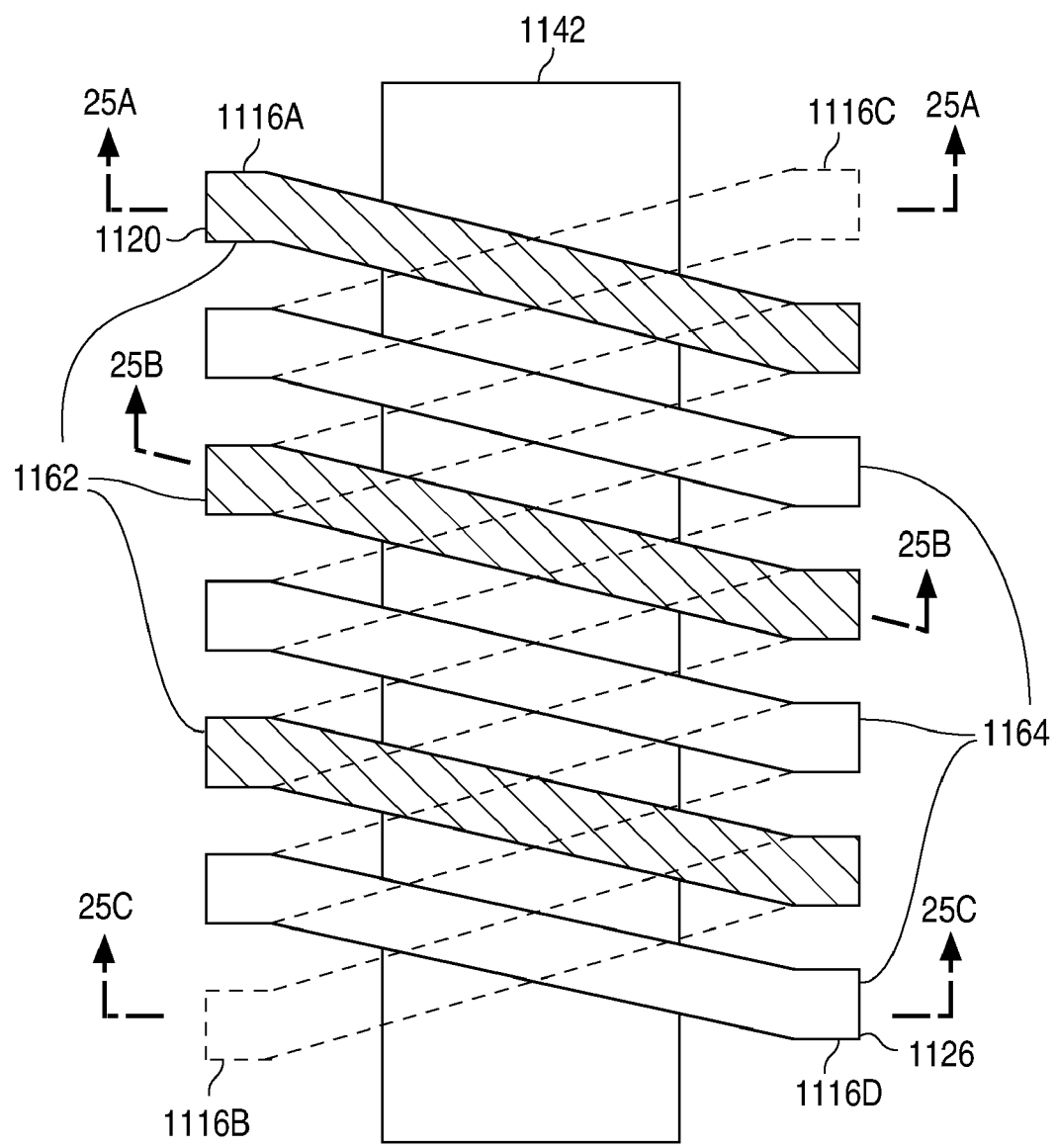
Figure 26A:
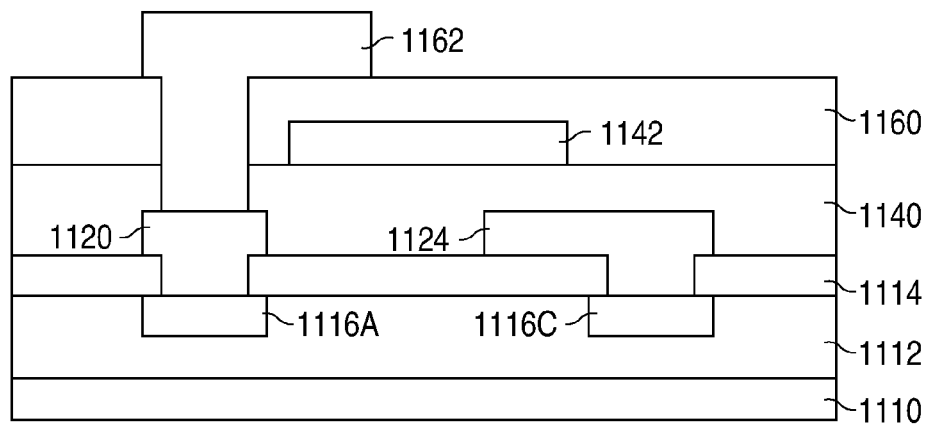
Figure 26B:
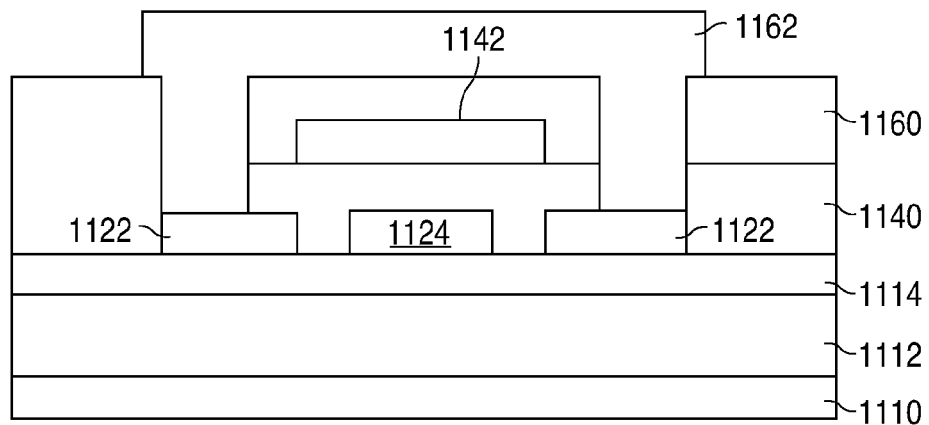
Figure 26C:
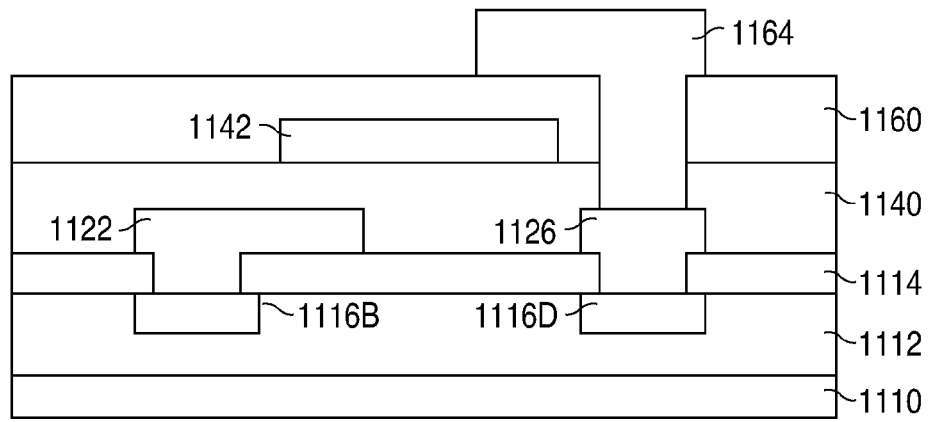
Figure 27A:
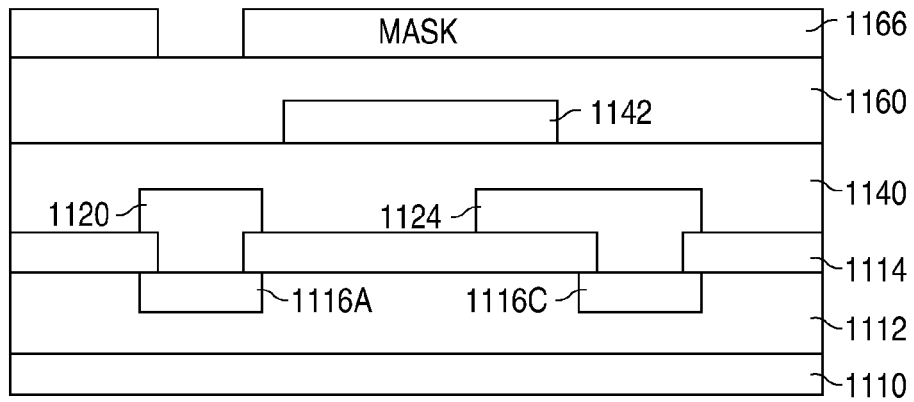
Figure 27B:
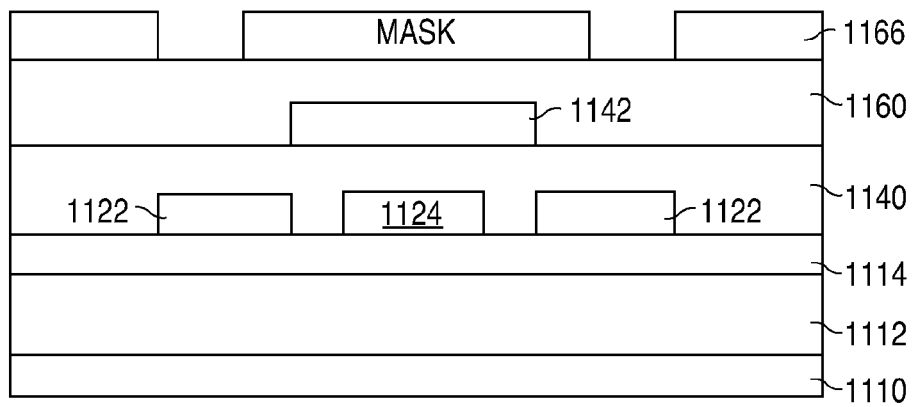
Figure 27C:
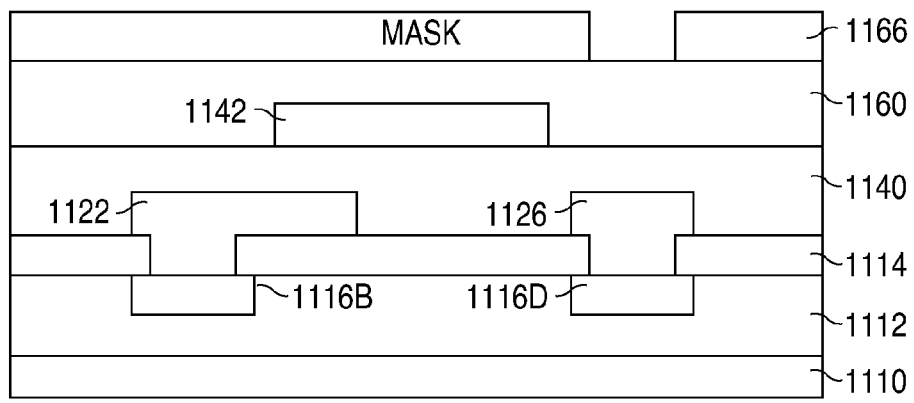

FIG. 18 is a plan view, FIGS. 19A-24A are cross-sectional views taken along line 18A-18A of FIG. 18, FIGS. 19B-24B are cross-sectional views taken along line 18B-18B of FIG. 18, and FIGS. 19C-24C are cross-sectional views taken along line 18C-18C of FIG. 18. FIG. 25 is a plan view, FIGS. 26A-31A are cross-sectional views taken along line 25A-25A of FIG. 25, FIGS. 26B-31B are cross-sectional views taken along line 25B-25B of FIG. 25, and FIGS. 26C-31C are cross-sectional views taken along line 25C-25C of FIG. 25.

As shown in FIGS. 11 and 12A-12C, the method utilizes a conventionally formed single-crystal silicon semiconductor wafer 1110 that has a conventionally formed metal interconnect structure 1112 that touches the top surface of wafer 1110. The semiconductor wafer 1110 includes a large number of electrical devices, such as transistors, resistors, capacitors, and diodes.

The metal interconnect structure 1112, which electrically connects the electrical devices together to form a circuit, includes a number of levels of metal traces, a large number of contacts that connect the bottom metal trace to electrically conductive regions on wafer 1110, and a large number of inter-metal vias that connect the metal traces in adjacent layers together.

In addition, the metal interconnect structure 1112 includes a top passivation layer 1114 with openings that expose a number of conductive pads 1116. The pads 1116, in turn, are selected regions of the metal traces in the top metal layer that provide points for external electrical connections, and points for electrical connections to overlying devices.

As shown in FIGS. 11 and 12A-12C, the pads 1116 include the pads 1116A-1116B, which provide electrical connections for a to-be-formed primary coil, and the pads 1116C and 1116D, which provide electrical connections for a to-be-formed secondary coil. (Only the pads 1116A-1116D, and not the entire metal interconnect structure, are shown in cross-section for clarity.)

As further shown in FIGS. 11 and 12A-12C, the method begins by forming a lower primary section 1120 that touches the pad 1116A, a number of spaced-apart lower primary coil members 1122 where one of the lower primary coil members 1120 touches the pad 1116B, a number of spaced-apart lower secondary coil members 1124 where one of the lower secondary coil members 1124 touches the pad 1116C, and a lower secondary coil section 1126 that touches the pad 1116D.

The lower primary section 1120, the spaced-apart lower primary coil members 1122, the spaced-apart lower secondary coil members 1124, and the lower secondary coil section 1126, each of which lie over and touch the top surface of the passivation layer 1114, can be formed in a number of different ways.

Figure 13A:
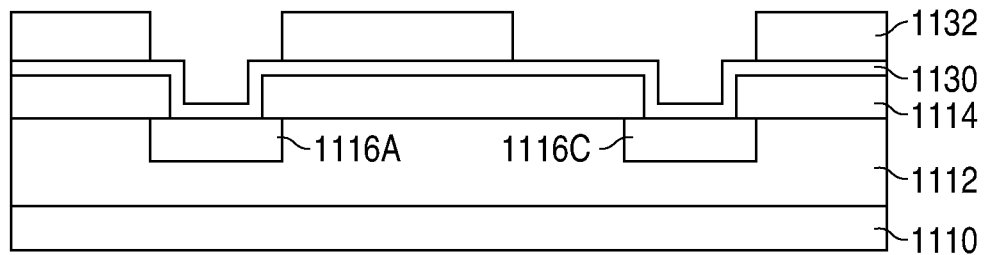
Figure 13B:
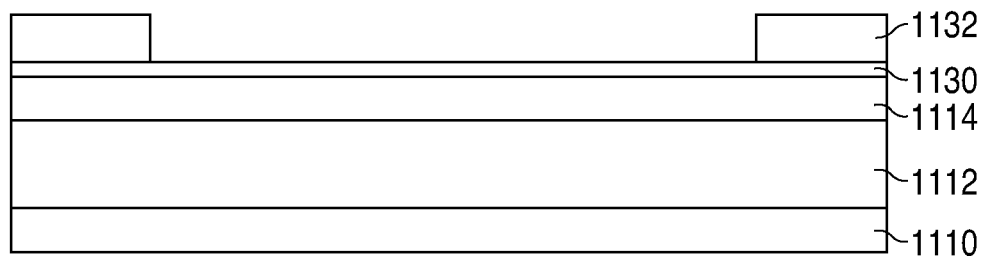
Figure 13C:
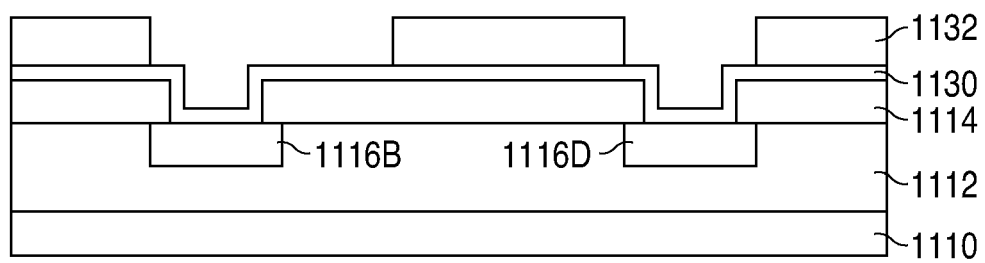

As shown in FIGS. 13A-13C, in a first embodiment, a seed layer 1130 can be formed to touch the passivation layer 1114 and the exposed pads 1116A-1116D. For example, the seed layer 1130 can be formed by depositing 300 Å of titanium, 3000 Å of copper, and 300 Å of titanium. (The seed layer 1130 can also include a barrier layer to prevent copper electromigration if needed.) Once the seed layer 1130 has been formed, a plating mold 1132 is formed on the top surface of the seed layer 1130.

Figure 14A:
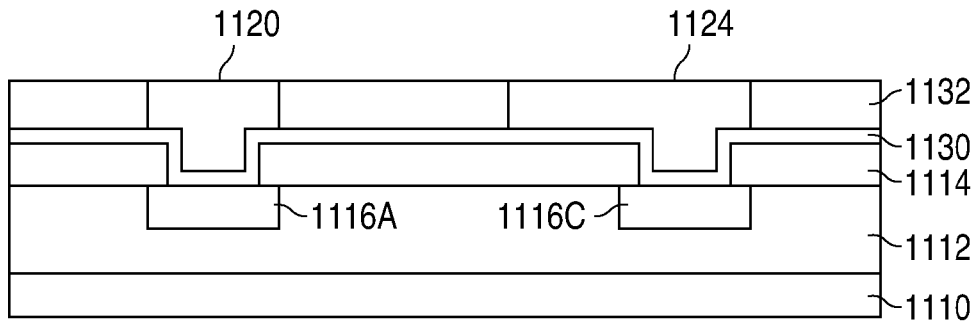
Figure 14B:
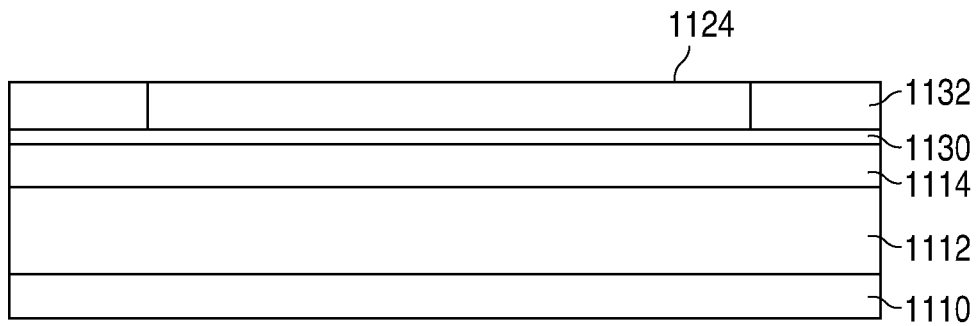
Figure 14C:
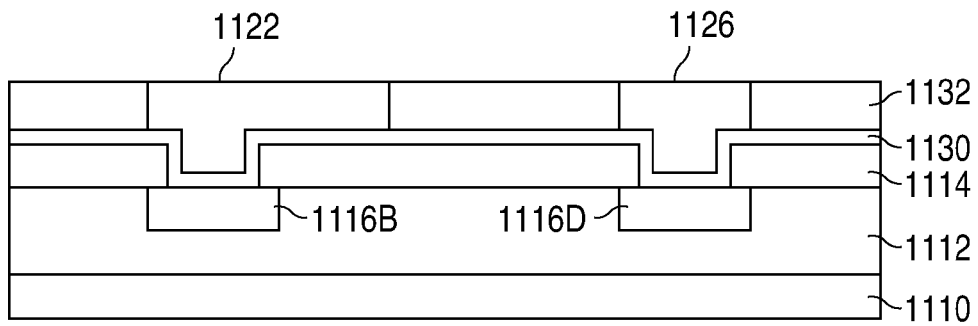
Figure 15A:
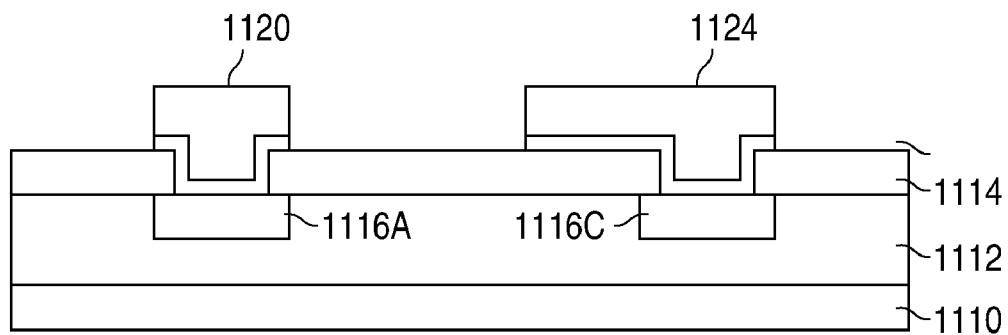
Figure 15B:
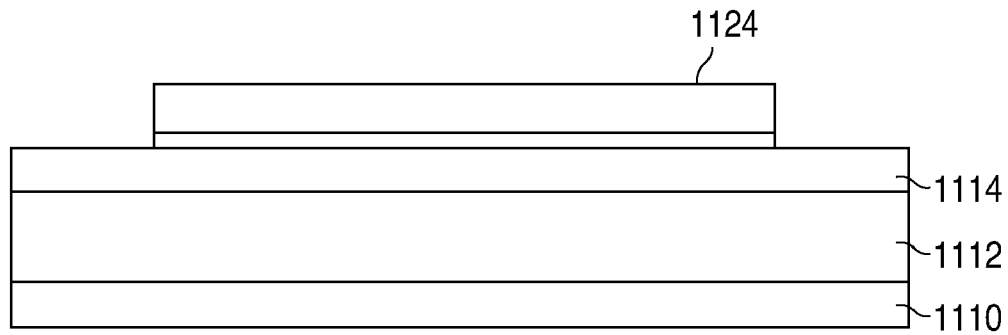
Figure 15C:
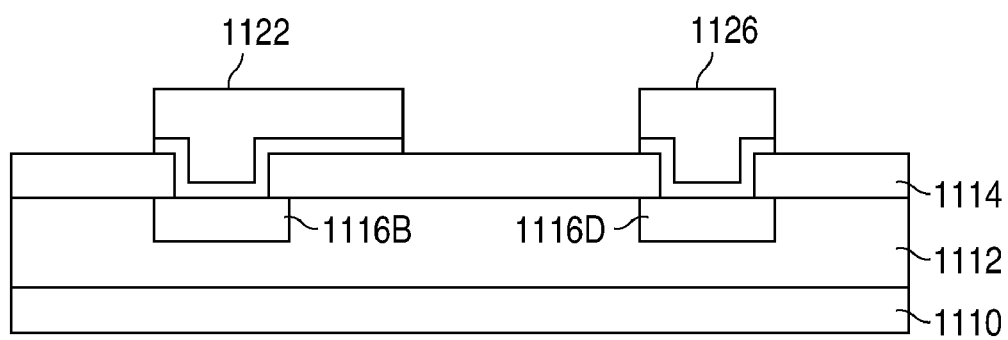

As shown in FIGS. 14A-14C, following the formation of the plating mold 1132, the top titanium layer is stripped and copper is deposited by electroplating to form the lower primary section 1120, the lower primary coil members 1122, the lower secondary coil members 1124, and the lower secondary section 1126. As shown in FIGS. 15A-15C, after the electroplating, the plating mold 1132 and the underlying regions of the seed layer 1130 are removed to expose the lower primary section 1120, the lower primary coil members 1122, the lower secondary coil members 1124, and the lower secondary section 1126.

Figure 16A:
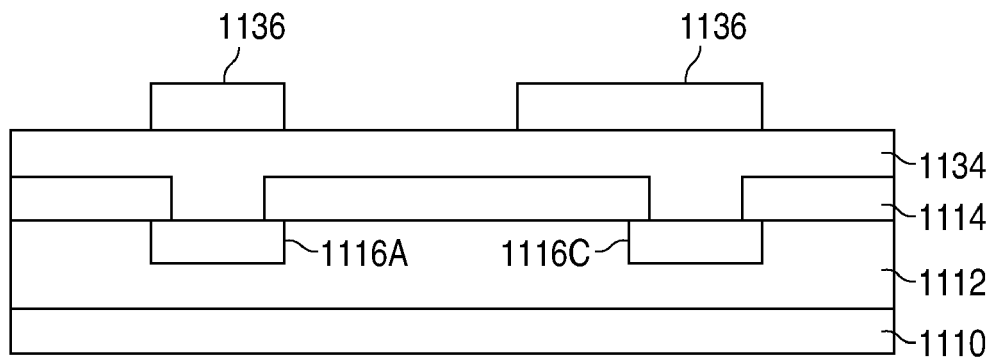
Figure 16B:
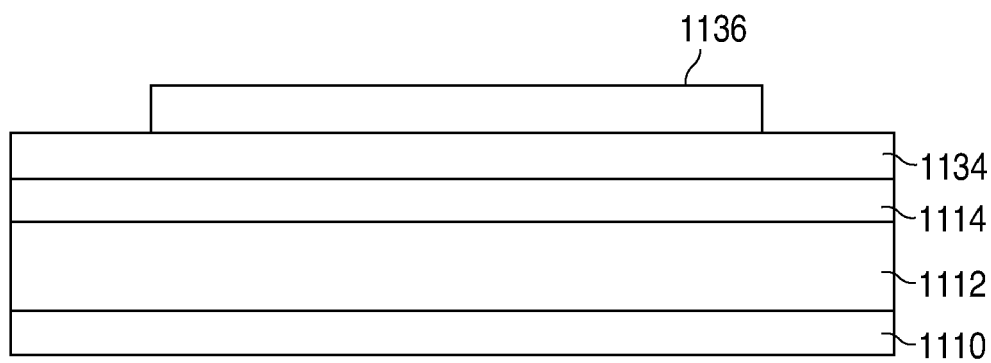
Figure 16C:
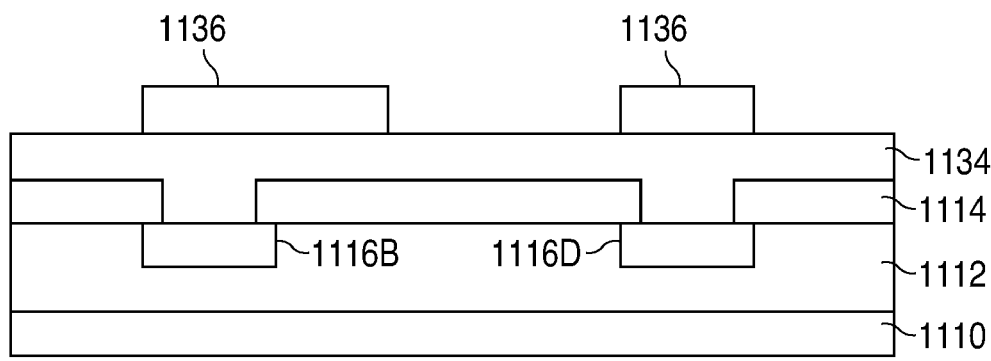

Alternately, in a second embodiment, as shown in FIGS. 16A-16C, the lower primary section 1120, the lower primary coil members 1122, the lower secondary coil members 1124, and the lower secondary section 1126 can be formed by depositing a metal layer 1134 that touches the top surface of the passivation layer 1114 and the pads 1116A-1116D.

The metal layer 1134 can include, for example, a layer of titanium (e.g., 100 Å thick), a layer of titanium nitride (e.g., 200 Å thick), a layer of aluminum copper (e.g., 1.2 µm thick), a layer of titanium (e.g., 44 Å thick), and a layer of titanium nitride (e.g., 250 Å thick). Once the metal layer 1134 has been formed, a mask 1136 is formed and patterned on the top surface of the metal layer 1134.

Figure 17A:
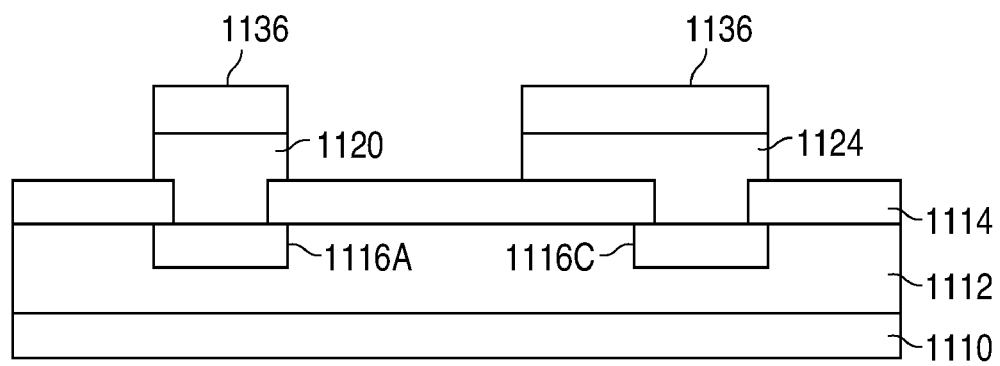
Figure 17B:
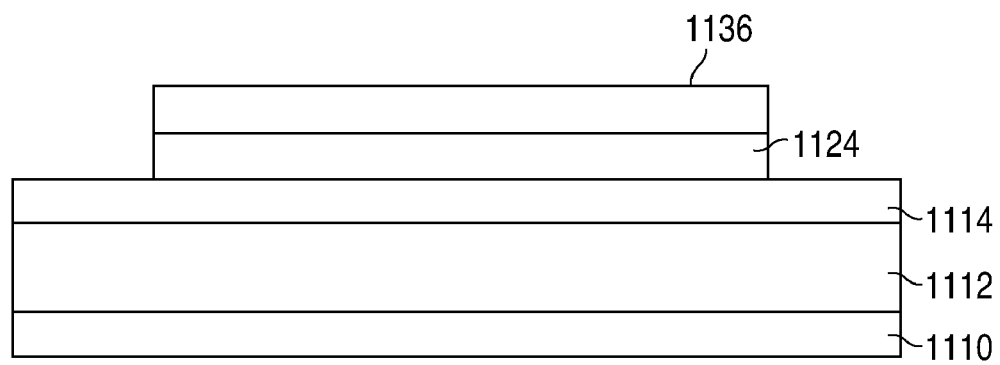
Figure 17C:
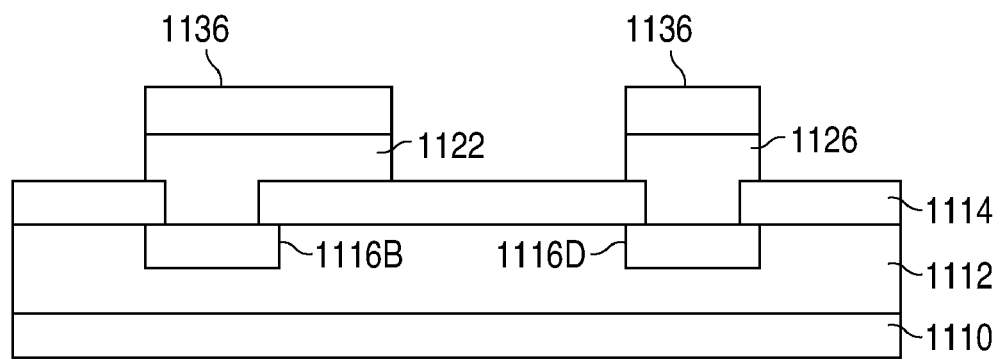

As shown in FIGS. 17A-17C, following the formation and patterning of the mask 1136, the metal layer 1134 is etched to remove the exposed regions of the metal layer 1134 and form the lower primary section 1120, the lower primary coil members 1122, the lower secondary coil members 1124, and the lower secondary section 1126. The mask 1136 is then removed.

As shown in FIGS. 18 and 19A-19C, after the lower primary section 1120, the lower primary coil members 1122, the lower secondary coil members 1124, and the lower secondary section 1126 have been formed, a lower non-conducting layer 1140, such as an oxide layer, is formed on the passivation layer 1114, the lower primary section 1120, the lower primary coil members 1122, the lower secondary coil members 1124, and the lower secondary section 1126. For example, the lower non-conducting layer 1140 can be formed by depositing an oxide, and then chemically-mechanically polishing the oxide to have a target thickness of, for example, 2000 Å, over the passivation layer 1114.

After the lower non-conducting layer 1140 has been formed, the method next forms a core 1142 on the lower non-conducting layer 1140 over the lower primary coil members 1122 and the lower secondary coil members 1124. The core 1142 can be formed in a number of different ways.

Figure 20A:
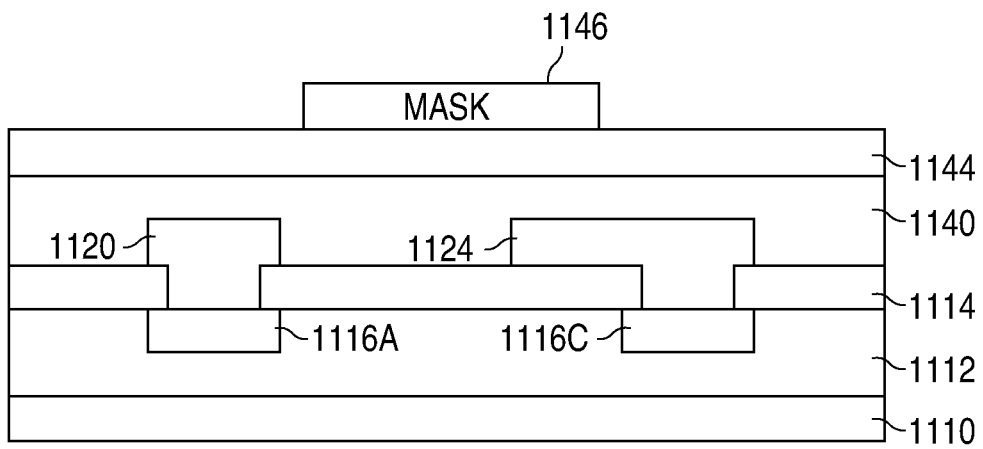
Figure 20B:
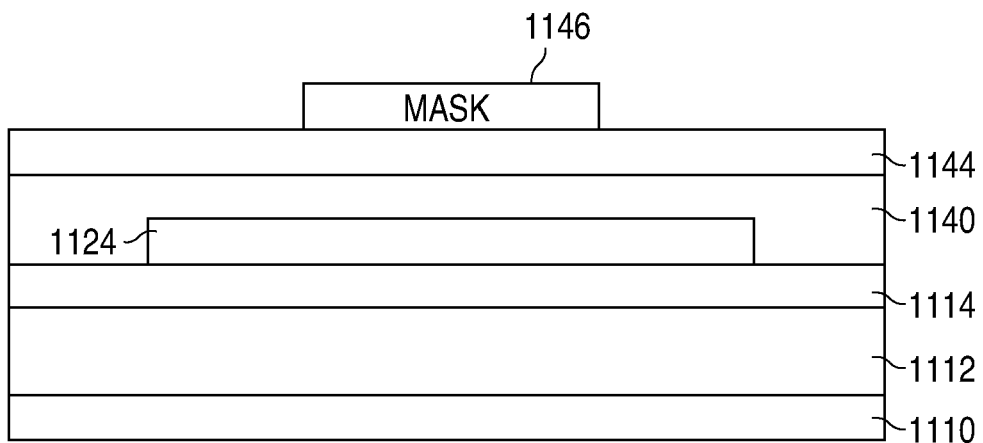
Figure 20C:
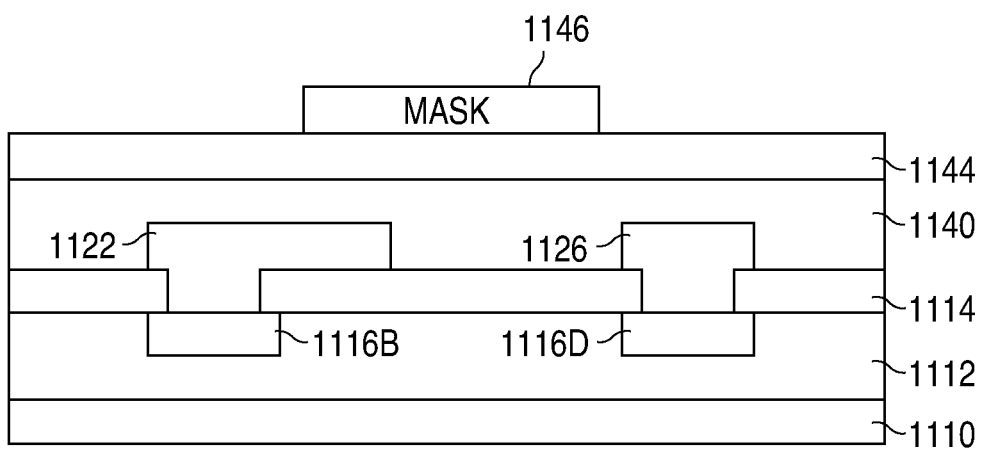

As shown in FIGS. 20A-20C, in a first embodiment, a magnetic material layer 1144 is sputter deposited on the top surface of the lower non-conducting layer 1140. The magnetic material layer 1144 can be implemented with, for example, cobalt tantalum zirconium (CoTaZr) or permalloy.

Figure 21A:
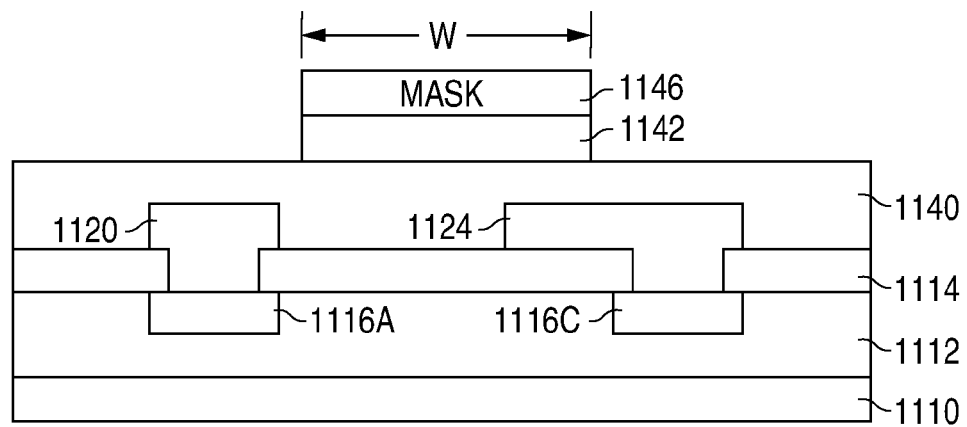
Figure 21B:
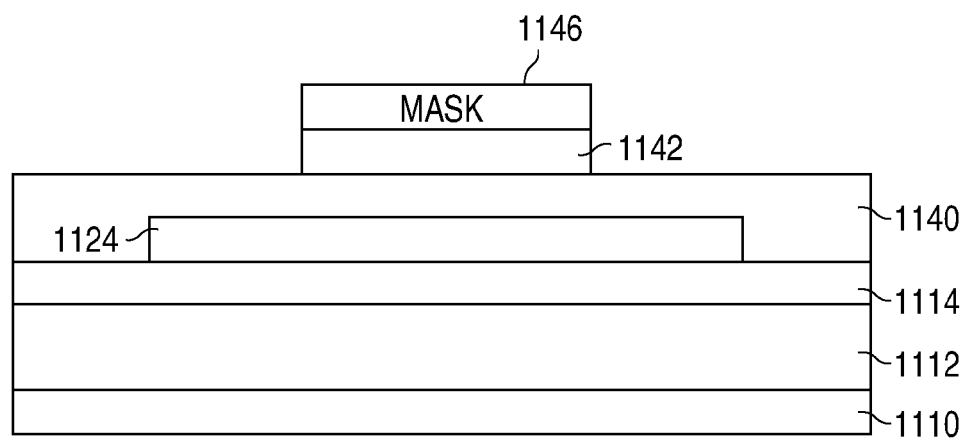
Figure 21C:
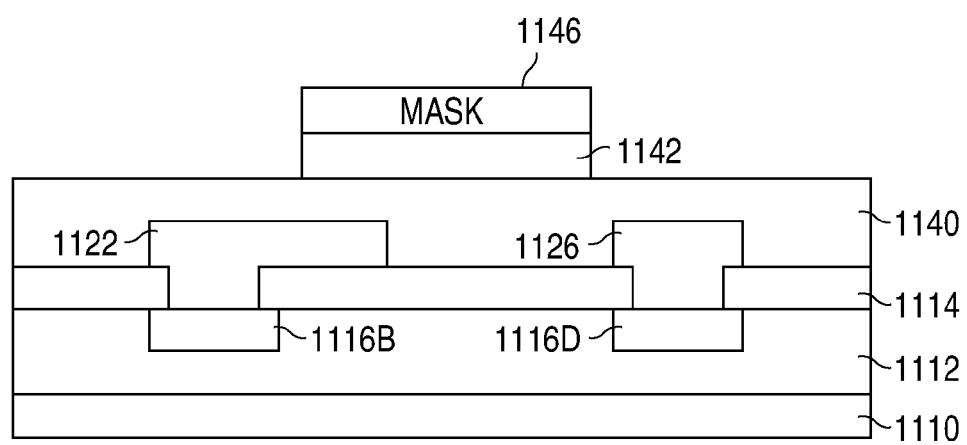

Following this, a mask 1146 is formed and patterned on the magnetic material layer 1144. The mask 1146 is patterned to have a width W and a length. As shown in FIGS. 21A-21C, after mask 1146 has been patterned, the exposed regions of the magnetic material layer 1144 are etched and removed to form the core 1142. Mask 1146 is then removed.

In accordance with the present invention, the magnetic material layer 1144 is subjected to the presence of a strong magnetic field that induces the easy axis of the magnetic material layer 1144 to be substantially parallel with the width W of the mask 1146 which, in turn, causes the easy axis of the magnetic material layer 1144 to be substantially perpendicular to the length of the core 1142.

The strong magnetic field can be applied during the deposition of the magnetic material layer 1144. Alternately, the strong magnetic field can be applied during an anneal at elevated temperatures after the deposition of the magnetic material layer 1144, or after patterning the magnetic material layer 1144 to form the core 1142.

Figure 22A:
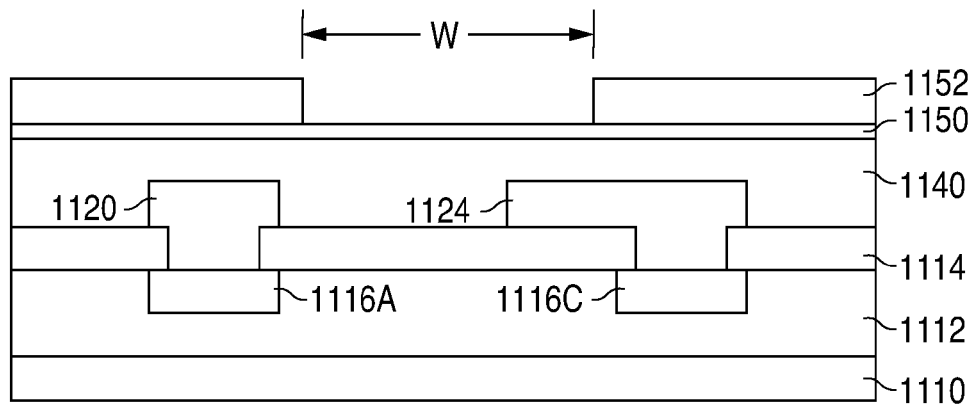
Figure 22B:
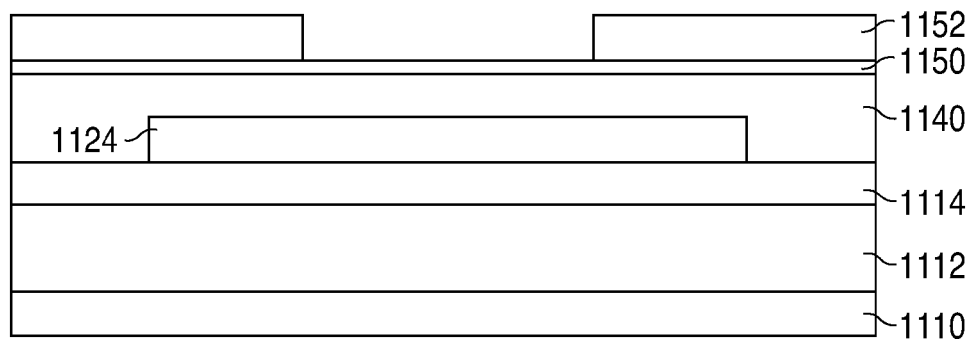
Figure 22C:
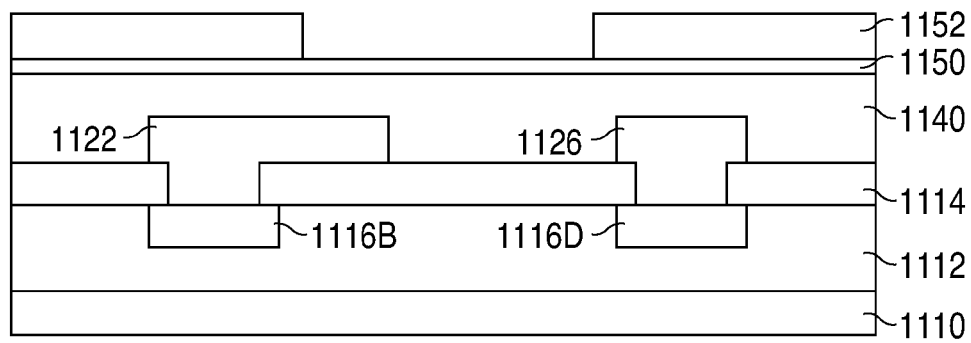

Alternately, in a second embodiment, as shown in FIGS. 22A-22C, the core 1142 can be formed by depositing a seed layer 1150 on the top surface of lower non-conducting layer 1140. For example, the seed layer 1150 can be formed by depositing 300 Å of titanium, 3000 Å of copper, and 300 Å of titanium. (The seed layer 1150 can also include a barrier layer to prevent copper electromigration if needed.) After the seed layer 1150 has been formed, a plating mold 1152 is formed and patterned on the top surface of the seed layer 1150. The plating mold 1152 is formed to have an opening with a length, a width W, and a thickness.

Next, following the formation of plating mold 1152, as illustrated in FIGS. 23A-23C, the top titanium layer is stripped and a magnetic material, such as an alloy of nickel and iron like permalloy, is deposited by electroplating to a thickness of, for example, 10 μm to form the core 1142. After this, as shown in FIGS. 24A-24C, the plating mold 1152 and the underlying regions of the seed layer 1150 are removed to expose the core 1142.

In accordance with the present invention, the magnetic material is subjected to the presence of a strong magnetic field that induces the easy axis of the magnetic material to be substantially parallel to the width W of the plating mold 1152 which, in turn, causes the easy axis of the magnetic material to be substantially perpendicular to the length of the core 1142. The strong magnetic field can be applied during the electroplating of the magnetic material. Alternately, the strong magnetic field can be applied during an anneal at elevated temperatures after the electroplating process.

After the core 1142 has been formed, as shown in FIGS. 25 and 26A-26C, the method forms the tops and sides of the primary coil, and the tops and sides of the secondary coil. For example, after core 1142 has been formed, an upper non-conducting layer 1160, such as an oxide layer, is formed on the lower non-conducting layer 1140 and the core 1142.

The upper non-conducting layer 1160 can be formed by depositing an oxide to a thickness of, for example, 1 μm, and then chemically-mechanically polishing the oxide to have a target thickness of, for example, 2000 Å, over lower non-conducting layer 1140.

As shown in FIGS. 25 and 26A-26C, after the upper non-conducting layer 1160 has been formed, a number of spaced-apart upper primary coil members 1162 are formed to touch the lower primary section 1120 and the ends of the lower primary coil members 1122 to form the primary coil 126, and a number of spaced-apart upper secondary coil members 1164 are formed to touch the ends of the lower secondary coil members 1124, and the top surface of the lower secondary coil section 1126 to form the secondary coil 128.

Figure 28A:
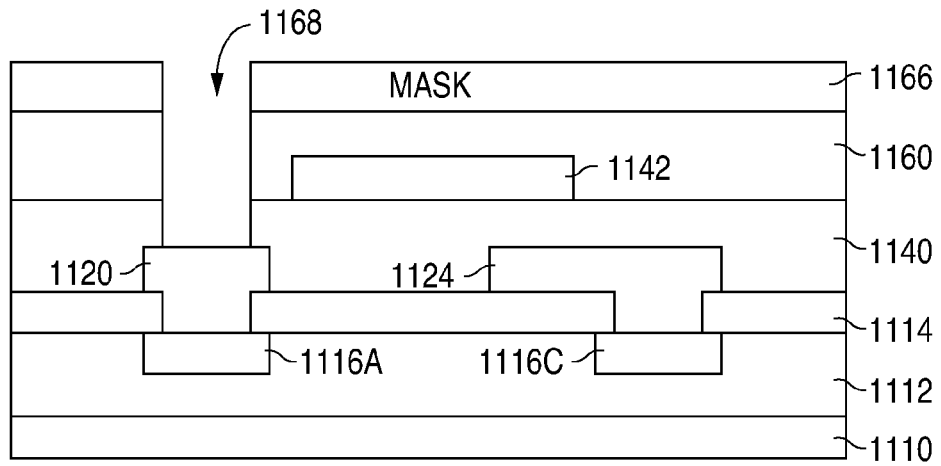
Figure 28B:
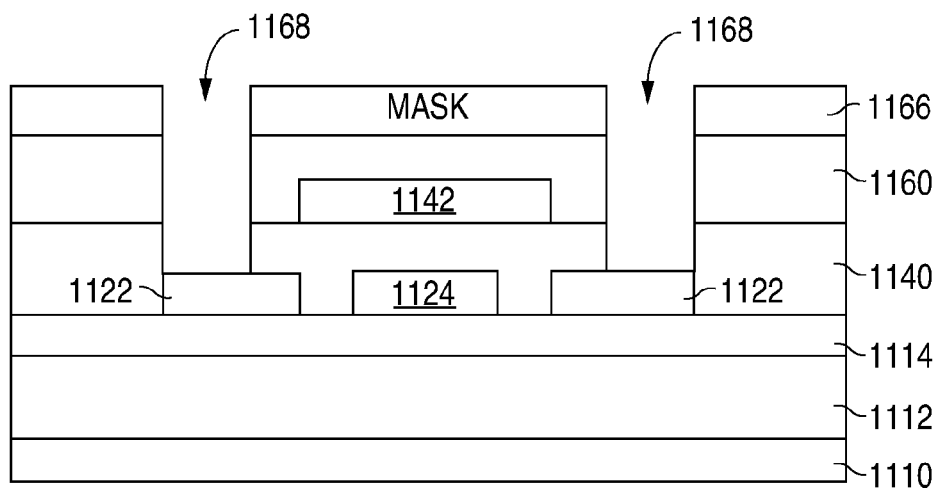
Figure 28C:
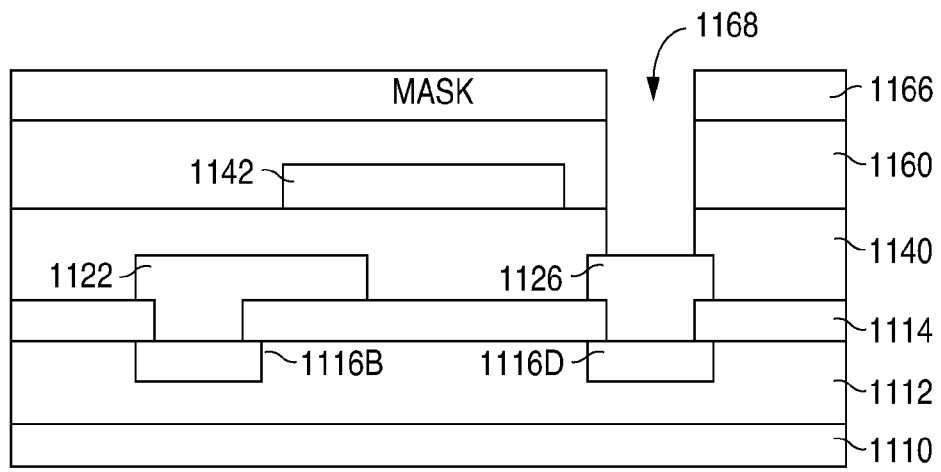

As shown in FIGS. 25 and 27A-27C, after the upper non-conducting layer 1160 has been formed, the primary coil members 1162 and the secondary coil members 1164 can be formed by forming and patterning a mask 1166, such as a layer of photoresist, on the top surface of the upper non-conducting layer 1160. Following the formation and patterning of the mask 1166, as shown in FIGS. 28A-28C, the exposed regions of the upper non-conducting layer 1160 and underlying non-conducting layer 1140 are next sequentially etched to form a number of vertical openings 1168. Mask 1166 is then removed.

The vertical openings 1168 are via-type openings that expose the top surface of the lower primary section 1120, the top surfaces of the ends of the lower primary coil members 1122, the top surfaces of the ends of the lower secondary coil members 1124, and the top surface of the lower secondary coil section 1126.

Figure 29A:
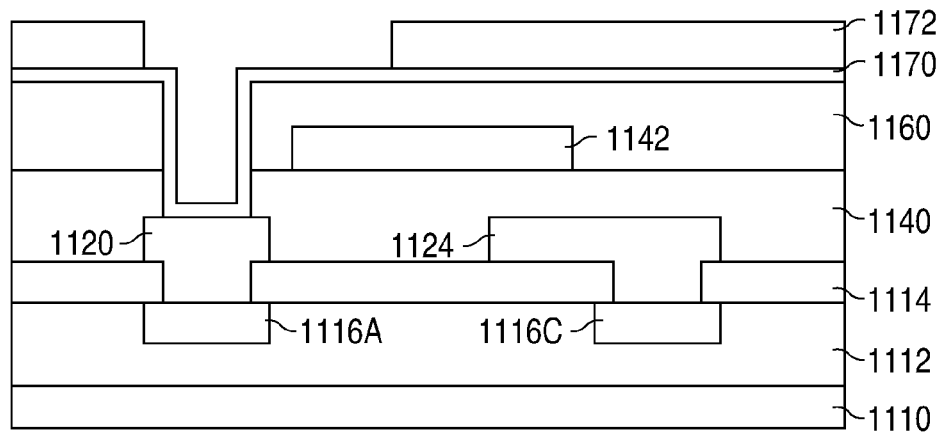
Figure 29B:
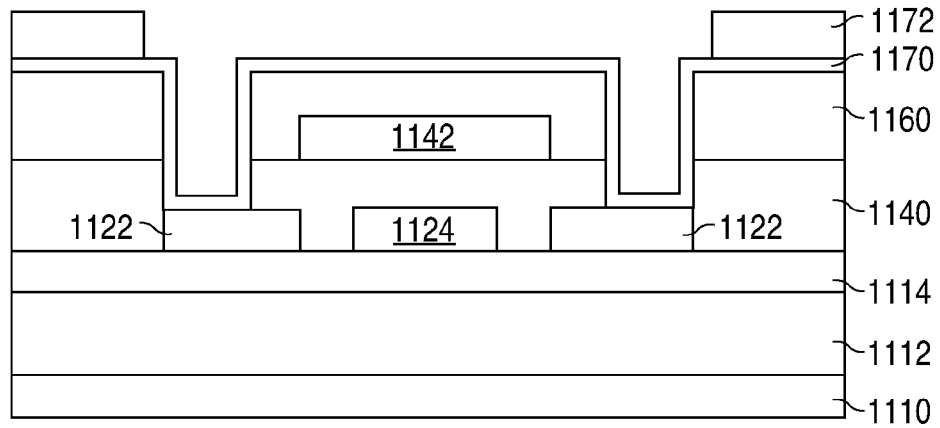
Figure 29C:
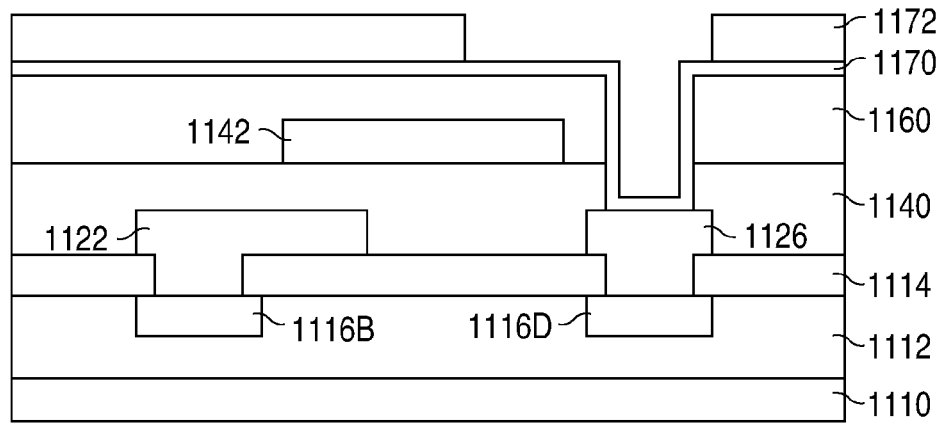

Once mask 1166 has been removed, as shown in FIGS. 29A-29C, a seed layer 1170 is formed on the upper non-conducting layer 1160, the exposed surface of the lower primary section 1120, the exposed ends of the lower primary coil members 1122, the exposed ends of the lower secondary coil members 1124, and the exposed surface of the lower secondary coil section 1126. For example, the seed layer 1170 can be formed by depositing 300 Å of titanium, 3000 Å of copper, and 300 Å of titanium. (The seed layer 1170 can also include a barrier layer to prevent copper electromigration if needed.) After the seed layer 1170 has been formed, a plating mold 1172 is formed and patterned on the top surface of the seed layer 1170.

Figure 30A:
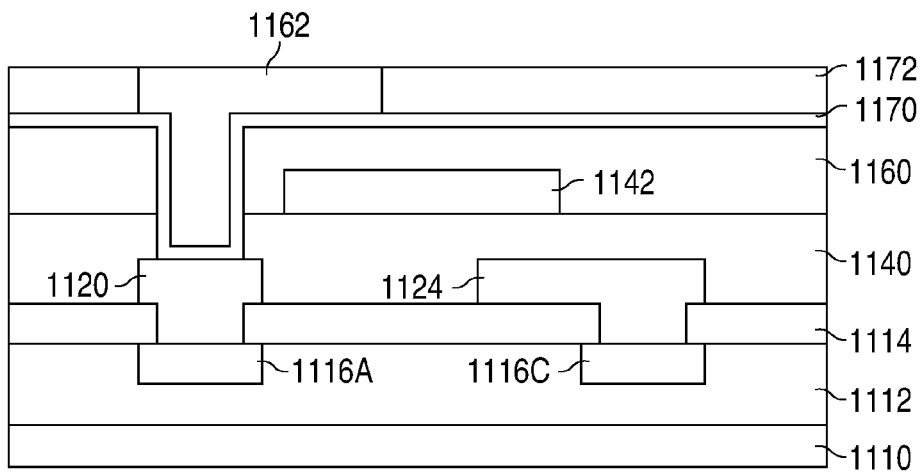
Figure 30B:
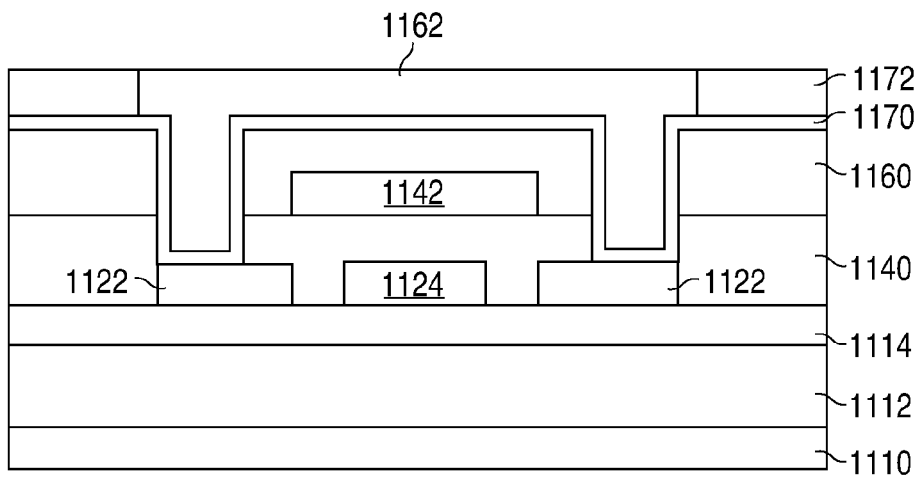
Figure 30C:
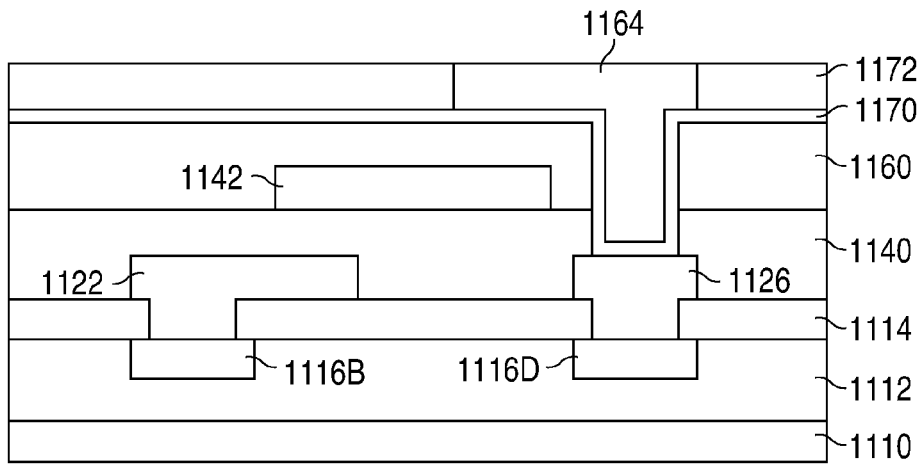
Figure 31A:
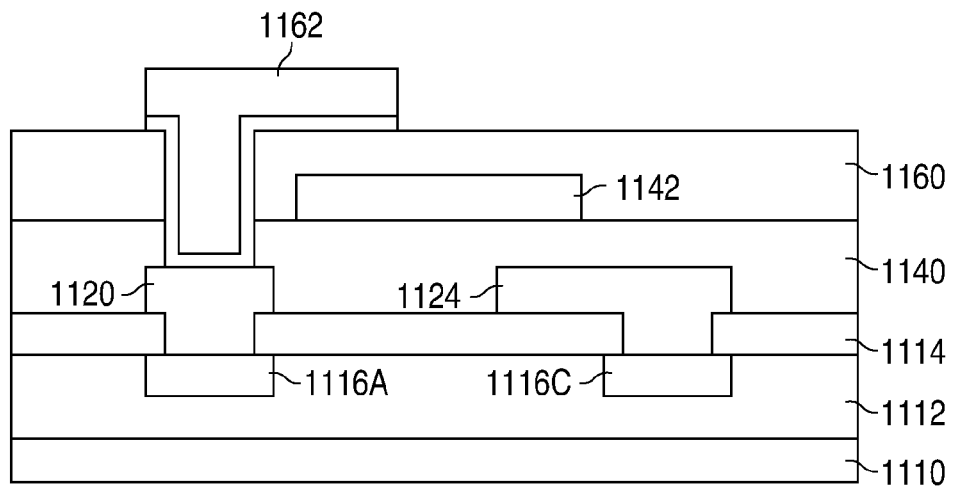
Figure 31B:
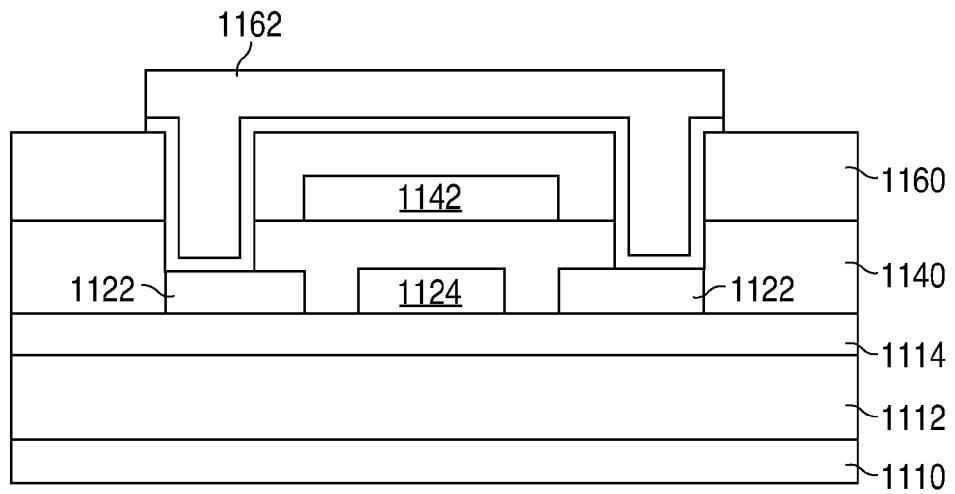
Figure 31C:
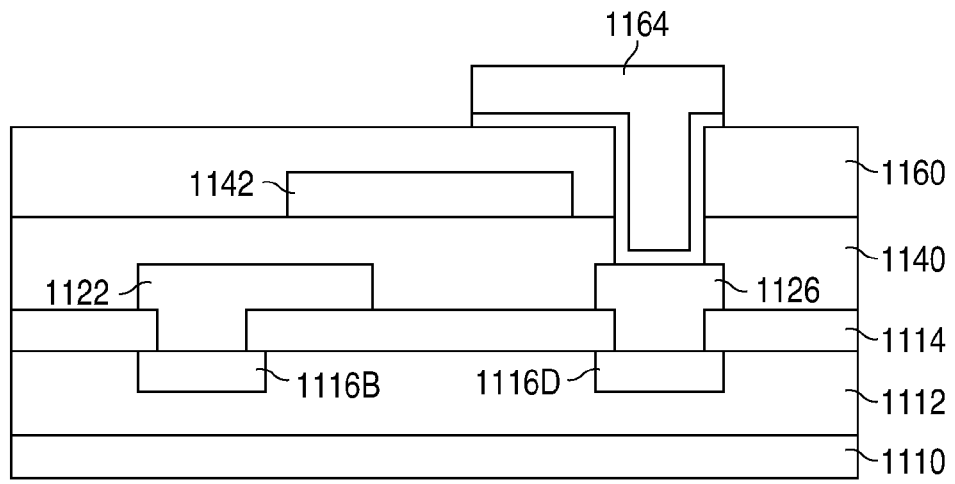

Next, as shown in FIGS. 30A-30C, following the formation and patterning of the plating mold 1172, the top titanium layer is stripped and copper is deposited by electroplating to form the upper primary coil members 1162 and the upper secondary coil members 1164. The upper primary coil members 1162 touch the lower primary section 1120, and the ends of the lower primary coil members 1122 to form the primary coil 126. The upper secondary coil members 1164 touch the ends of the lower secondary coil members 1124, and the lower secondary coil section 1126 to form the secondary coil 128. Following this, as shown in FIGS. 31A-31C, plating mold 1172 and the underlying regions of seed layer 1170 are removed to complete the formation of transformer 100.

Figure 32:
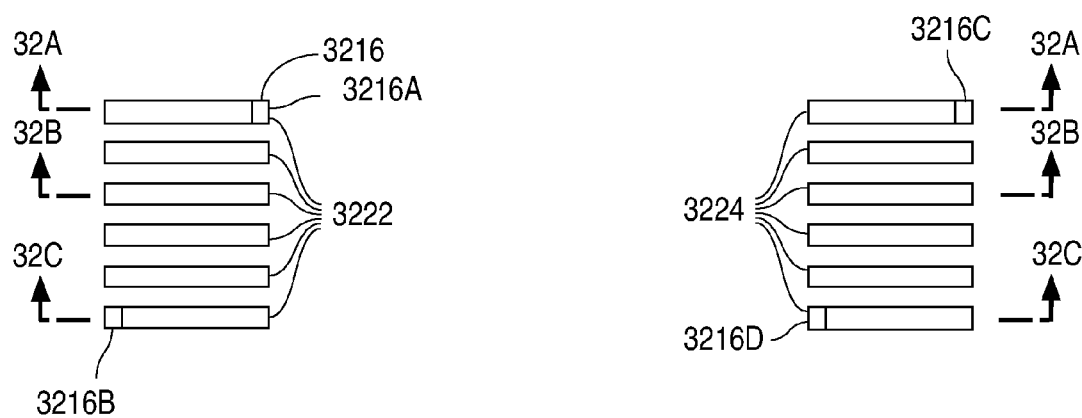
FIG. 32, FIGS. 33A-33C through 38A-38C, FIG. 39, FIGS. 40A-40C through 48A-48C, FIG. 49, FIGS. 50A-50C through 55A-55C are a series of views illustrating an example of a method of forming transformer 500 in accordance with the present invention.
Figure 33A:
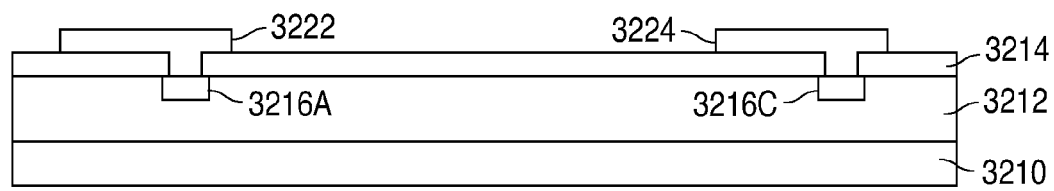
Figure 33B:
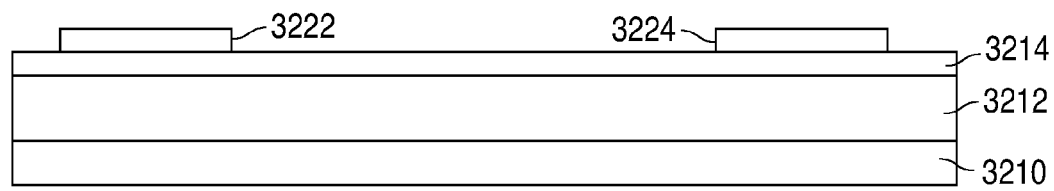
Figure 33C:
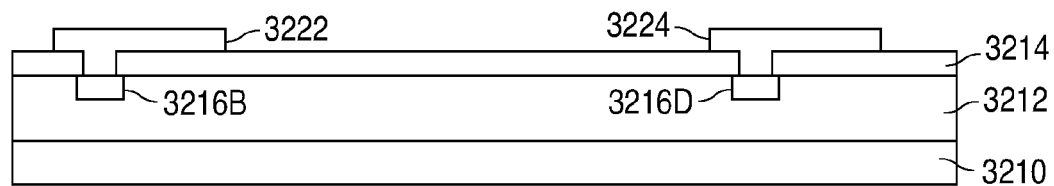

FIG. 32, FIGS. 33A-33C through 38A-38C, FIG. 39, FIGS. 40A-40C through 48A-48C, FIG. 49, FIGS. 50A-50C through 55A-55C show a series of views that illustrate an example of a method of forming transformer 500 in accordance with the present invention. FIG. 32 is a plan view, FIGS. 33A-38A are cross-sectional views taken along line 32A-32A of FIG. 32, FIGS. 33B-38B are cross-sectional views taken along line 32B-32B of FIG. 32, and FIGS. 33C-38C are cross-sectional views taken along line 32C-32C of FIG. 32.

Figure 39:
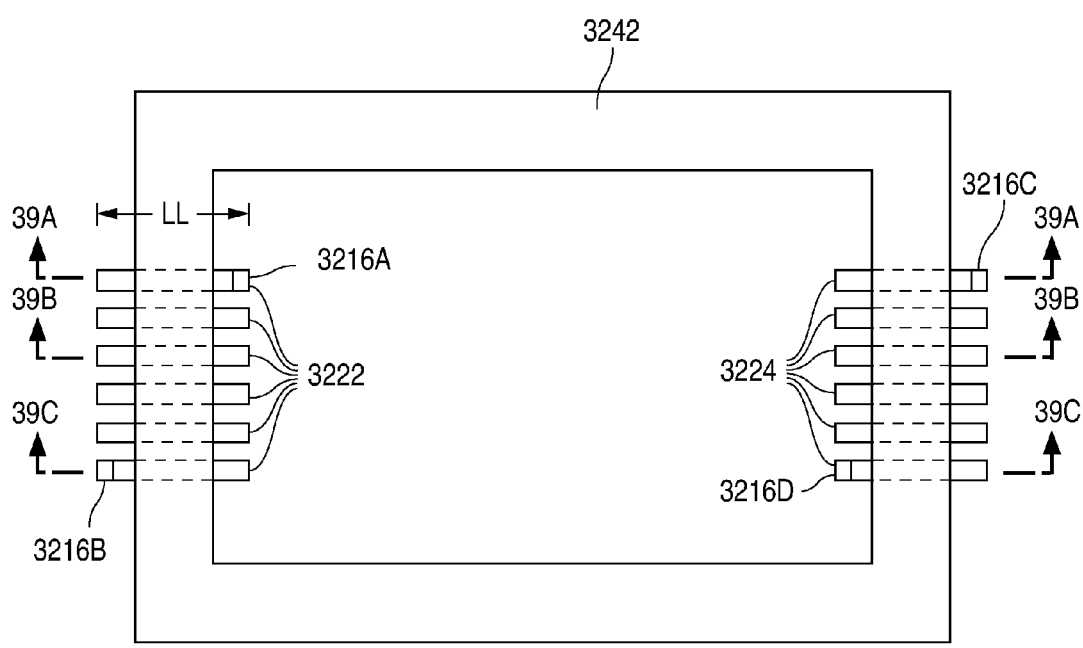
Figure 40A:
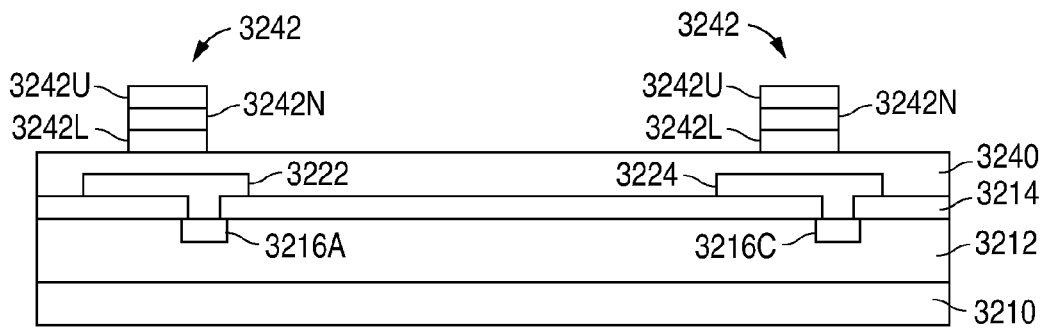
Figure 40B:
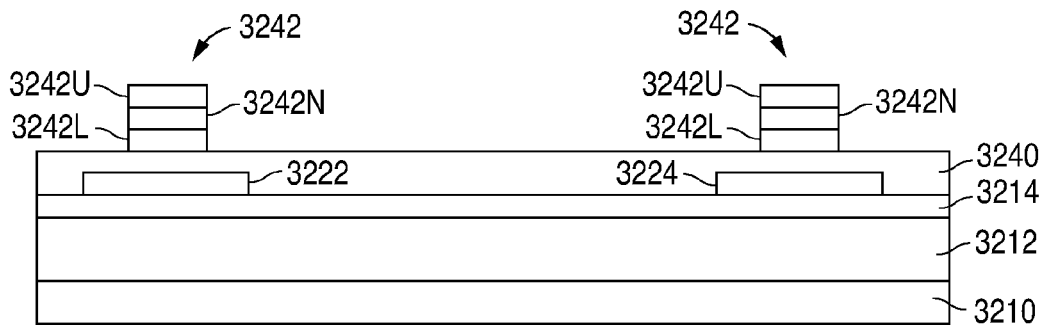
Figure 40C:
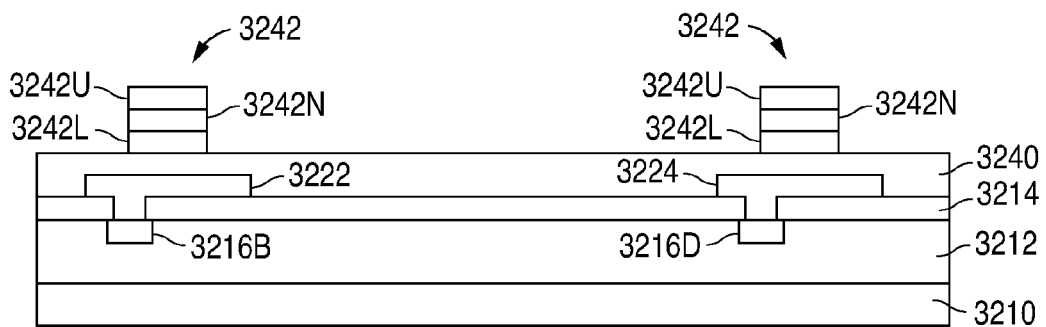
Figure 47A:
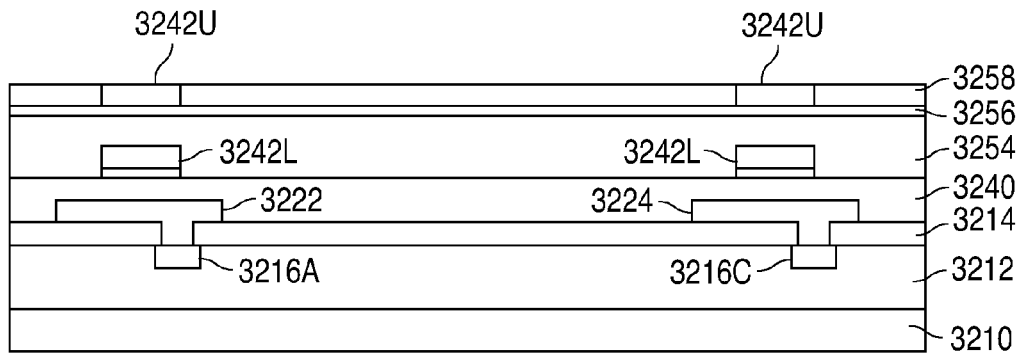
Figure 47B:
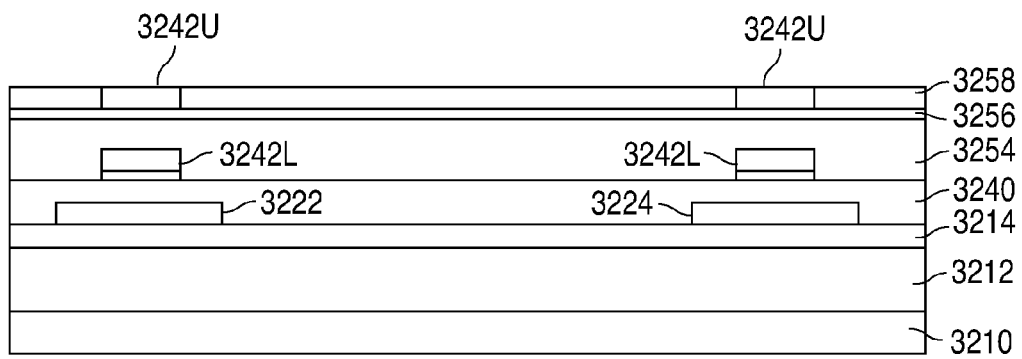
Figure 47C:
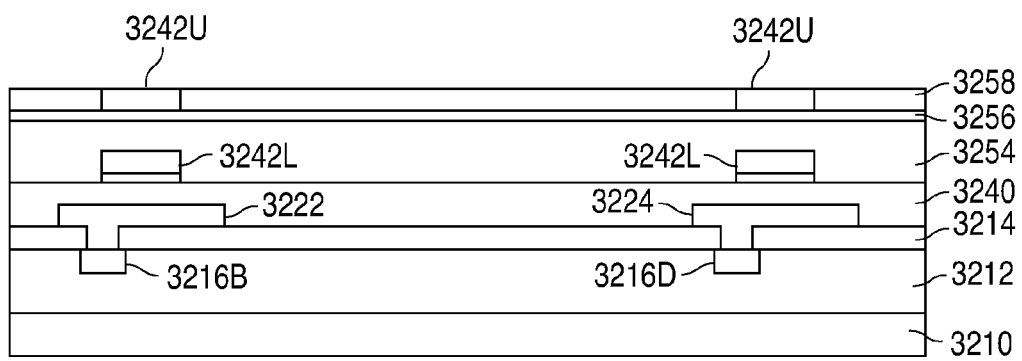
Figure 48A:
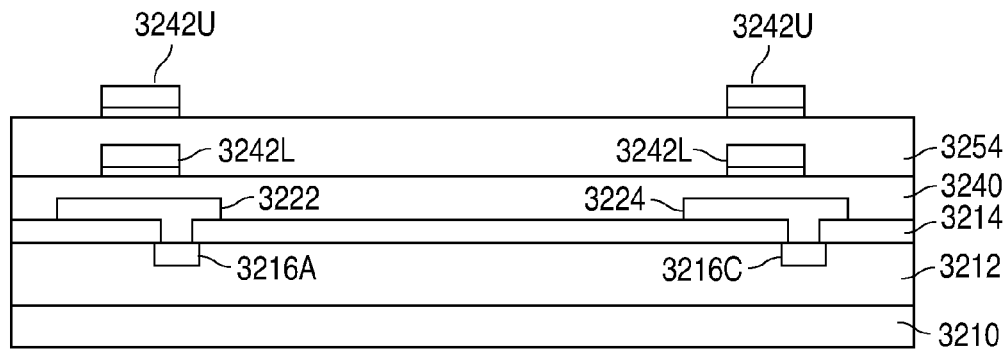
Figure 48B:
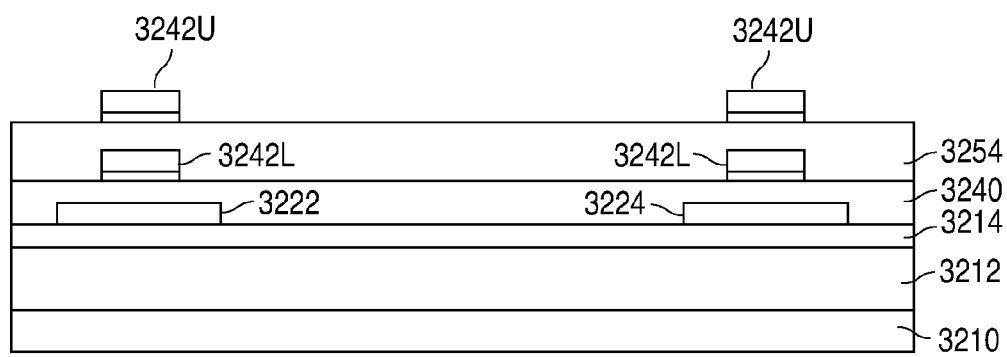
Figure 48C:
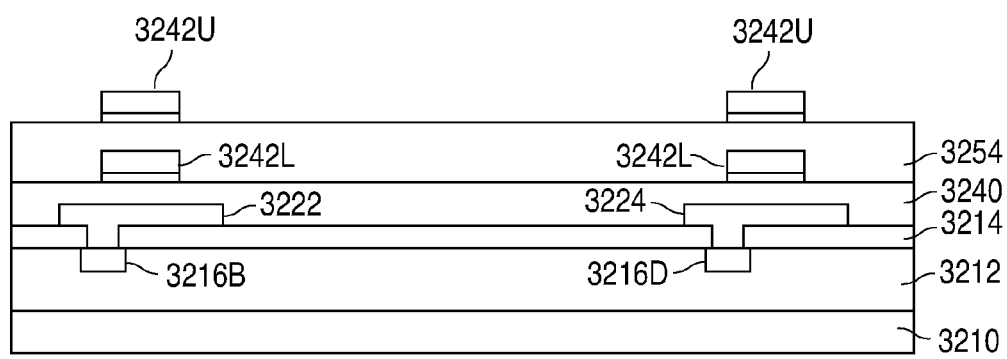
Figure 49:
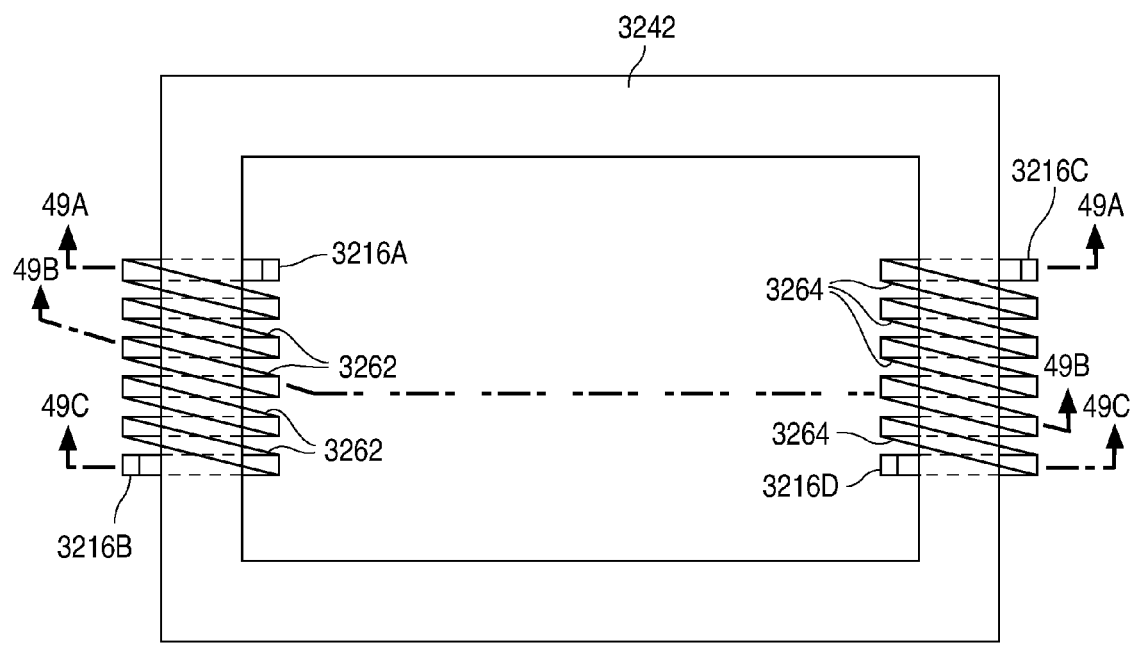

FIG. 39 is a plan view, FIGS. 40A-48A are cross-sectional views taken along line 39A-39A of FIG. 39, FIGS. 40B-48B are cross-sectional views taken along line 39B-39B of FIG. 39, and FIGS. 40C-48C are cross-sectional views taken along line 39C-39C of FIG. 39. FIG. 49 is a plan view, FIGS.

Figure 50A:
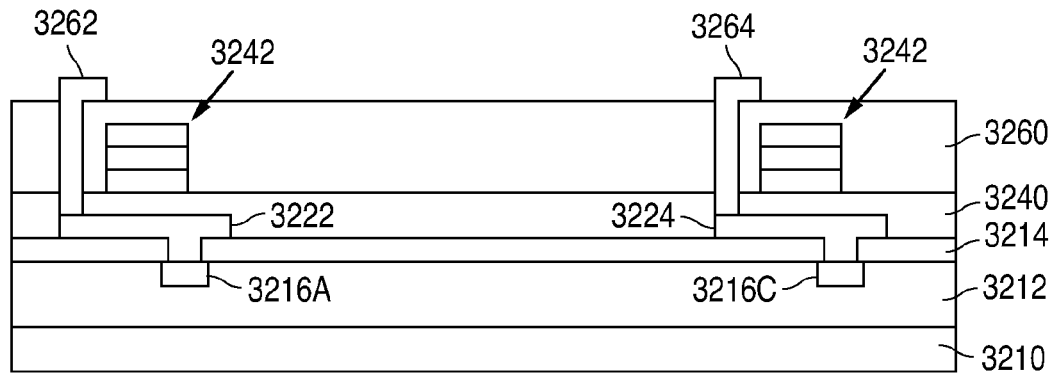
Figure 50B:
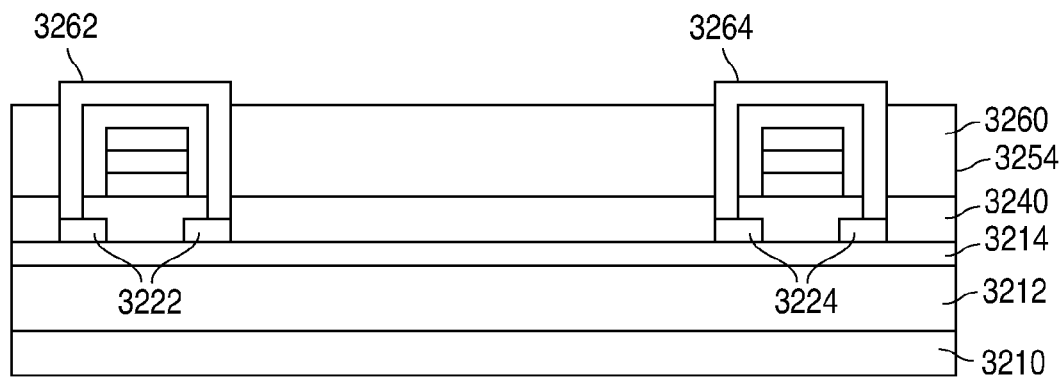
Figure 50C:
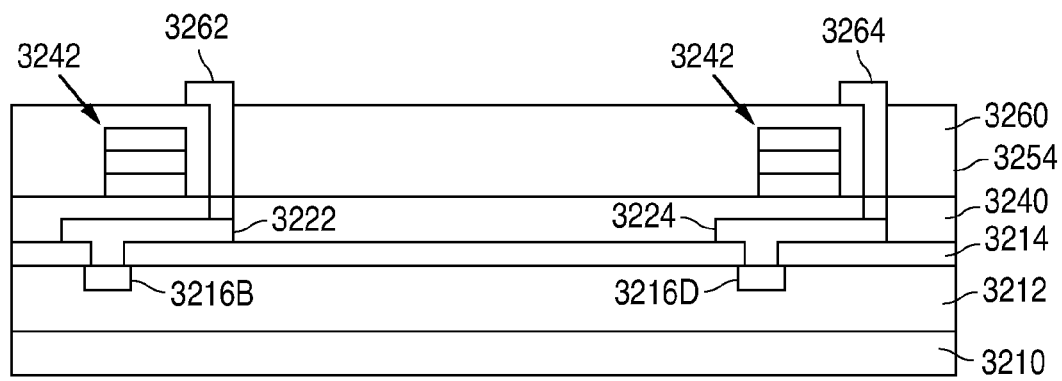

50A-55A are cross-sectional views taken along line 49A-49A of FIG. 49, FIGS. 50B-50B are cross-sectional views taken along line 49B-49B of FIG. 49, and FIGS. 50C-55C are cross-sectional views taken along line 49C-49C of FIG. 49.

As shown in FIGS. 32 and 33A-33C, the method utilizes a conventionally formed single-crystal silicon semiconductor wafer 3210 that has a conventionally formed metal interconnect structure 3212 that touches the top surface of wafer 3210. The semiconductor wafer 3210 includes a large number of electrical devices, such as transistors, resistors, capacitors, and diodes.

The metal interconnect structure 3212, which electrically connects the electrical devices together to form a circuit, includes a number of levels of metal traces, a large number of contacts that connect the bottom metal trace to electrically conductive regions on wafer 3210, and a large number of inter-metal vias that connect the metal traces in adjacent layers together.

In addition, the metal interconnect structure 3212 includes a top passivation layer 3214 with openings that expose a number of conductive pads 3216. The pads 3216, in turn, are selected regions of the metal traces in the top metal layer that provide points for external electrical connections, and points for electrical connections to overlying devices.

As shown in FIGS. 32 and 33A-33C, the pads 3216 include the pads 3216A-3216B, which provide electrical connections for a to-be-formed primary coil, and pads 3216C and 3216D, which provide electrical connections for a to-be-formed secondary coil. (Only the pads 3216A-3216D, and not the entire metal interconnect structure, are shown in cross-section for clarity.)

As further shown in FIGS. 32 and 33A-33C, the method begins by forming a number of spaced-apart lower primary coil members 3222 where one of the lower primary coil members 3222 touches the pad 3216A and one of the lower primary coil members 3222 touches the pad 3216B, and a number of spaced-apart lower secondary coil members 3224 where one of the lower secondary coil members 3224 touches the pad 3216C and one of the lower secondary coil members 3224 touches the pad 3216D. The spaced-apart lower primary coil members 3222 and the spaced-apart lower secondary coil members 3224 can be formed in a number of different ways.

Figure 34A:
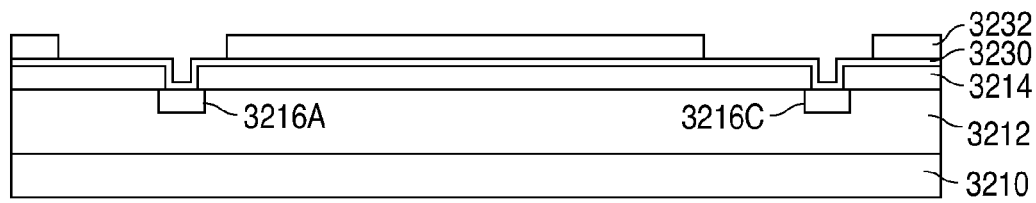
Figure 34B:
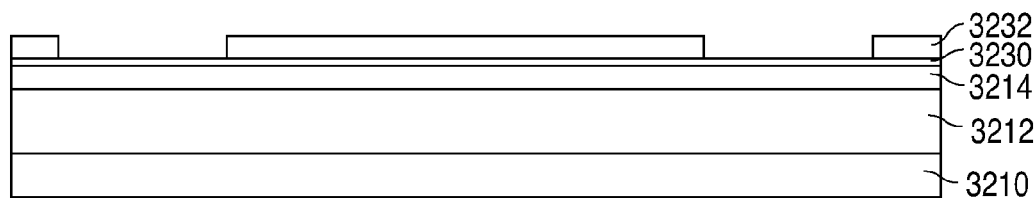
Figure 34C:
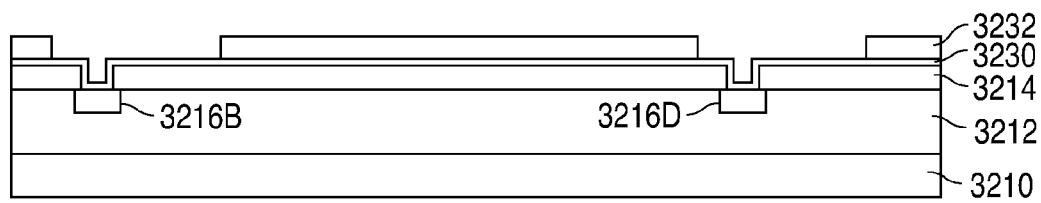

As shown in FIGS. 34A-34C, in a first embodiment, a seed layer 3230 can be formed on the passivation layer 3214 and the exposed pads 3216A-3216D. For example, the seed layer 3230 can be formed by depositing 300 Å of titanium, 3000 Å of copper, and 300 Å of titanium. (The seed layer 3230 can also include a barrier layer to prevent copper electromigration if needed.) Once the seed layer 3230 has been formed, a plating mold 3232 is formed on the top surface of the seed layer 3230.

Figure 35A:
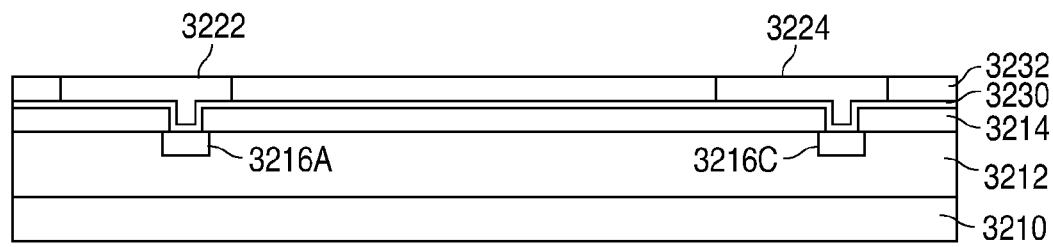
Figure 35B:
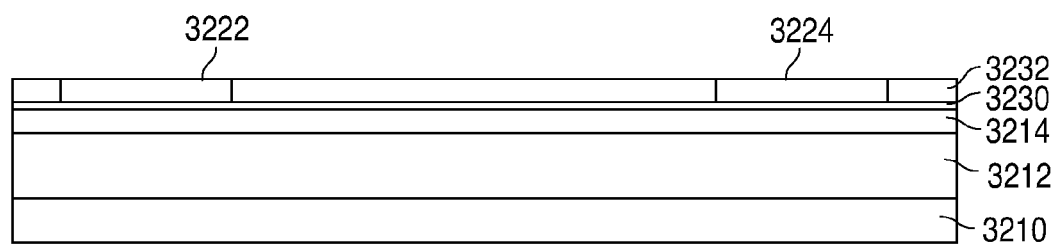
Figure 35C:
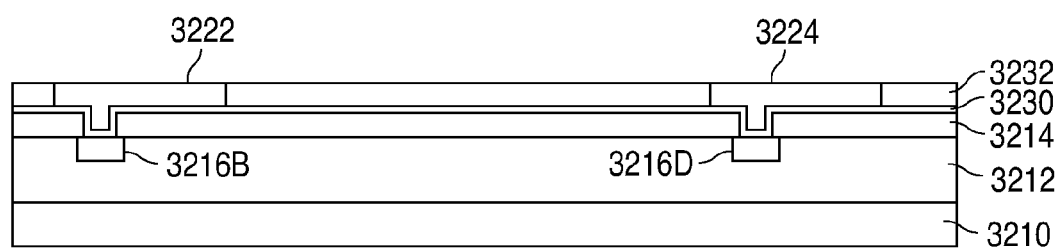
Figure 36A:
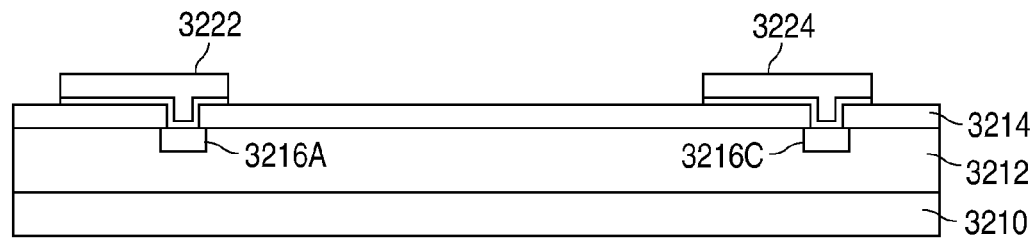
Figure 36B:
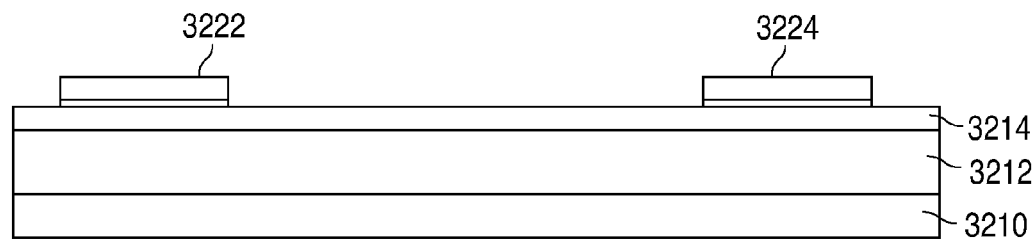
Figure 36C:
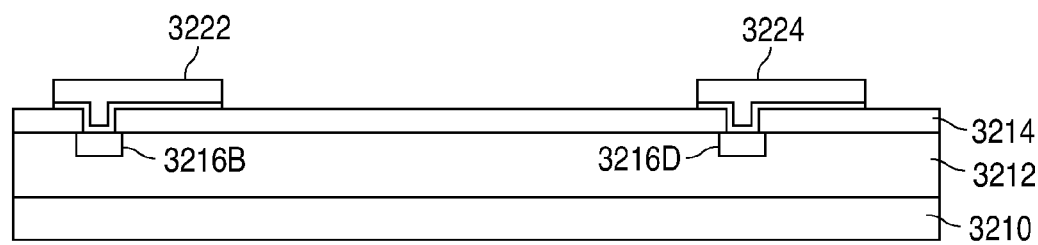

As shown in FIGS. 35A-35C, following the formation of the plating mold 3232, the top titanium layer is stripped and copper is deposited by electroplating to form the lower primary coil members 3222 and the lower secondary coil members 3224. As shown in FIGS. 36A-36C, after the electroplating, the plating mold 3232 and the underlying regions of the seed layer 3230 are removed to expose the lower primary coil members 3222 and the lower secondary coil members 3224.

Figure 37A:
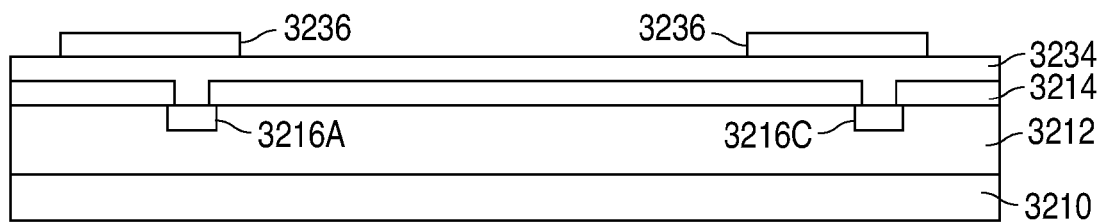
Figure 37B:
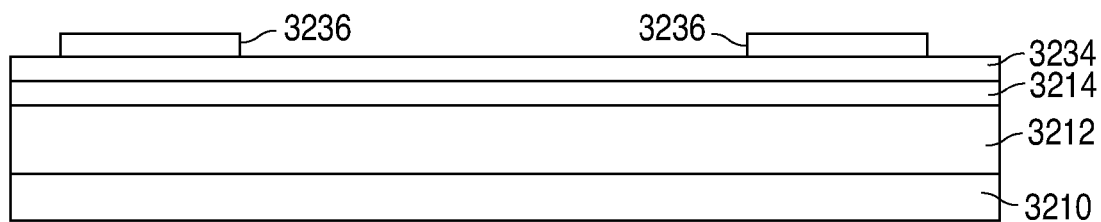
Figure 37C:
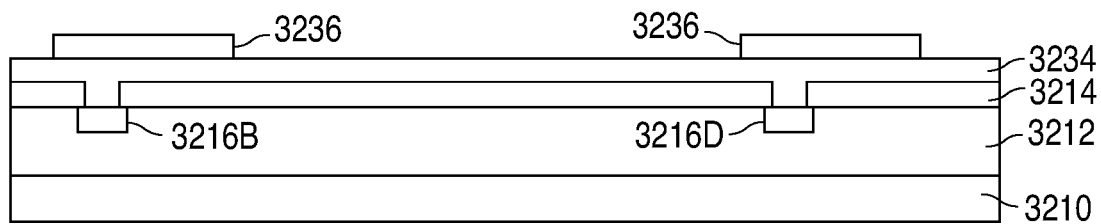

Alternately, as shown in FIGS. 37A-37C, in a second embodiment, the lower primary coil members 3222 and the lower secondary coil members 3224 can be formed by depositing a metal layer 3234 that touches the top surface of the passivation layer 3214 and the pads 3216A-3216D.

The metal layer 3234 can include, for example, a layer of titanium (e.g., 100 Å thick), a layer of titanium nitride (e.g., 200 Å thick), a layer of aluminum copper (e.g., 1.2 μm thick), a layer of titanium (e.g., 44 Å thick), and a layer of titanium nitride (e.g., 250 Å thick). Once the metal layer 3234 has been formed, a mask 3236 is formed and patterned on the top surface of the metal layer 3234.

Figure 38A:
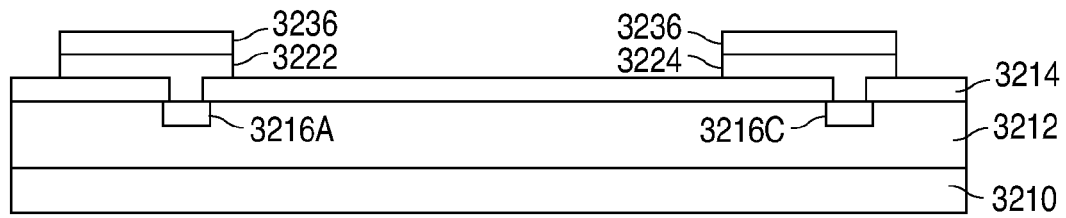
Figure 38B:
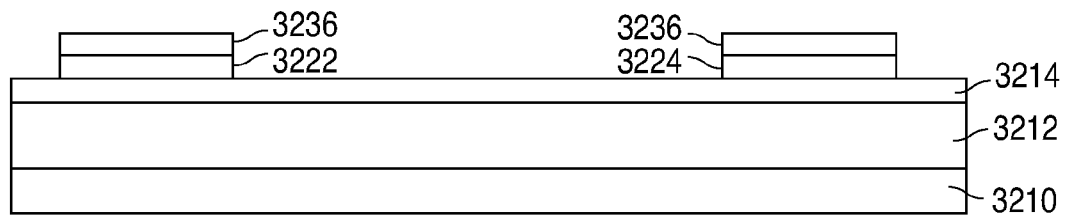
Figure 38C:
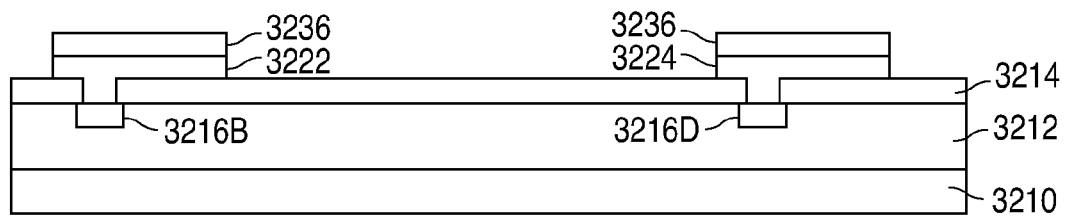

As shown in FIGS. 38A-38C, following the formation and patterning of the mask 3236, the metal layer 3234 is etched to remove the exposed regions of the metal layer 3234 and form the lower primary coil members 3222 and the lower secondary coil members 3224. The mask 3236 is then removed.

As shown in FIGS. 39 and 40A-40C, after the lower primary coil members 3222 and the lower secondary coil members 3224 have been formed, a lower non-conducting layer 3240, such as an oxide layer, is formed on the passivation layer 3214, the lower primary coil members 3222, and the lower secondary coil members 3224. For example, the lower non-conducting layer 3240 can be formed by depositing an oxide, and then chemically-mechanically polishing the oxide to have a target thickness of, for example, 2000 Å, over passivation layer 3214.

After the lower non-conducting layer 3240 has been formed, the method next forms a stacked core 3242 that touches the lower non-conducting layer 3240 and lies over the lower primary coil members 3222 and the lower secondary coil members 3224. The stacked core 3242, which has a lower core 3242L, an upper core 3242U, and an insulator 3242N, can be formed in a number of different ways.

Figure 41A:
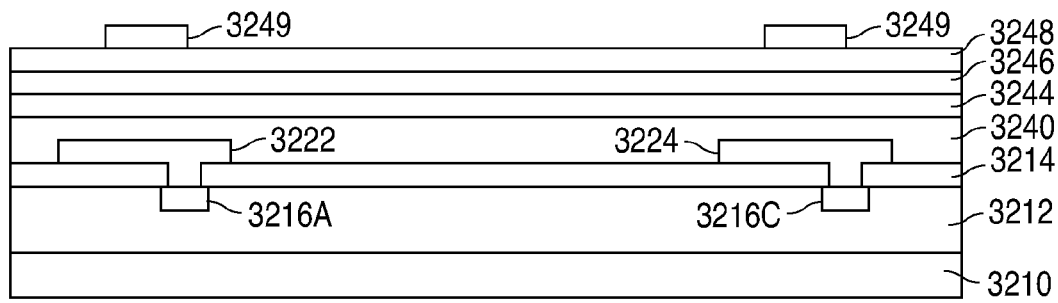
Figure 41B:
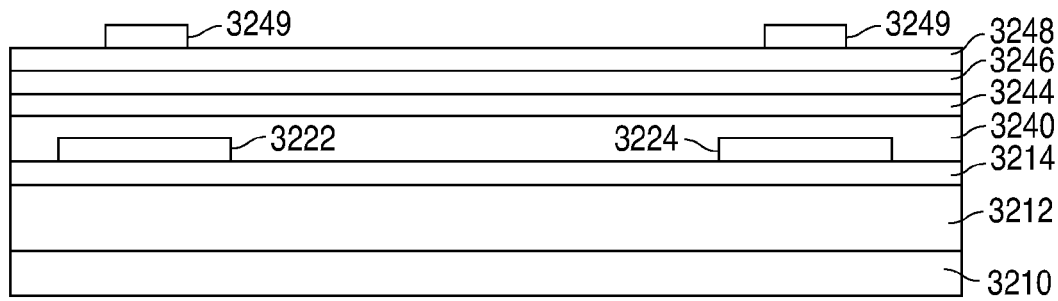
Figure 41C:
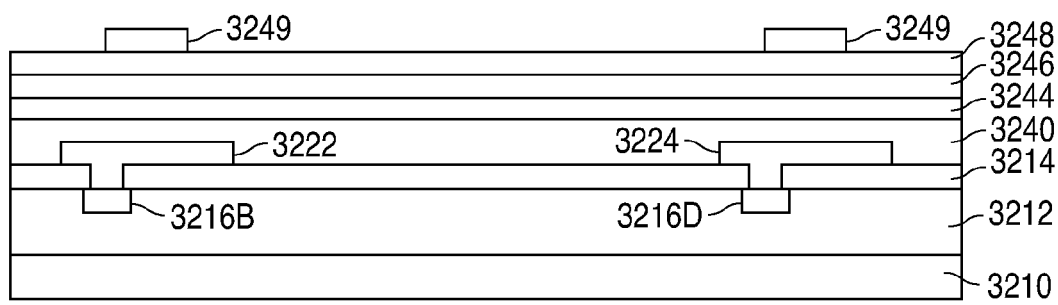

As shown in FIGS. 41A-41C, in a first embodiment, a first magnetic material layer 3244 can be sputter deposited on the top surface of the lower non-conducting layer 3240. The first magnetic material layer 3244 can be implemented with, for example, cobalt tantalum zirconium (CoTaZr) or permalloy.

In accordance with the present invention, the first magnetic material layer 3244 is subjected to the presence of a strong magnetic field that induces the easy axis of the first magnetic material layer 3244 to lie substantially perpendicular to a length LL of a lower primary coil member 3222. The strong magnetic field can be applied during the deposition of the magnetic material layer 3244. Alternately, the strong magnetic field can be applied during an anneal at elevated temperatures after the deposition of the magnetic material layer 3244.

After the first magnetic material layer 3244 has been formed, an insulator layer 3246 is formed on the top surface of the first magnetic material layer 3244, followed by the sputter deposition of a second magnetic material layer 3248. The second magnetic material layer 3248 can be implemented with, for example, cobalt tantalum zirconium (CoTaZr) or permalloy.

In accordance with the present invention, the second magnetic material layer 3248 is subjected to the presence of a strong magnetic field that induces the easy axis of the second magnetic material layer 3248 to lie substantially parallel to the length LL of a lower primary coil member 3222. The strong magnetic field can be applied during the deposition of the magnetic material layer 3248.

Figure 42A:
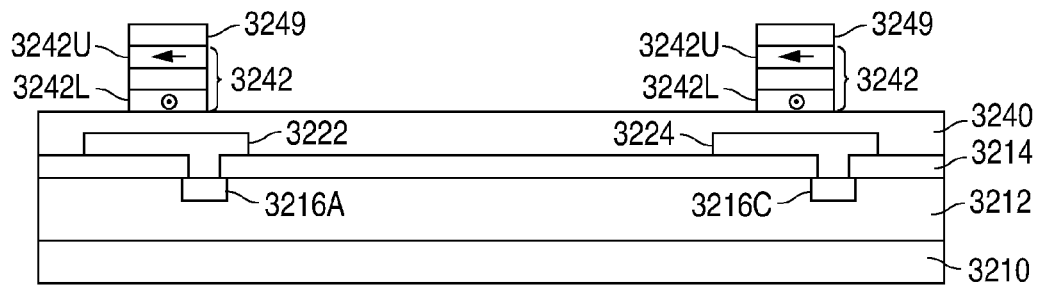
Figure 42B:
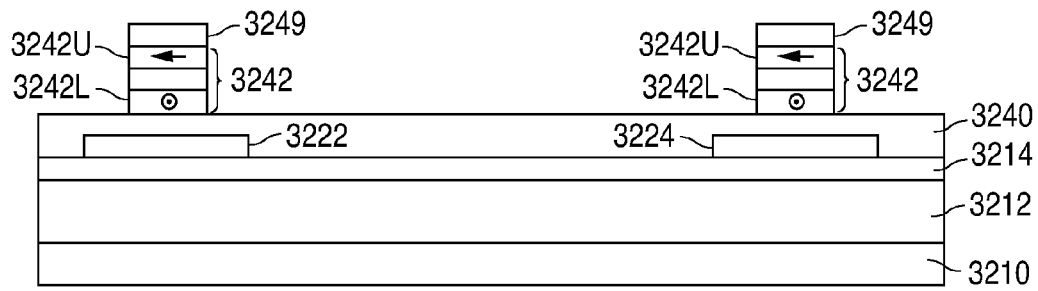
Figure 42C:
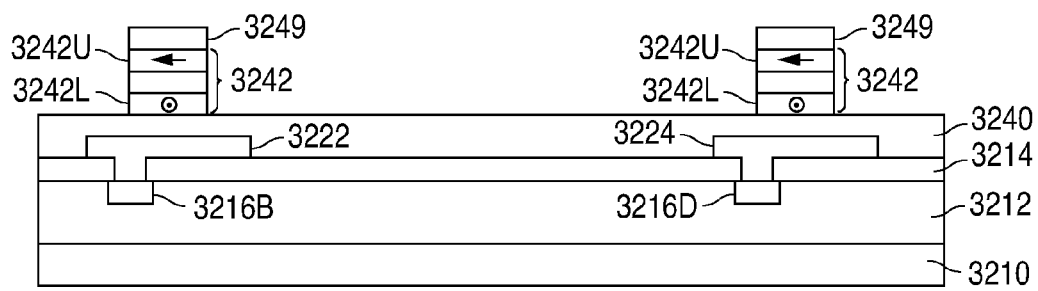

Following this, a mask 3249 is formed and patterned on the second magnetic material layer 3248. Once mask 3249 has been patterned, as shown in FIGS. 42A-42C, the exposed regions of the second magnetic material layer 3248, the insulator layer 3246, and the first magnetic material layer 3244 are etched and removed to form the stacked core 3242, which includes the lower core 3242L and the upper core 3232U. Mask 3249 is then removed. As further shown in FIGS. 42A-42C, the circle with a dot in the lower core 3242L and the arrow in the upper core 3242U illustrate the perpendicular orientations of the easy axis.

Figure 43A:
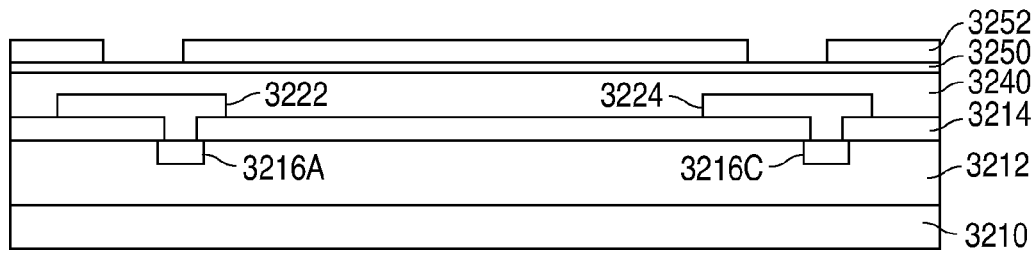
Figure 43B:
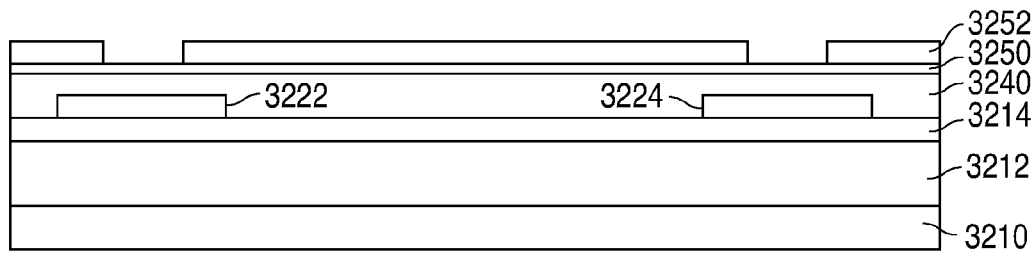
Figure 43C:
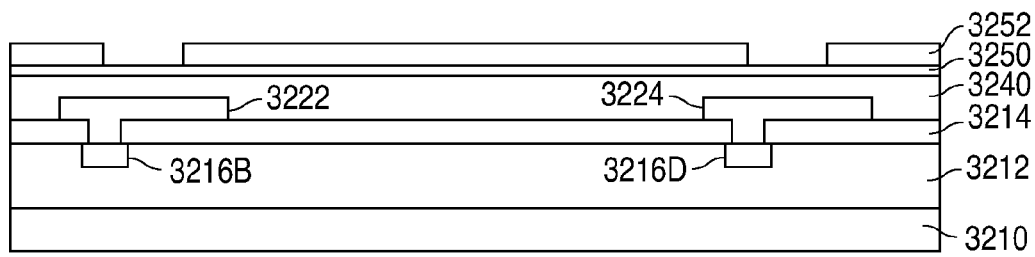

Alternately, as shown in FIGS. 43A-43C, in a second embodiment, the stacked core 3242 can be formed by depositing a seed layer 3250 on the top surface of lower non-conducting layer 3240. For example, the seed layer 3250 can be formed by depositing 300 Å of titanium, 3000 Å of copper, and 300 Å of titanium. (The seed layer 3250 can also include a barrier layer to prevent copper electromigration if needed.) After the seed layer 3250 has been formed, a plating mold 3252 is formed and patterned on the top surface of the seed layer 3250.

Figure 44A:
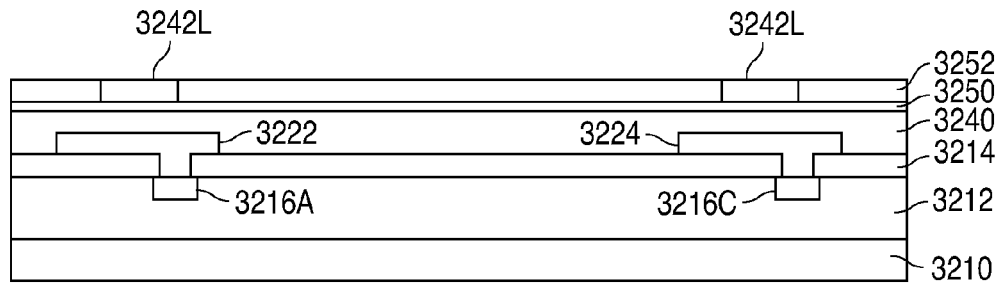
Figure 44B:
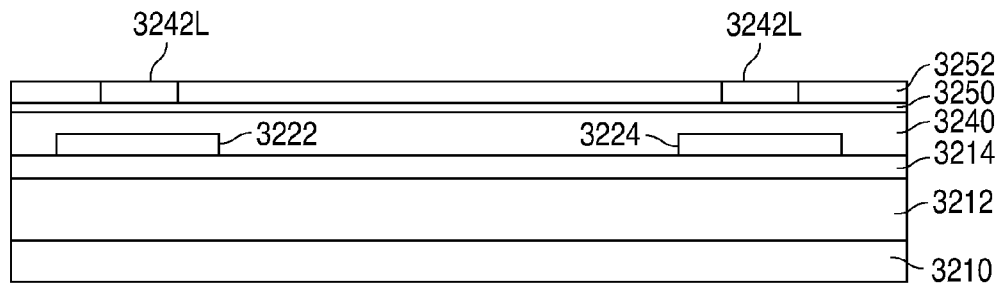
Figure 44C:
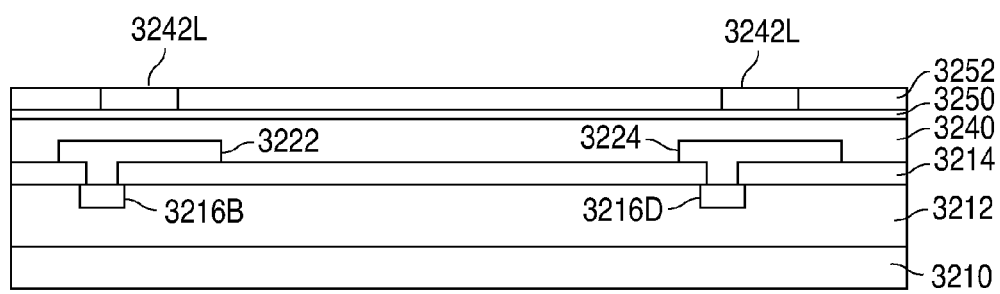
Figure 45A:
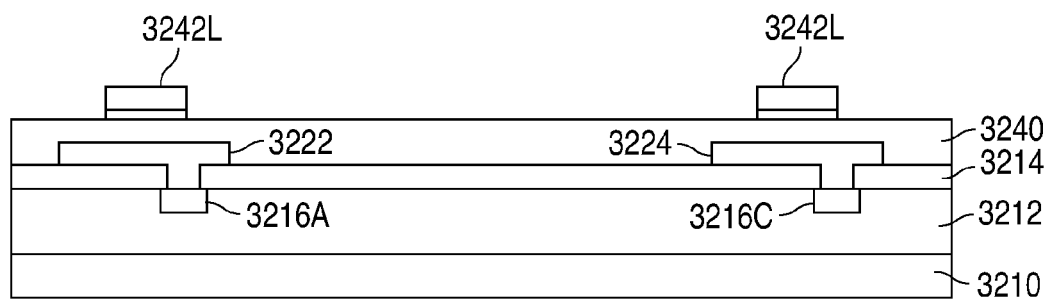
Figure 45B:
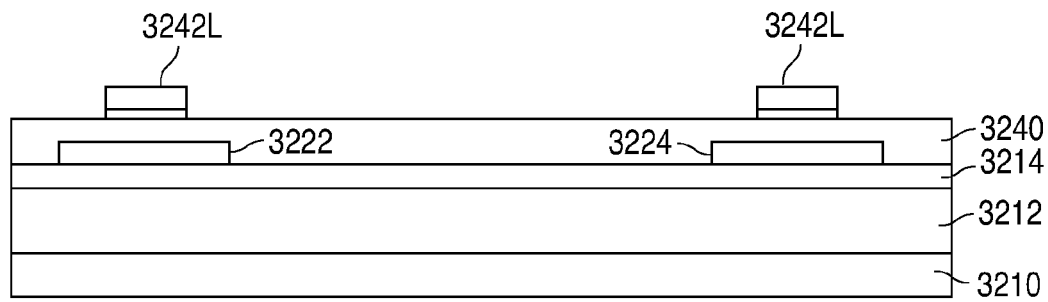
Figure 45C:
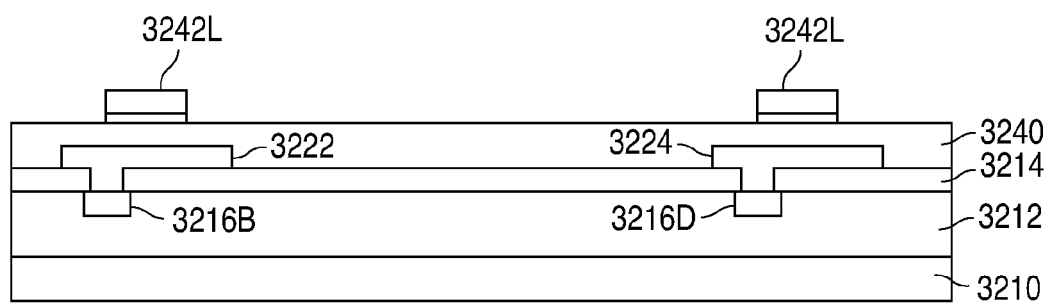

Next, following the formation of plating mold 3252, as illustrated in FIGS. 44A-44C, the top titanium layer is stripped and a magnetic material, such as an alloy of nickel and iron like permalloy, is deposited by electroplating to a thickness of, for example, 10 µm to form the lower core 3242L. As shown in FIGS. 45A-45C, after the electroplating, the plating mold 3252 and the underlying regions of the seed layer 3250 are removed to expose the lower core 3242L.

In accordance with the present invention, the magnetic material is subjected to a strong magnetic field that induces the easy axis of the magnetic material to lie substantially perpendicular to the length LL of a lower primary coil member 3222. The strong magnetic field can be applied during the electroplating of the magnetic material. Alternately, the strong magnetic field can be applied during an anneal at elevated temperatures after the electroplating process.

Figure 46A:
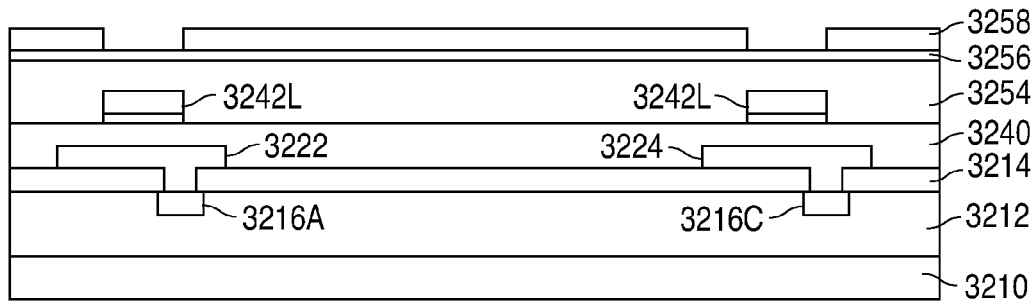
Figure 46B:
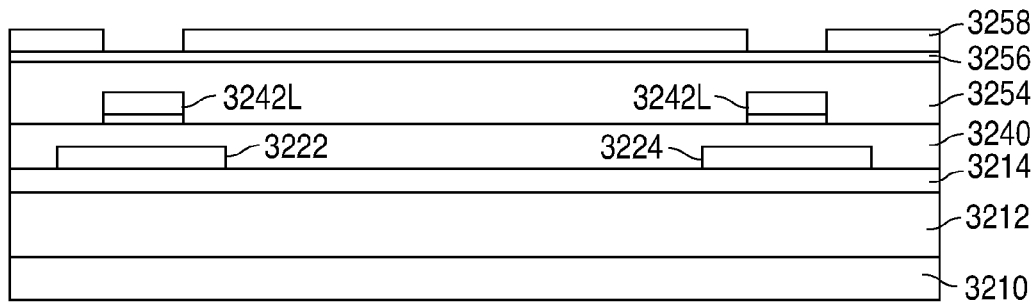
Figure 46C:
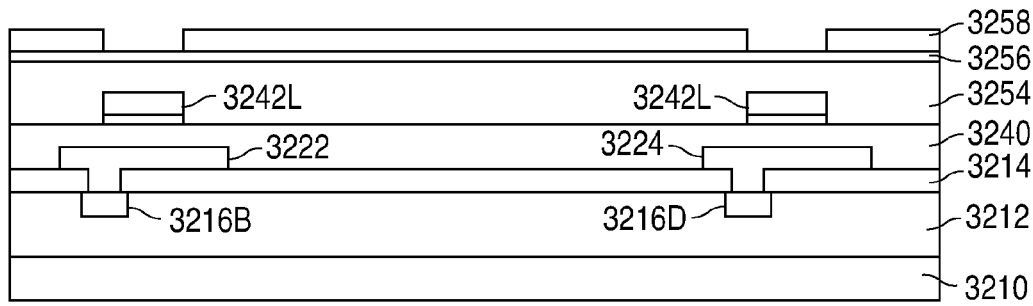

As shown in FIGS. 46A-46C, after the lower core 3242L has been formed, an insulator layer 3254 is formed on the top surface of lower non-conducting layer 3240 and the top surface of the lower core 3242L, and then planarized. Following this, a seed layer 3256 is formed on the top surface of the insulator layer 3254. For example, the seed layer 3256 can be formed by depositing 300 Å of titanium, 3000 Å of copper, and 300 Å of titanium. (The seed layer 3256 can also include a barrier layer to prevent copper electromigration if needed.) After the seed layer 3256 has been formed, a plating mold 3258 is formed and patterned on the top surface of the seed layer 3256.

Next, following the formation of the plating mold 3258, as illustrated in FIGS. 47A-47C, the top titanium layer is stripped and a magnetic material, such as an alloy of nickel and iron like permalloy, is deposited by electroplating to a thickness of, for example, 10 µm to form the upper core 3242U.

In accordance with the present invention, the magnetic material is electroplated in a strong magnetic field that induces the easy axis of the magnetic material to lie substantially parallel to the length LL of a lower primary coil member 3222. As shown in FIGS. 48A-48C, after the electroplating, the plating mold 3258 and the underlying regions of seed layer 3256 are removed to expose the upper core 3242U.

As shown in FIGS. 49 and 50A-50C, after the stacked core 3242 has been formed, the method forms the tops and sides of the primary coil, and the tops and sides of the secondary coil. For example, after the stacked core 3242 has been formed, an upper non-conducting layer 3260, such as an oxide layer, is formed to touch the top surface of the stacked core 3242.

The upper non-conducting layer 3260 is formed on the lower non-conducting layer 3240 if the stacked core 3242 is formed by etching as shown in FIGS. 42A-42C, or on the insulator layer 3254 if the stacked core 3242 is formed by electroplating as shown in FIGS. 48A-48C. For example, the upper non-conducting layer 3260 can be formed by depositing an oxide to a thickness of, for example, 1 µm, and then chemically-mechanically polishing the oxide to have a target thickness of, for example, 2000 Å, over lower non-conducting layer 3240.

As shown in FIGS. 49 and 50A-50C, after the upper non-conducting layer 3260 have been formed, a number of spaced-apart upper primary coil members 3262 are formed to touch the ends of the lower primary coil members 3222 to form the primary coil 526, and a number of spaced-apart upper secondary coil members 3264 are formed to touch the ends of the lower secondary coil members 3224 to form the secondary coil 528.

Figure 51A:
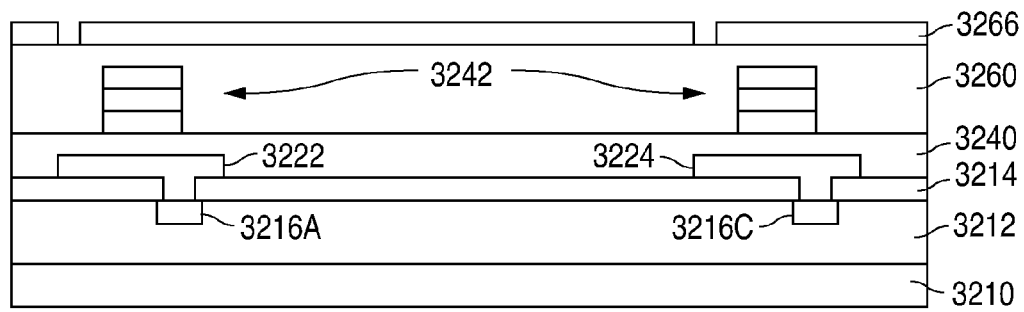
Figure 51B:
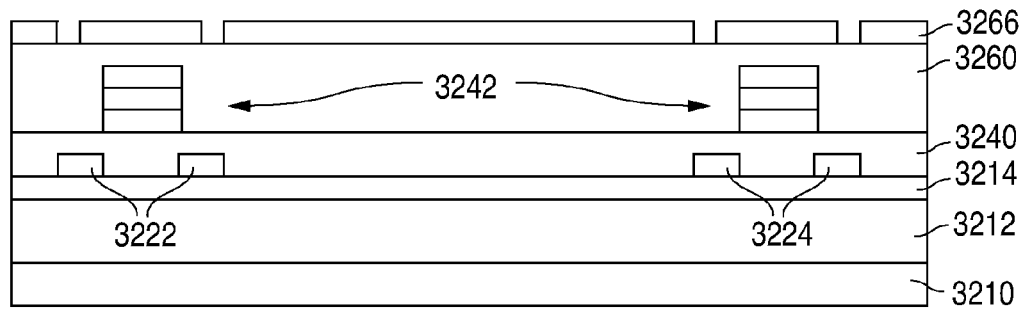
Figure 51C:
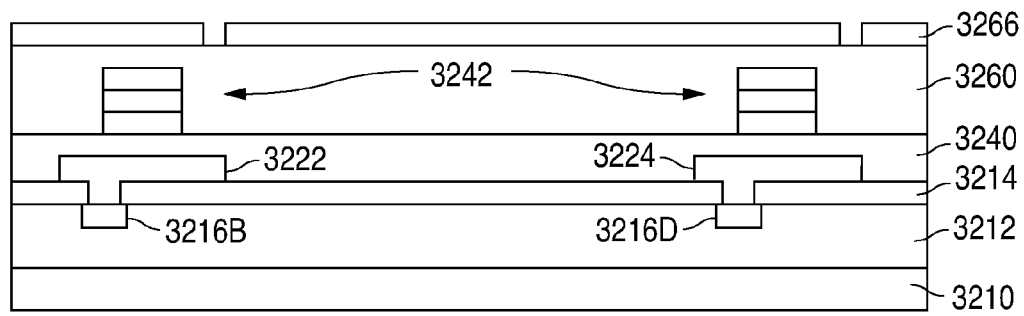

As shown in FIGS. 51A-51C, after the upper non-conducting layer 3260 has been formed, the primary coil members 3262 and the secondary coil members 3264 can be formed by forming and patterning a mask 3266, such as a layer of photoresist, on the top surface of the upper non-conducting layer 3260.

Figure 52A:
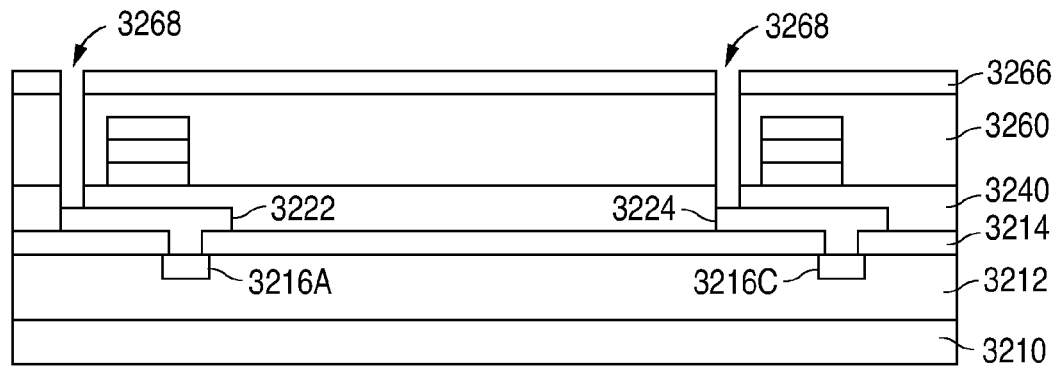
Figure 52B:
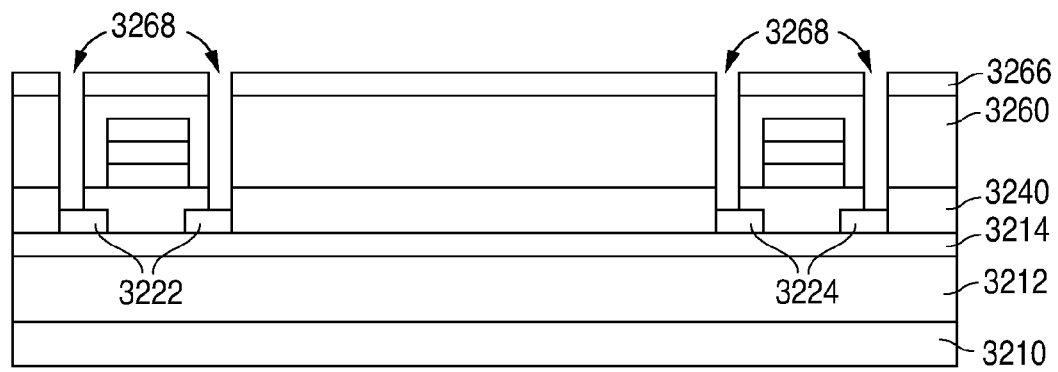
Figure 52C:
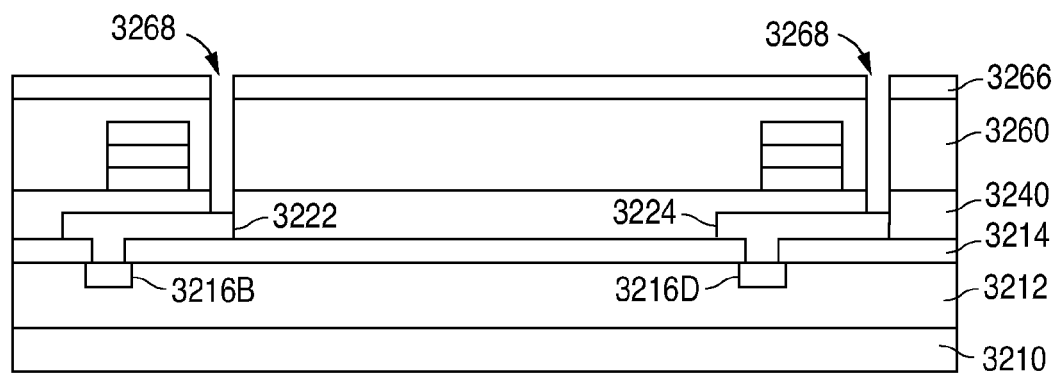

Following the formation and patterning of the mask 3266, as shown in FIGS. 52A-52C, the exposed regions of the upper non-conducting layer 3260 (and the insulator layer 3254 if present) and the underlying non-conducting layer 3240 are next sequentially etched to form a number of vertical openings 3268. Mask 3266 is then removed. The vertical openings 3268 are via-type openings that expose the top surfaces of the ends of the lower primary coil members 3222 and the top surfaces of the ends of the lower secondary coil members 3224.

Figure 53A:
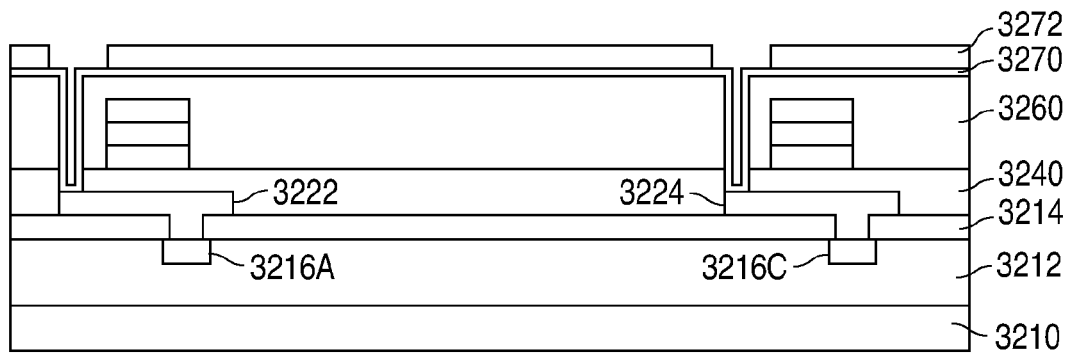
Figure 53B:
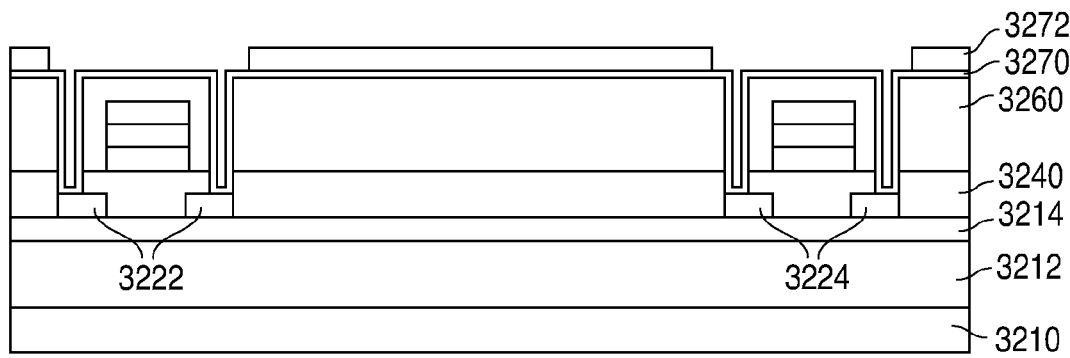
Figure 53C:
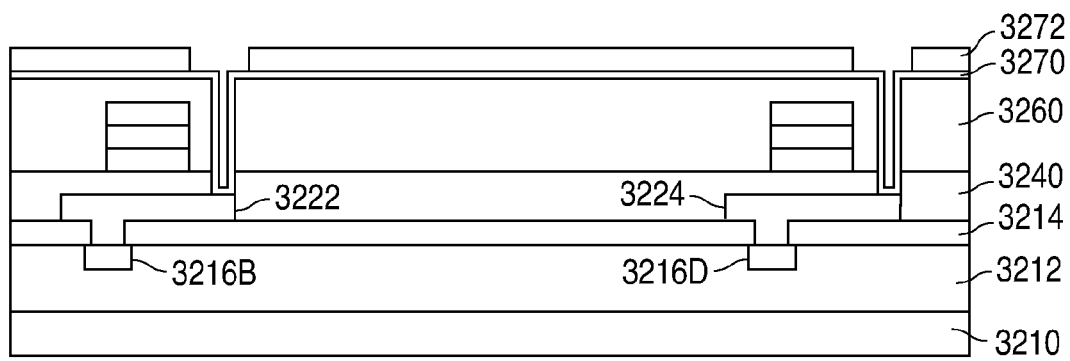

Once mask 3266 has been removed, as shown in FIGS. 53A-53C, a seed layer 3270 is formed on the upper non-conducting layer 3260, the exposed ends of the lower primary coil members 3222, and the exposed ends of the lower secondary coil members 3224. For example, the seed layer 3270 can be formed by depositing 300 Å of titanium, 3000 Å of copper, and 300 Å of titanium. (The seed layer 3270 can also include a barrier layer to prevent copper electromigration if needed.) After the seed layer 3270 has been formed, a plating mold 3272 is formed and patterned on the top surface of the seed layer 3270.

Figure 54A:
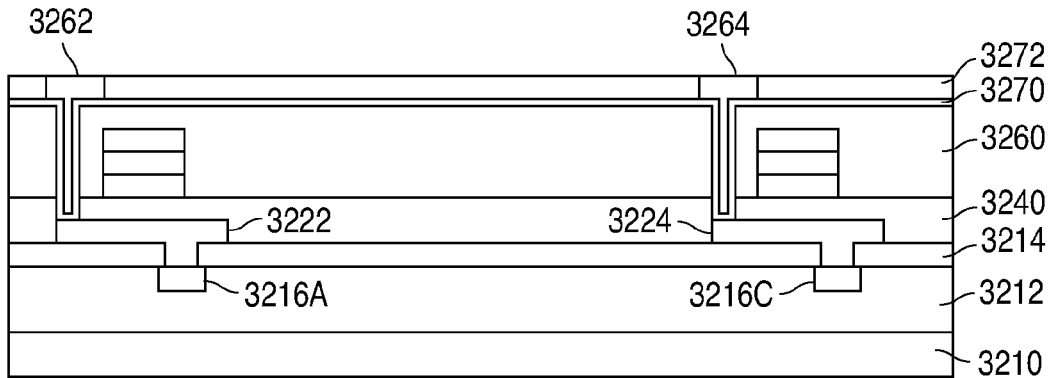
Figure 54B:
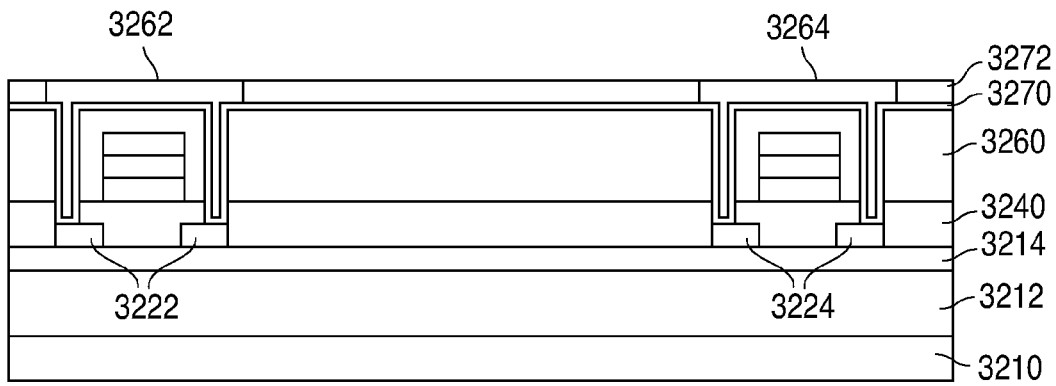
Figure 54C:
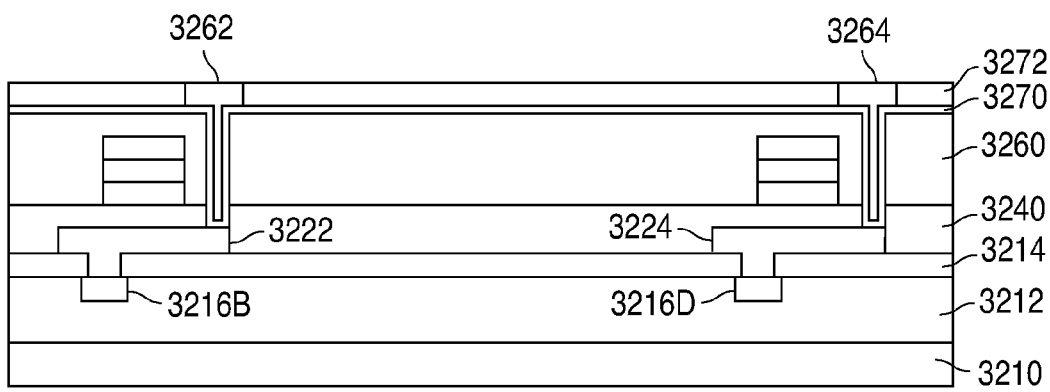
Figure 55A:
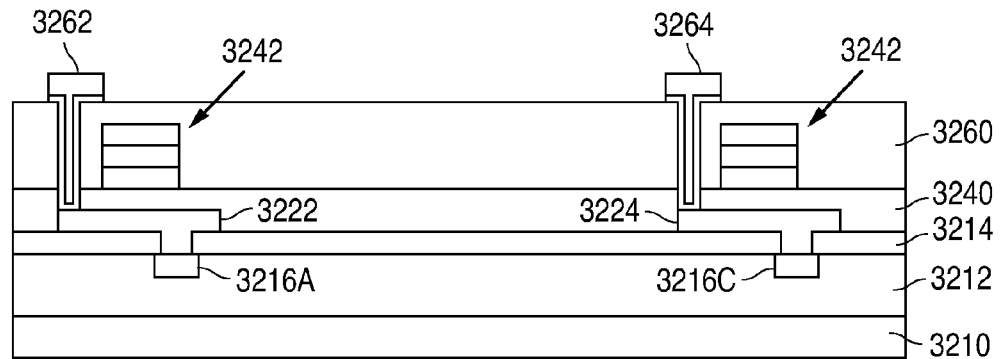
Figure 55B:
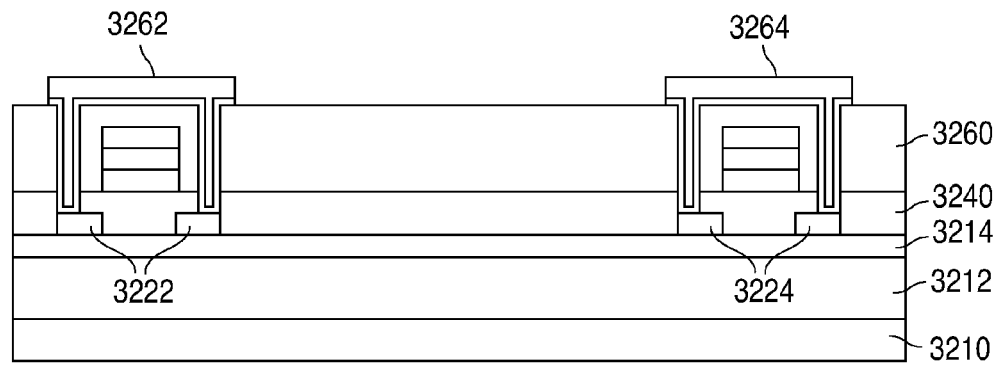
Figure 55C:
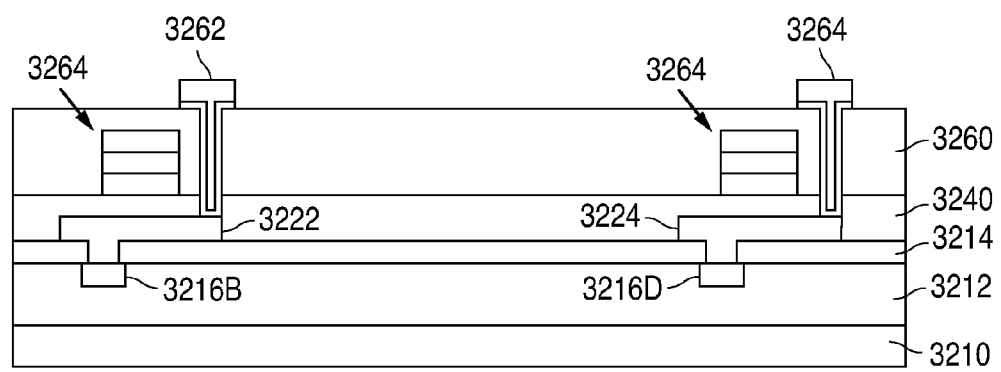

Next, as shown in FIGS. 54A-54C, following the formation and patterning of the plating mold 3272, the top titanium layer is stripped and copper is deposited by electroplating to form the upper primary coil members 3262 and the upper secondary coil members 3264. The upper primary coil members 3262 touch the ends of the lower primary coil members 3222 to form the primary coil 526. The upper secondary coil members 3264 touch the ends of the lower secondary coil members 3224 to form the secondary coil 528. Following this, as shown in FIGS. 55A-55C, the plating mold 3272 and the underlying regions of seed layer 3270 are removed to complete the formation of the transformer 500.

Figure 56:
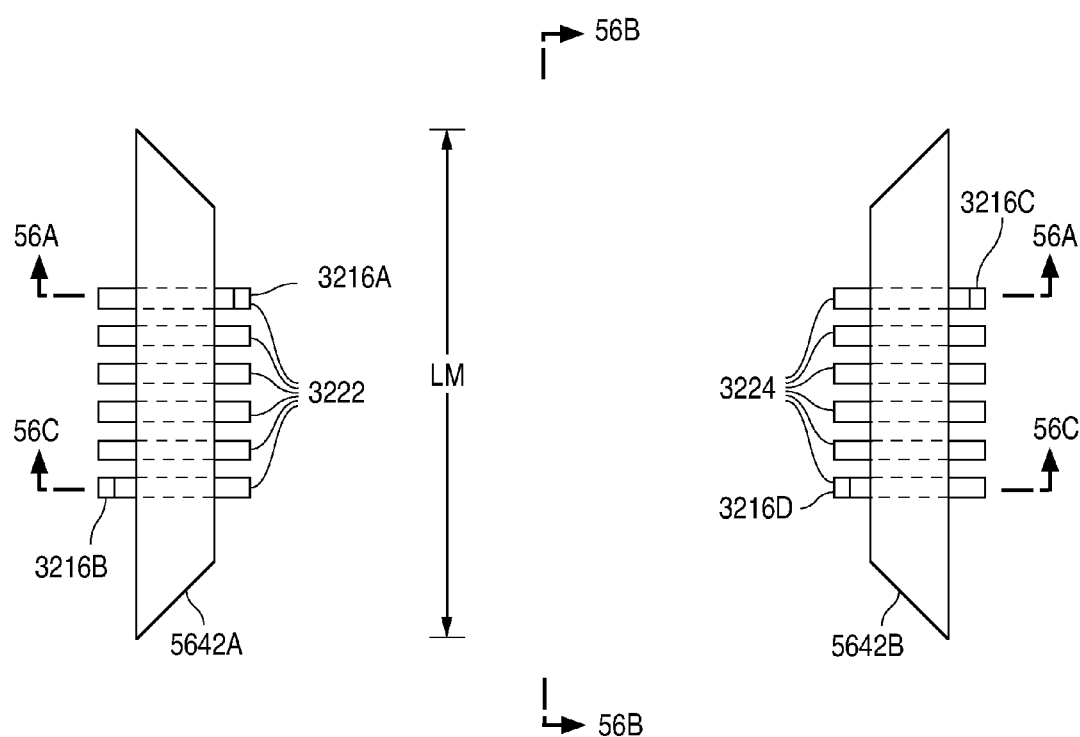
FIG. 56, FIGS. 57A-57C through 62A-62C, FIG. 63, FIGS. 64A-64C through 69A-69C, FIG. 70, FIGS. 71A-71C through 76A-76C are a series of views illustrating an example of a method of forming transformer 800 in accordance with the present invention.
Figure 57A:
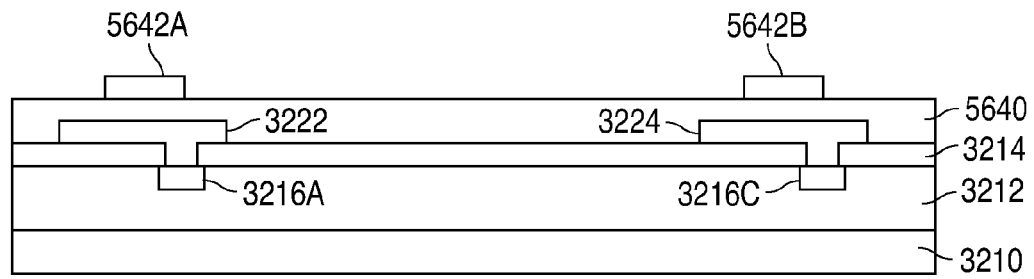
Figure 57B:
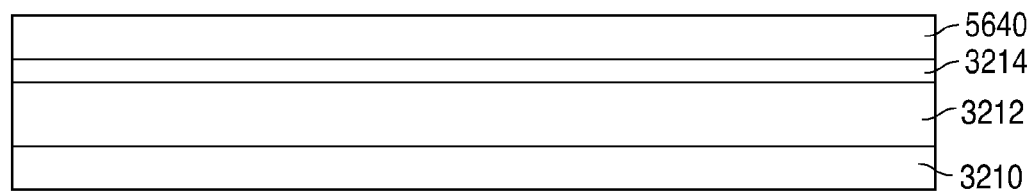
Figure 57C:
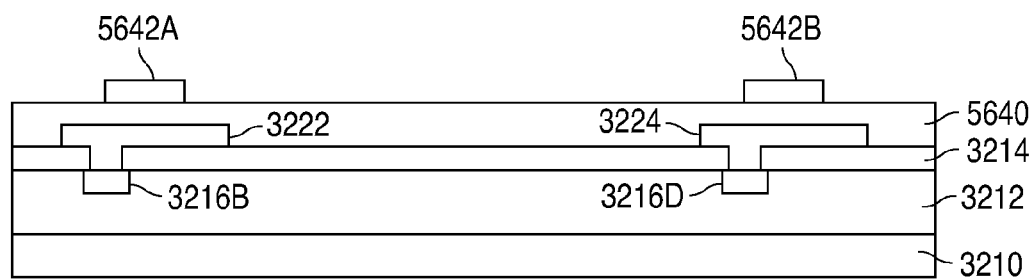

FIG. 56, FIGS. 57A-57C through 62A-62C, FIG. 63, FIGS. 64A-64C through 69A-69C, FIG. 70, FIGS. 71A-71C through 76A-76C show a series of views that illustrate an example of a method of forming transformer 800 in accordance with the present invention. FIG. 56 is a plan view, FIGS. 57A-62A are cross-sectional views taken along line 56A-56A of FIG. 56, FIGS. 57B-62B are cross-sectional views taken along line 56B-56B of FIG. 56, and FIGS. 57C-62C are cross-sectional views taken along line 56C-56C of FIG. 56.

Figure 63:
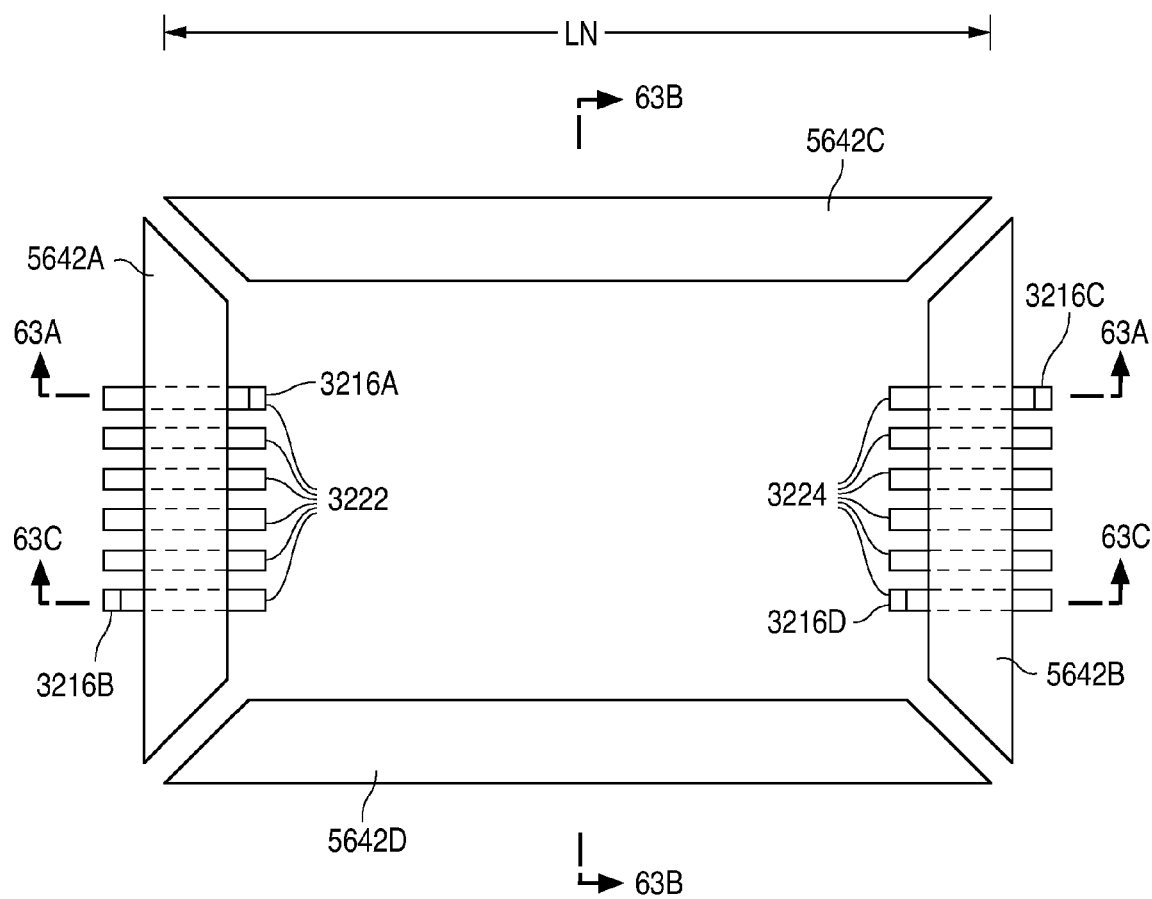
Figure 64A:
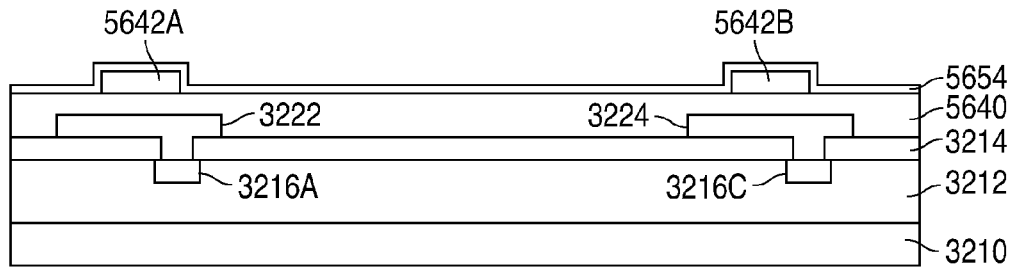
Figure 64B:
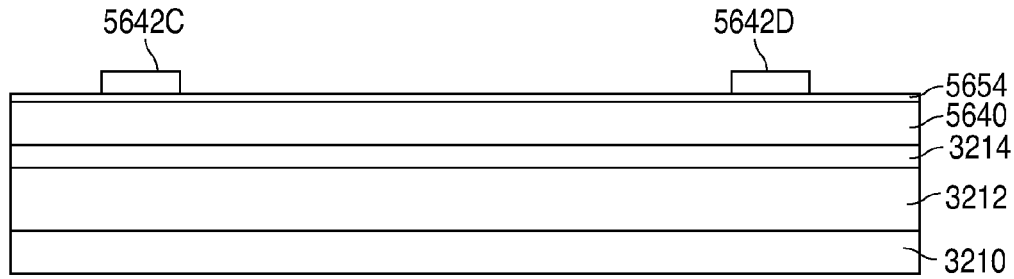
Figure 64C:
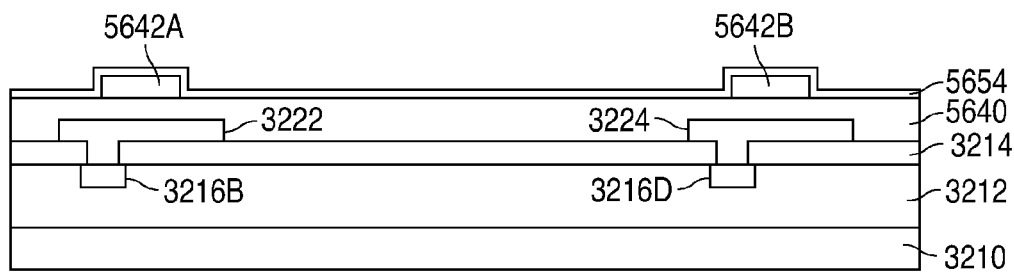
Figure 68A:
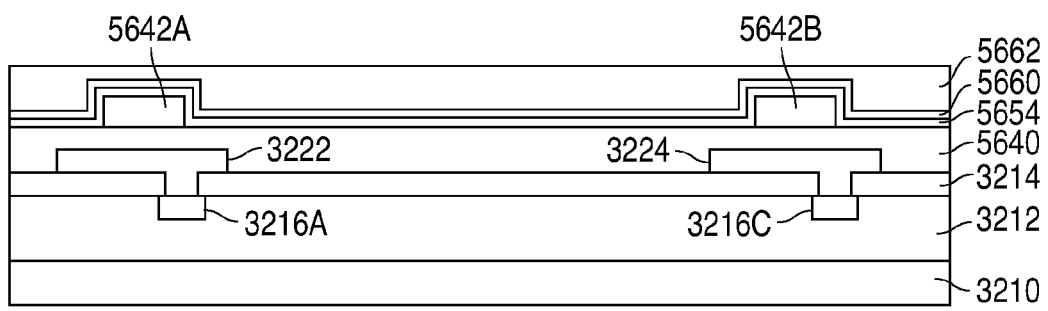
Figure 68B:
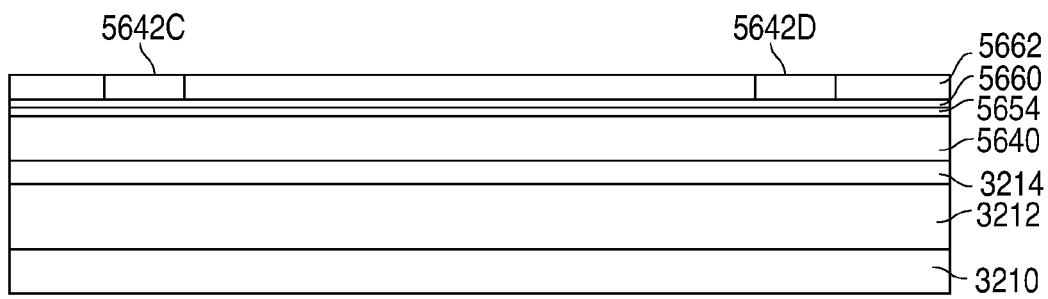
Figure 68C:
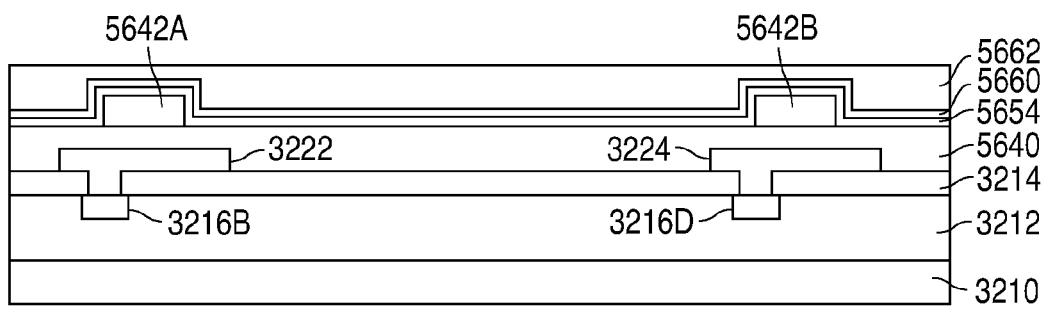
Figure 69A:
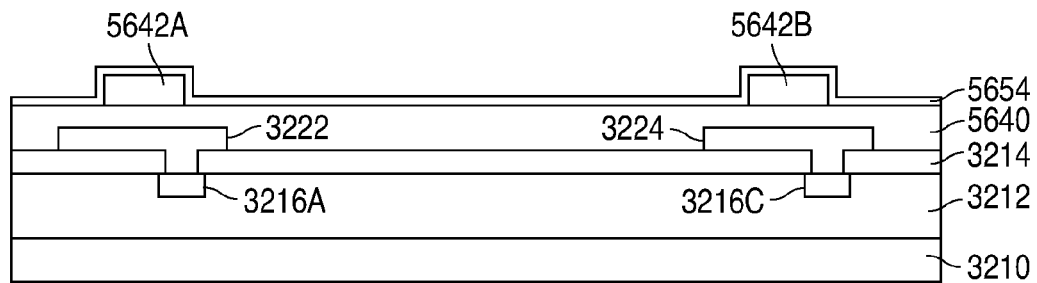
Figure 69B:
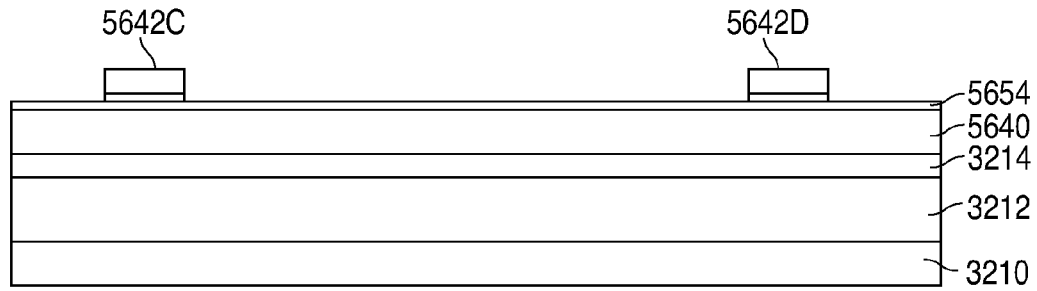
Figure 69C:
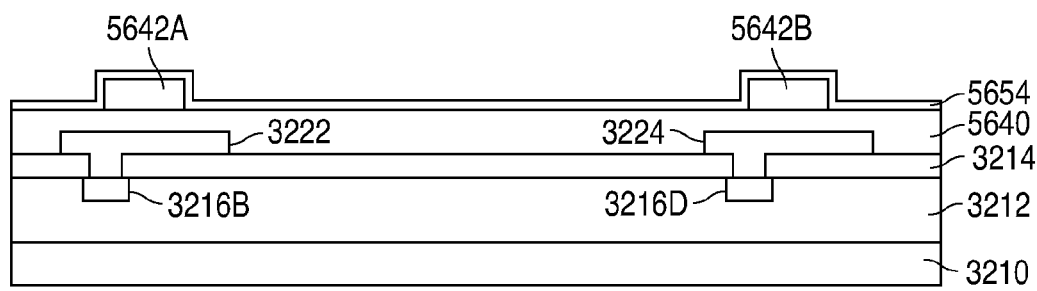
Figure 70:
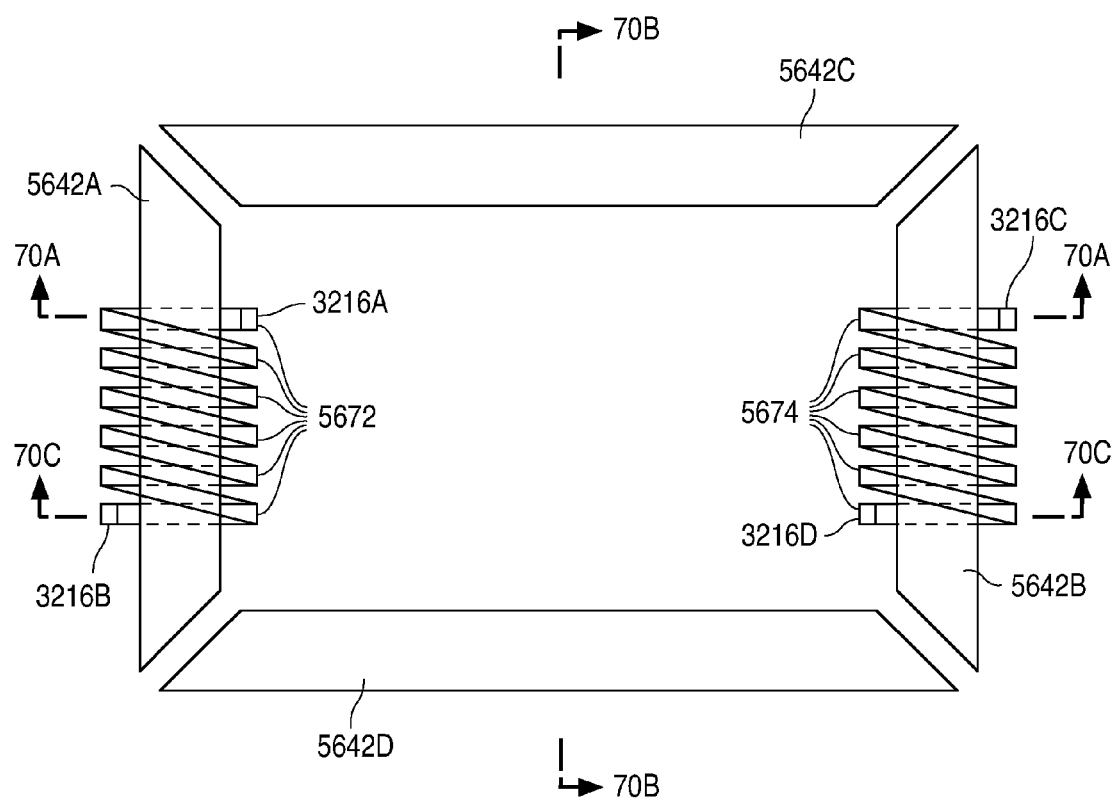
Figure 71A:
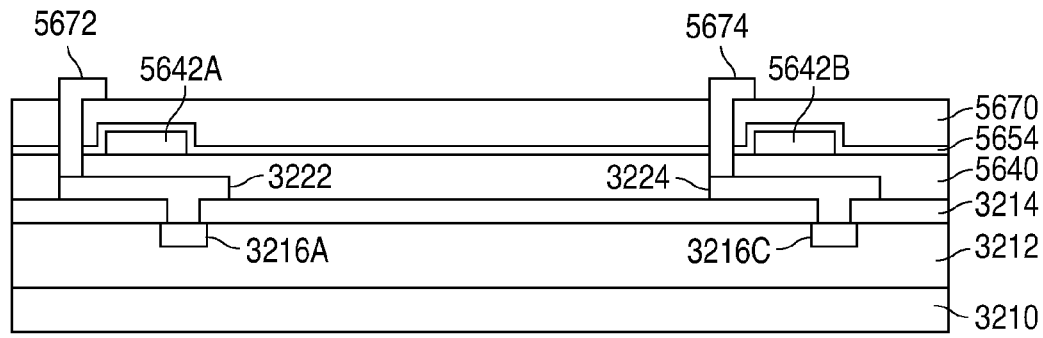
Figure 71B:
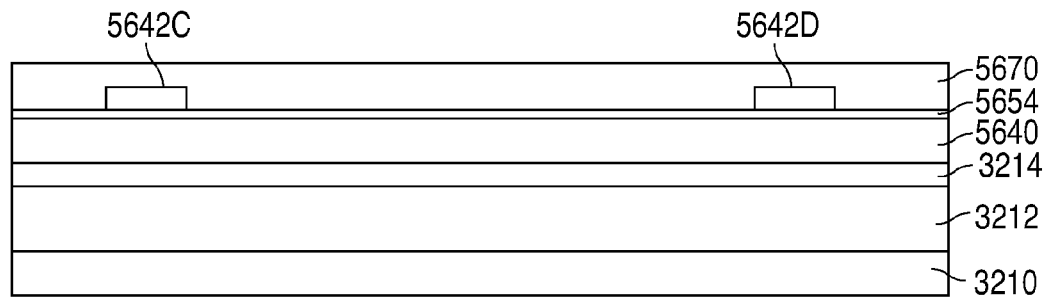
Figure 71C:
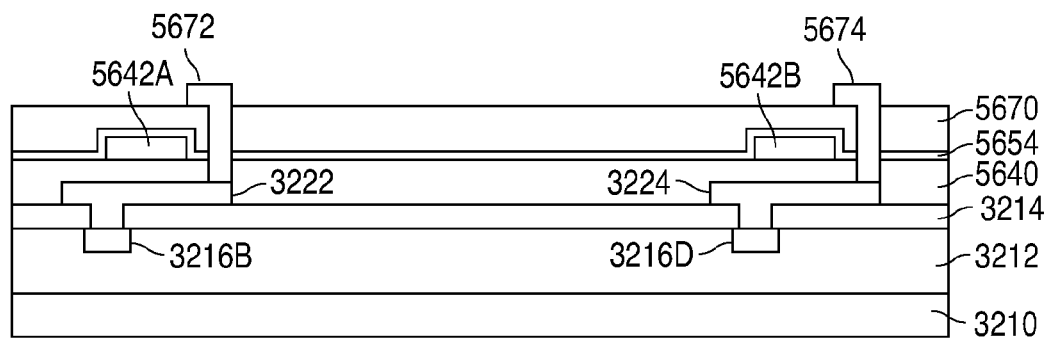

FIG. 63 is a plan view, FIGS. 64A-69A are cross-sectional views taken along line 63A-63A of FIG. 63, FIGS. 64B-69B are cross-sectional views taken along line 63B-63B of FIG. 63, and FIGS. 64C-69C are cross-sectional views taken along line 63C-63C of FIG. 63. FIG. 70 is a plan view, FIGS. 71A-76A are cross-sectional views taken along line 70A-70A of FIG. 70, FIGS. 71B-76B are cross-sectional views taken along line 70B-70B of FIG. 70, and FIGS. 71C-76C are cross-sectional views taken along line 70C-70C of FIG. 70.

The method of forming the transformer 800 is the same as the method of forming the transformer 500 up through the formation of the lower primary coil members 3222 and the secondary coil members 3224 as illustrated in FIGS. 32 and 33A-33C through 38A-38C and, as a result, utilizes the same reference numerals to designate the structures which are common to both methods.

As shown in FIGS. 56 and 57A-57C, after the lower primary coil members 3222 and the lower secondary coil members 3224 have been formed, a lower non-conducting layer 5640, such as an oxide layer, is formed on the passivation layer 3214, the lower primary coil members 3222, and the lower secondary coil members 3224. For example, the lower non-conducting layer 5640 can be formed by depositing an oxide, and then chemically-mechanically polishing the oxide to have a target thickness of, for example, 2000 Å, over the passivation layer 3214.

After the lower non-conducting layer 5640 has been formed, the method next forms a first pair of spaced-apart core members 5642A and 5642B on the lower non-conducting layer 5640. The core member 5642A is formed over the lower primary coil members 3222, while the core member 5642B is formed over the lower secondary coil members 3224. The core members 5642A and 5642B can be formed in a number of different ways.

Figure 58A:
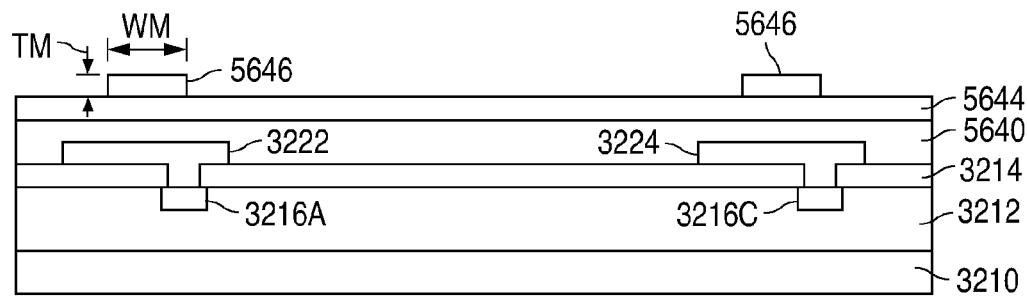
Figure 58B:
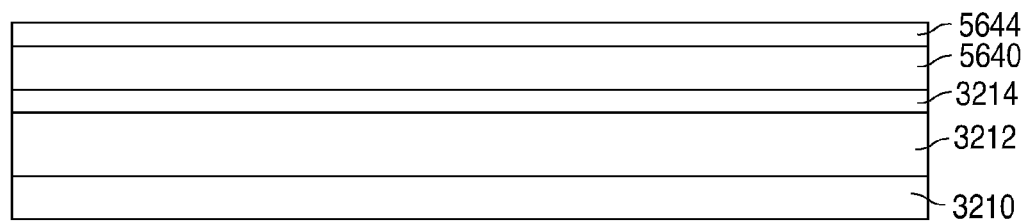
Figure 58C:
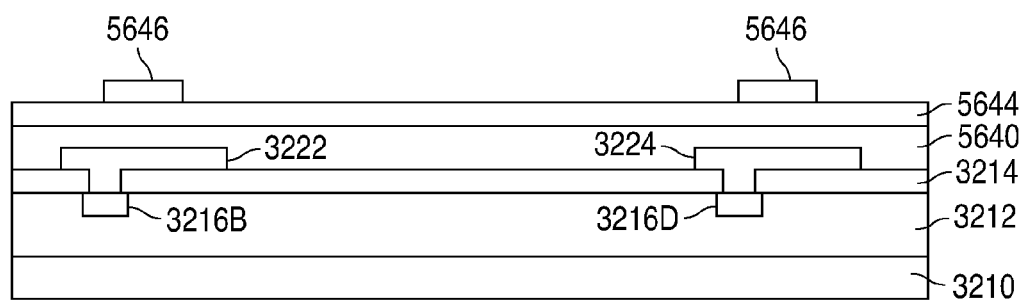

As shown in FIGS. 58A-58C, in a first embodiment, a first magnetic material layer 5644 can be sputter deposited on the top surface of the lower non-conducting layer 5640. The first magnetic material layer 5644 can be implemented with, for example, cobalt tantalum zirconium (CoTaZr) or permalloy.

Figure 59A:
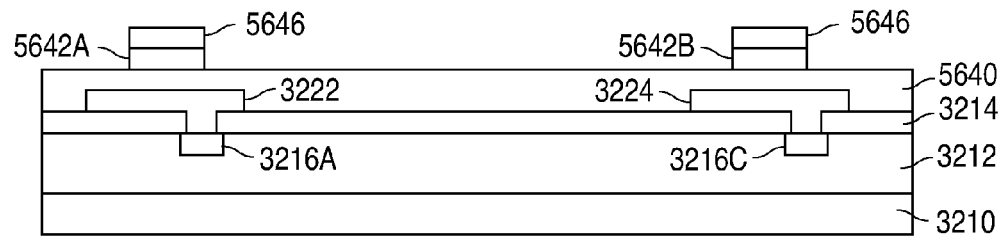
Figure 59B:
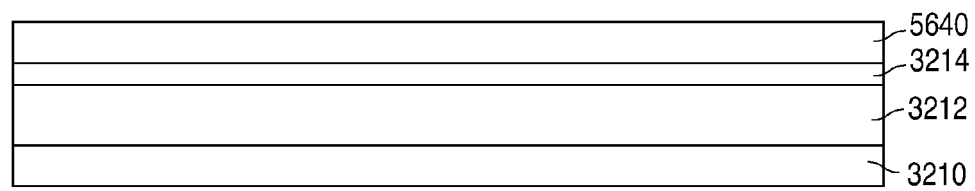
Figure 59C:
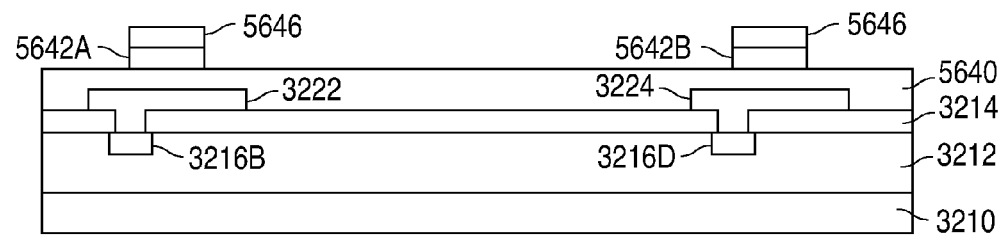

After the first magnetic material layer 5644 has been formed, a mask 5646 is formed and patterned on the first magnetic material layer 5644. The mask 5646 has a pair of patterns that each has a width WM, a thickness TM, and a length LM where one of the patterns lies over the primary coil members 3222 and one of the patterns lies over the secondary coil member 3224. Once the mask 5646 has been patterned, as shown in FIGS. 59A-59C, the exposed regions of the first magnetic material layer 5644 are etched and removed to form the core members 5642A and 5642B. Mask 5646 is then removed.

In accordance with the present invention, the magnetic material layer 5644 is subjected to the presence of a strong magnetic field that induces the easy axis of the magnetic material layer 5644 to be substantially perpendicular to the lengths LM of the patterns which, in turn, causes the easy axis of the magnetic material layer 5644 to be substantially perpendicular to the lengths of the core members 5642A and 5642B.

The strong magnetic field can be applied during the deposition of the magnetic material layer 5644. Alternately, the strong magnetic field can be applied during an anneal at elevated temperatures after the deposition of the magnetic material layer 5644, or after patterning the magnetic material layer 5644 to form the core members 5642A and 5642B.

Figure 60A:
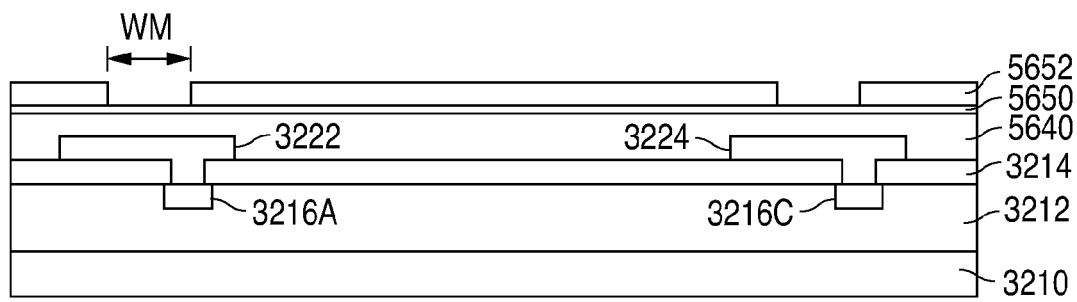
Figure 60B:
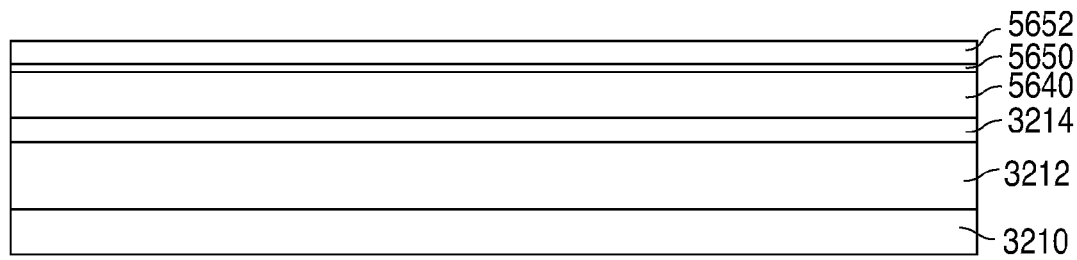
Figure 60C:
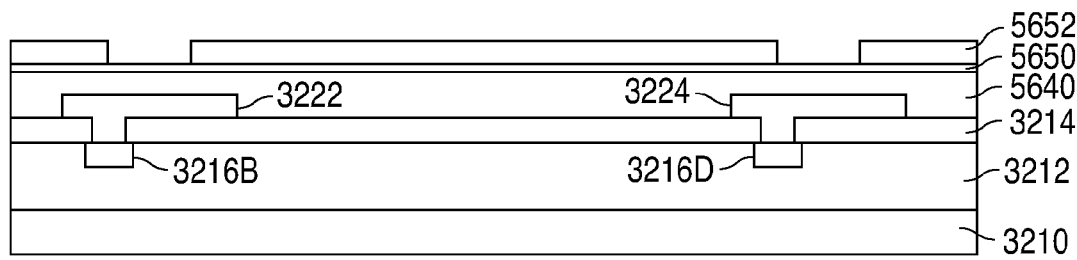

Alternately, as shown in FIGS. 60A-60C, in a second embodiment, the core members 5642A and 5642B can be formed by depositing a seed layer 5650 on the top surface of lower non-conducting layer 5640. For example, the seed layer 5650 can be formed by depositing 300 Å of titanium, 3000 Å of copper, and 300 Å of titanium. (The seed layer 5650 can also include a barrier layer to prevent copper electromigration if needed.) After the seed layer 5650 has been formed, a plating mold 5652 is formed and patterned on the top surface of the seed layer 5650. The plating mold 5652 is formed to have a pair of openings that each have a length LM, a width WM, and a thickness.

Figure 61A:
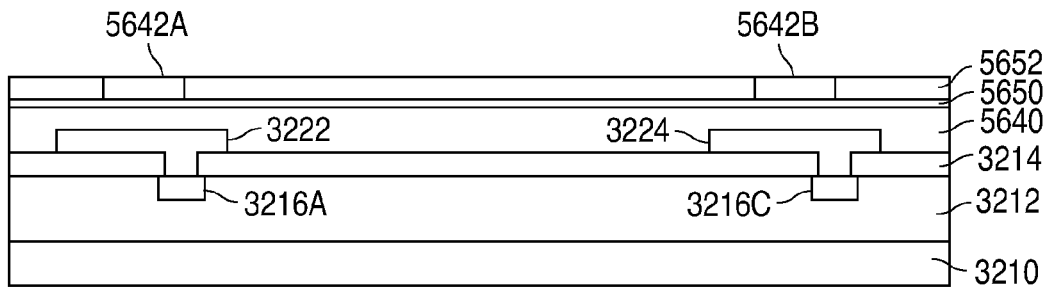
Figure 61B:
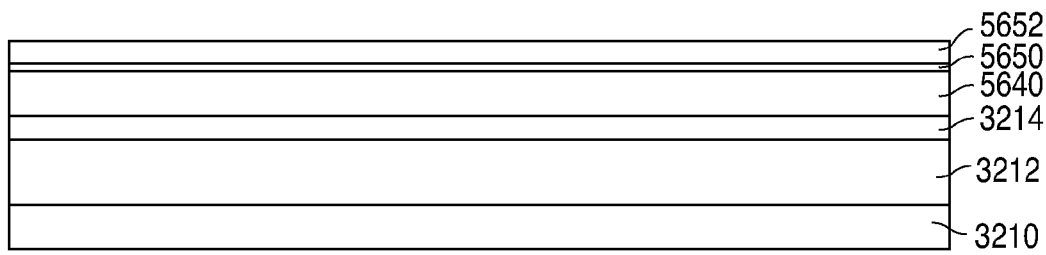
Figure 61C:
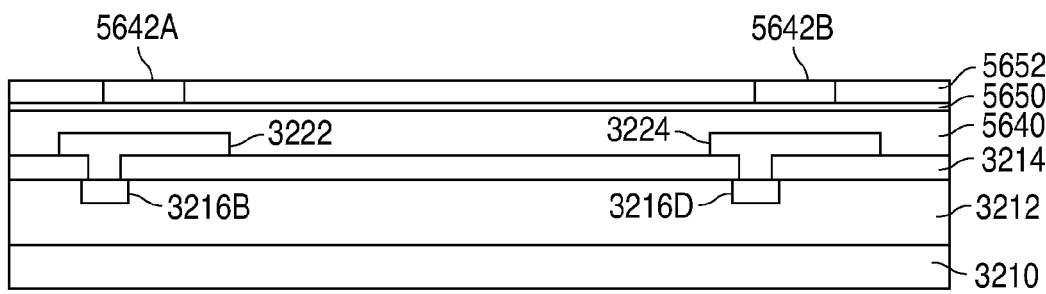
Figure 62A:
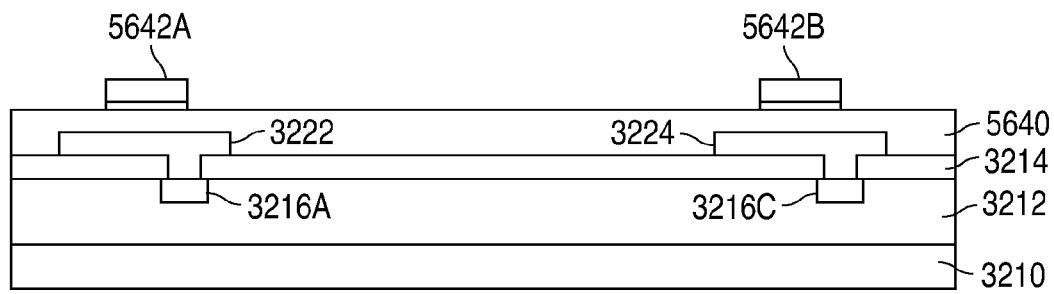
Figure 62B:
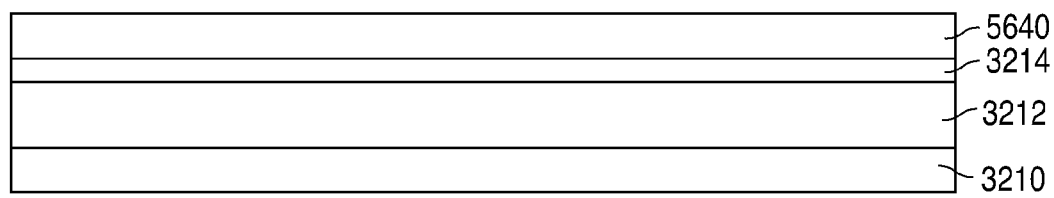
Figure 62C:
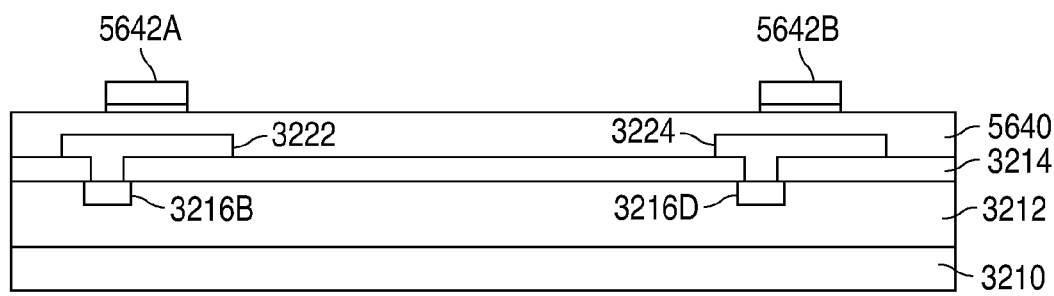

Next, following the formation of the plating mold 5652, as illustrated in FIGS. 61A-61C, the top titanium layer is stripped and a magnetic material, such as an alloy of nickel and iron like permalloy, is deposited by electroplating to a thickness of, for example, 10 μm to form the core members 5642A and 5642B. As shown in FIGS. 62A-62C, after the electroplating, the plating mold 5652 and the underlying regions of the seed layer 3250 are removed to expose the core members 5642A and 5642B.

In accordance with the present invention, the magnetic material is subjected to the presence of a strong magnetic field that induces the easy axis of the magnetic material to be substantially parallel to the widths of the openings WM in the plating mold 5652 which, in turn, causes the easy axis of the magnetic material to be substantially perpendicular to the length of the core members 5642A and 5642B. The strong magnetic field can be applied during the electroplating of the magnetic material. Alternately, the strong magnetic field can be applied during an anneal at elevated temperatures after the electroplating process.

As shown in FIGS. 63 and 64A-64C, after the core members 5642A and 5642B have been formed, the method forms a thin insulation layer 5654 to touch the top surface of the lower non-conducting layer 5640 and the core members 5642A and 5642B. The thin insulation layer 5654 can be implemented with, for example, oxide.

As further shown in FIGS. 63 and 64A-64C, after the thin insulation layer 5654 has been formed, the method forms a second pair of spaced-apart core members 5642C and 5642D on the thin insulation layer 5654. The core members 5642C and 5642D can be formed in a number of different ways.

Figure 65A:
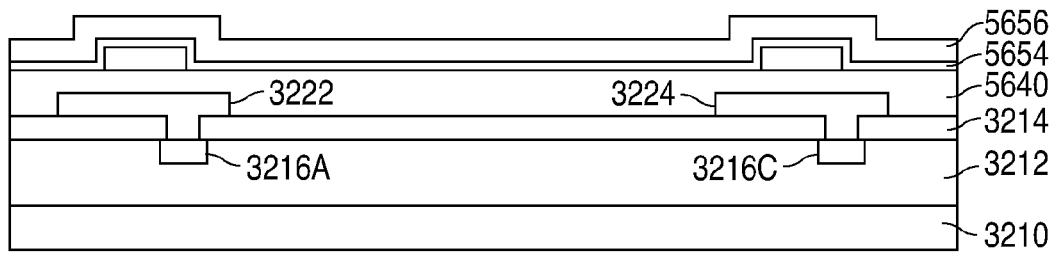
Figure 65B:
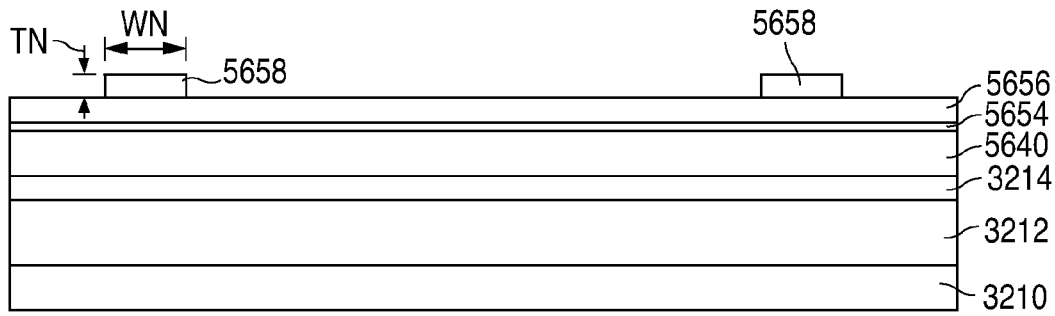
Figure 65C:
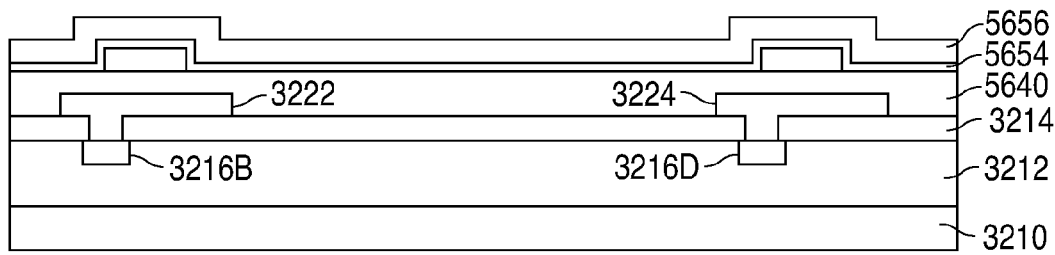

As shown in FIGS. 65A-65C, in a first embodiment, a second magnetic material layer 5656 can be sputter deposited on the top surface of the thin insulation layer 5654. The second magnetic material layer 5656 can be implemented with, for example, cobalt tantalum zirconium (CoTaZr) or permalloy.

Figure 66A:
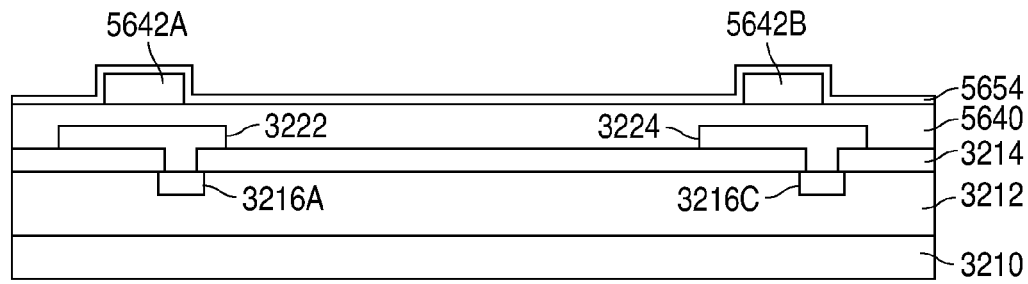
Figure 66B:
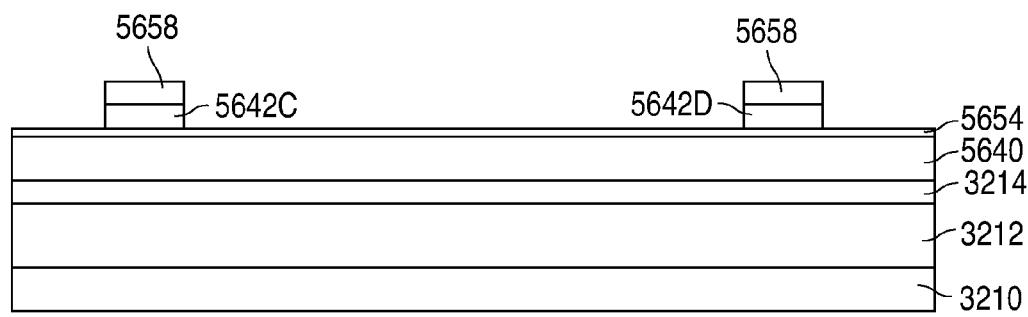
Figure 66C:
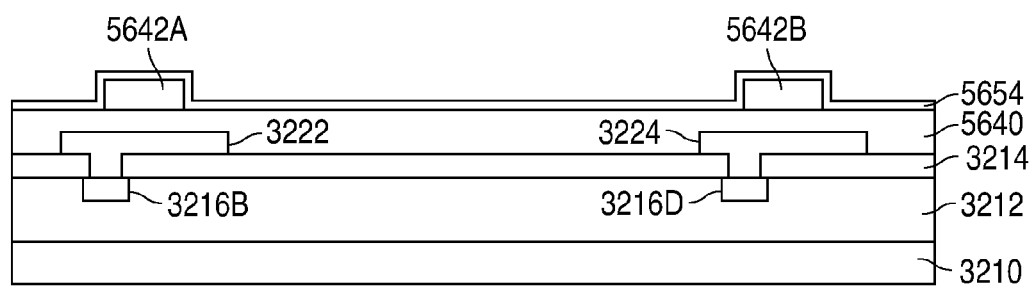

After the second magnetic material layer 5656 has been formed, a mask 5658 is formed and patterned on the second magnetic material layer 5656. The mask 5658 has a pair of patterns that each has width WN, a thickness TN, and a length LN. Once mask 5658 has been patterned, as shown in FIGS. 66A-66C, the exposed regions of the second magnetic material layer 5656 are etched and removed to form the core members 5642C and 5642D. Mask 5658 is then removed.

In accordance with the present invention, the second magnetic material layer 5656 is sputter deposited in the presence of a strong magnetic field that induces the easy axis of the second magnetic material layer 5656 to lie substantially perpendicular to the length LN of the mask 5658. As a result, the easy axis of the first magnetic material layer 5644 and the easy axis of the second magnetic material layer 5656 are substantially perpendicular.

Figure 67A:
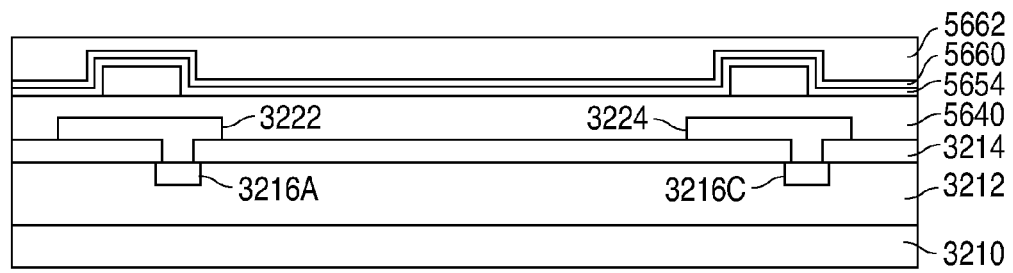
Figure 67B:
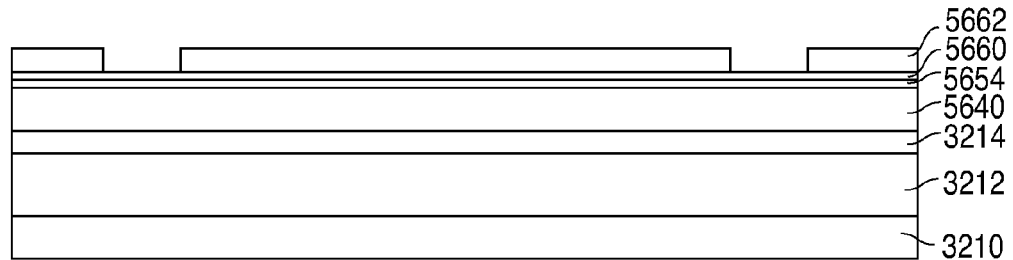
Figure 67C:
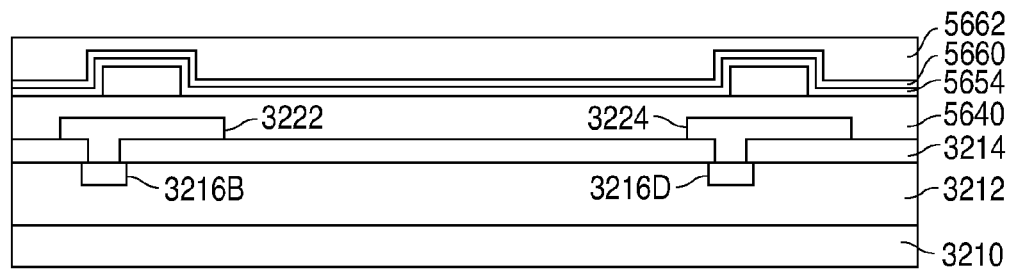

Alternately, as shown in FIGS. 67A-67C, in a second embodiment, the core members 5642C and 5642D can be formed by depositing a seed layer 5660 on the top surface of the thin insulation layer 5654. For example, the seed layer 5660 can be formed by depositing 300 Å of titanium, 3000 Å of copper, and 300 Å of titanium. (The seed layer 5660 can also include a barrier layer to prevent copper electromigration if needed.) After the seed layer 5660 has been formed, a plating mold 5662 is formed and patterned on the top surface of the seed layer 5660 to have a pair of openings. The plating mold 5660 is formed to have a pair of openings that each have a width WN and the length LN.

Next, following the formation of the plating mold 5652, as illustrated in FIGS. 68A-68C, the top titanium layer is stripped and a magnetic material, such as an alloy of nickel and iron like permalloy, is deposited by electroplating to a thickness of, for example, 10 μm to form the core members 5642C and 5642D.

In accordance with the present invention, the magnetic material is electroplated in a strong magnetic field that induces the easy axis of the magnetic material to lie substantially parallel to the widths WN of the pair of openings in plating mold 5662. As shown in FIGS. 69A-69C, after the electroplating, the plating mold 5662 and the underlying regions of the seed layer 3260 are removed to expose the core members 5642C and 5642D.

As shown in FIGS. 70 and 71A-71C, after the core sections 5642C and 5642D have been formed, the method forms the tops and sides of the primary coil, and the tops and sides of the secondary coil. For example, after the core sections 5642C and 5642D have been formed, an upper non-conducting layer 5670, such as an oxide layer, is formed to touch the top surface of the thin insulator layer 5654 and the core sections 5642C and 5642D. The upper non-conducting layer 5670 can be formed by depositing an oxide to a thickness of, for example, 1 μm, and then chemically-mechanically polishing the oxide to have a target thickness of, for example, 2000 Å over the lower non-conducting layer 5640.

As shown in FIGS. 70 and 71A-71C, after the upper non-conducting layer 5670 has been formed, a number of spaced-apart upper primary coil members 5672 are formed to touch the ends of the lower primary coil members 3222 to form the primary coil 826, and a number of spaced-apart upper secondary coil members 5674 are formed to touch the ends of the lower secondary coil members 3224 to form the secondary coil 828.

Figure 72A:
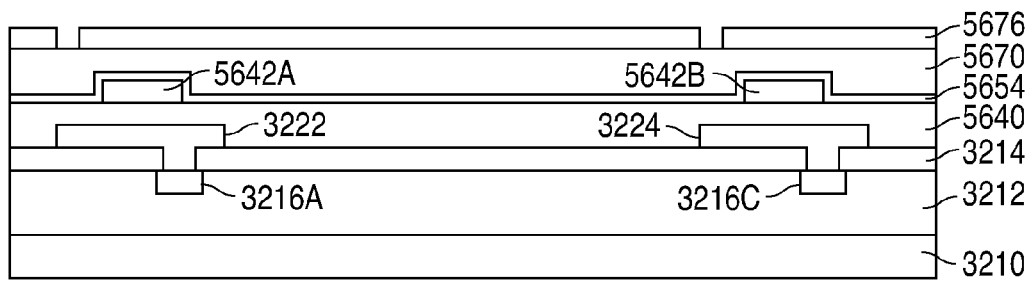
Figure 72B:
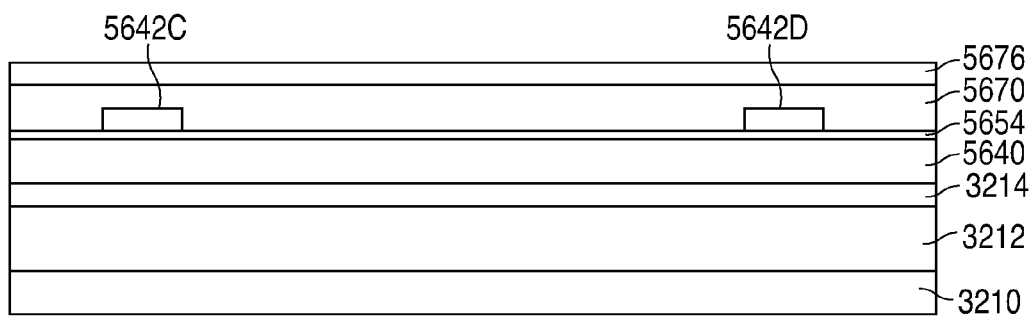
Figure 72C:
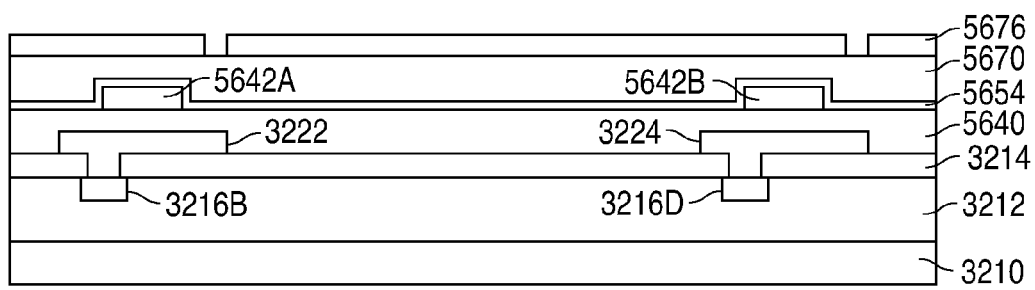

As shown in FIGS. 72A-72C, after the upper non-conducting layer 5670 has been formed, the primary coil members 5672 and the secondary coil members 5674 can be formed by forming and patterning a mask 5676, such as a layer of photoresist, on the top surface of the upper non-conducting layer 5670.

Figure 73A:
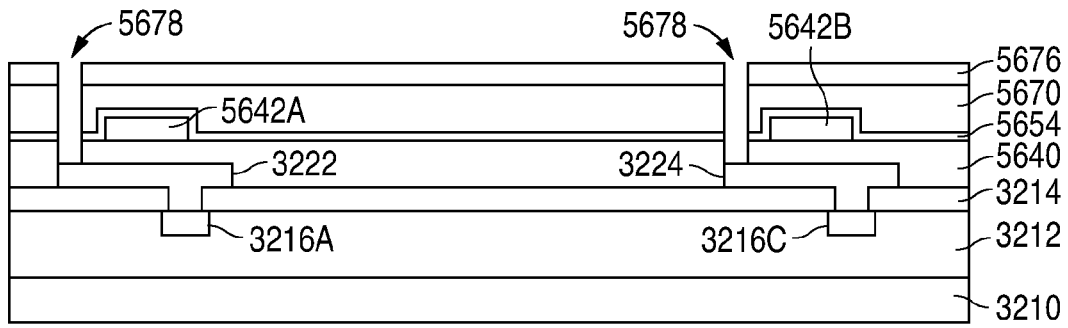
Figure 73B:
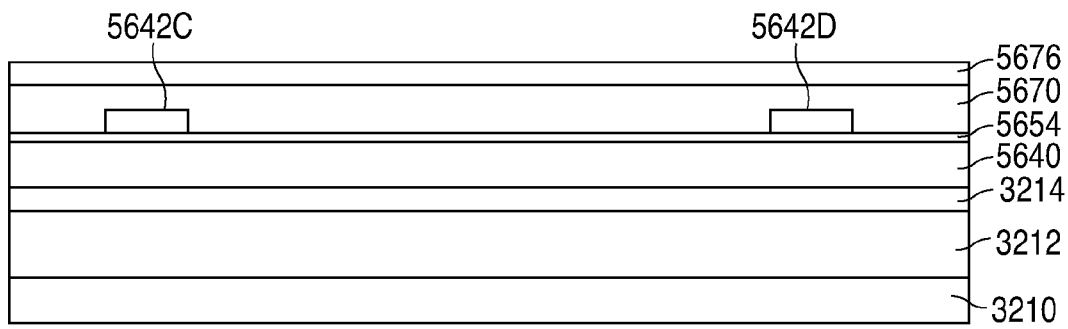
Figure 73C:
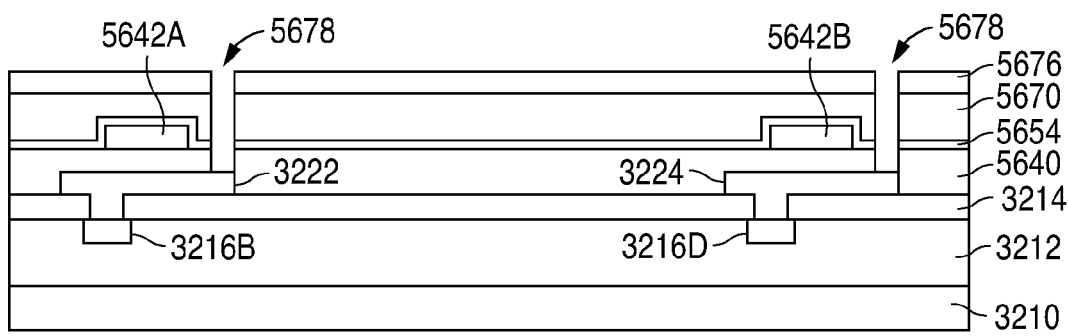

Following the formation and patterning of the mask 5676, as shown in FIGS. 73A-73C, the exposed regions of the upper non-conducting layer 5670, the thin insulation layer 5654, and underlying non-conducting layer 5640 are next sequentially etched to form a number of vertical openings 5678. Mask 5676 is then removed. The vertical openings 5678 are via-type openings that expose the top surfaces of the ends of the lower primary coil members 3222 and the top surfaces of the ends of the lower secondary coil members 3224.

Figure 74A:
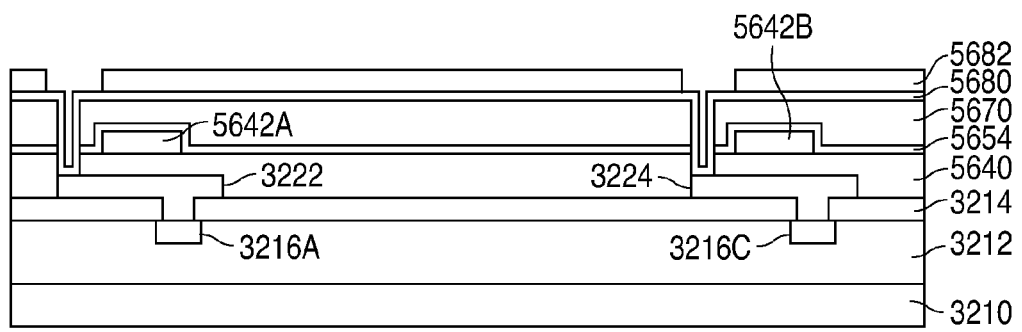
Figure 74B:
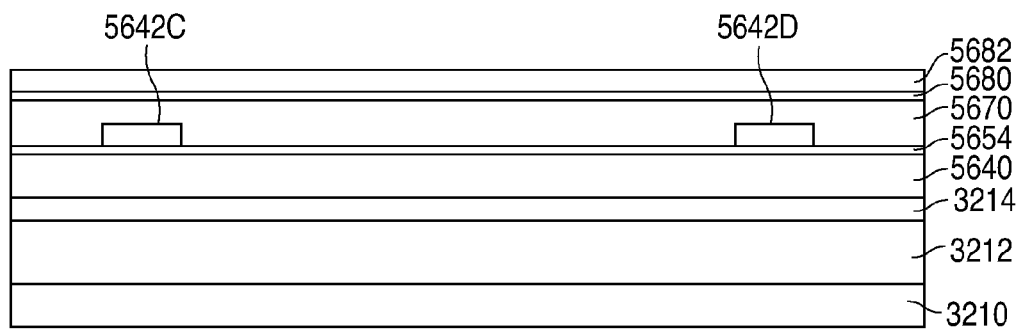
Figure 74C:
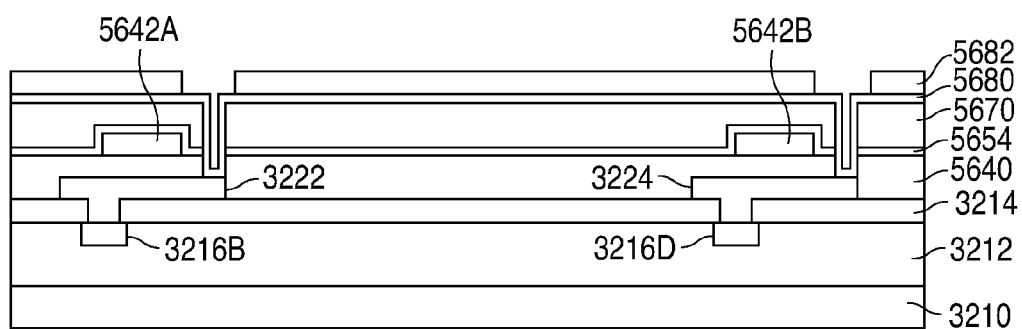

Once mask 5676 has been removed, as shown in FIGS. 74A-74C, a seed layer 5680 is formed on the upper non-conducting layer 5670, the exposed ends of the lower primary coil members 3222, and the exposed ends of the lower secondary coil members 3224. For example, the seed layer 5680 can be formed by depositing 300 Å of titanium, 3000 Å of copper, and 300 Å of titanium. (The seed layer 5680 can also include a barrier layer to prevent copper electromigration if needed.) After the seed layer 5680 has been formed, a plating mold 5682 is formed and patterned on the top surface of the seed layer 5680.

Figure 75A:
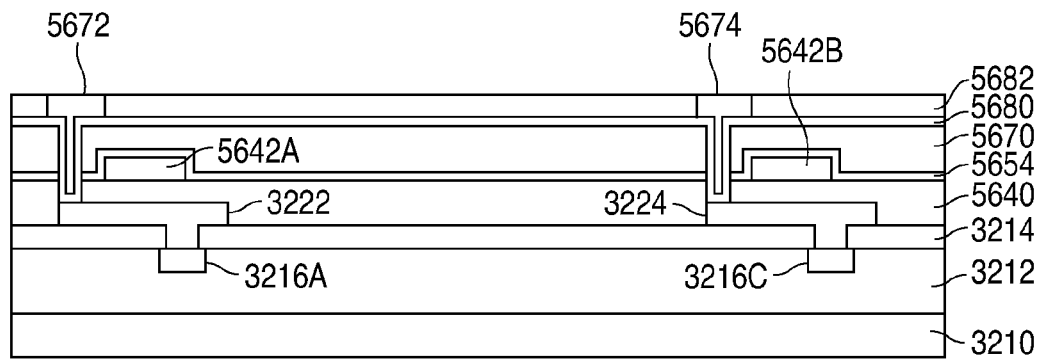
Figure 75B:
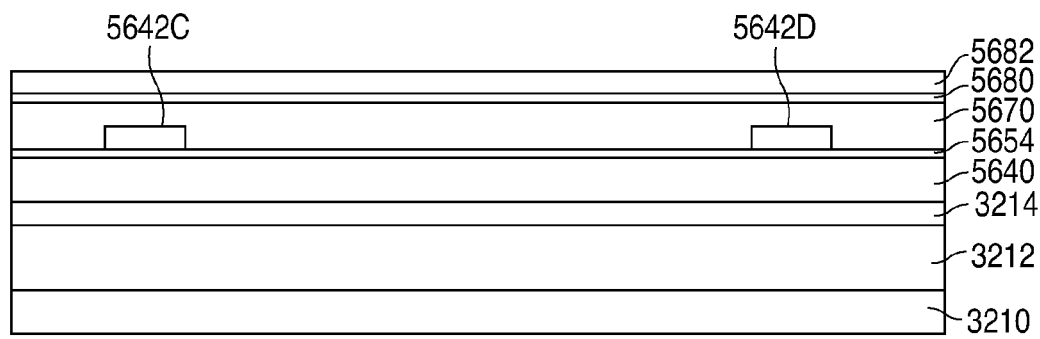
Figure 75C:
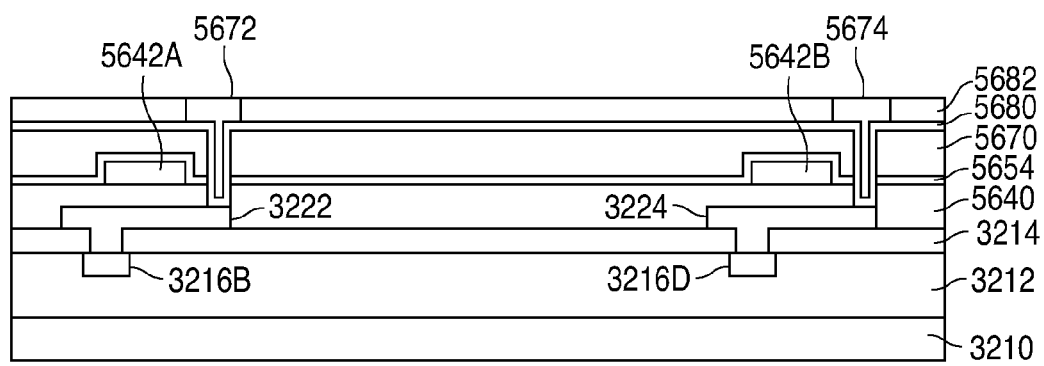
Figure 76A:
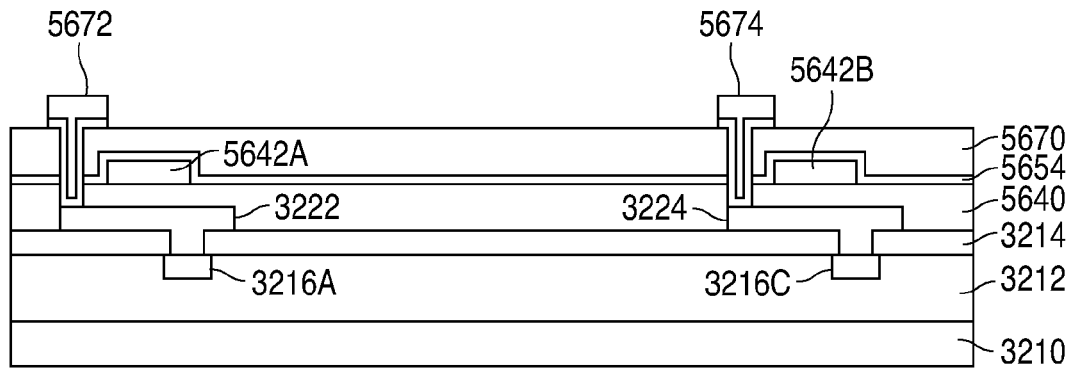
Figure 76B:
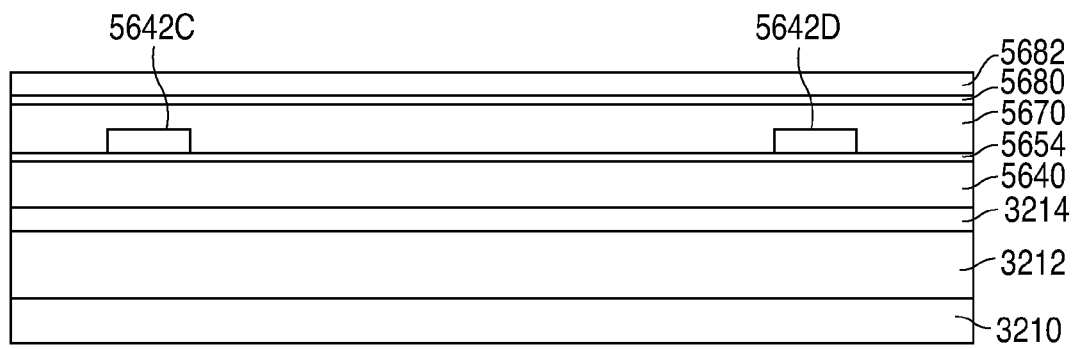
Figure 76C:
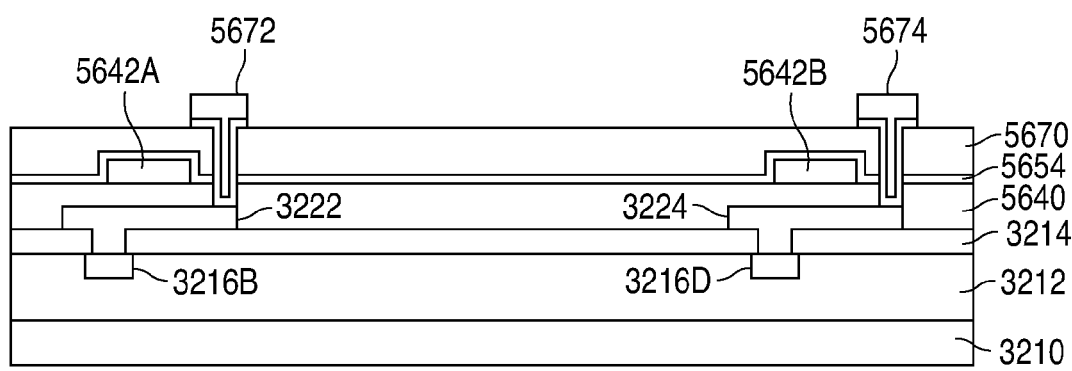

Next, as shown in FIGS. 75A-75C, following the formation and patterning of the plating mold 5682, the top titanium layer is stripped and copper is deposited by electroplating to form the upper primary coil members 5672 and the upper secondary coil members 5674. The upper primary coil members 5672 touch the ends of the lower primary coil members 3222 to form the primary coil 826. The upper secondary coil members 5674 touch the ends of the lower secondary coil members 3224 to form the secondary coil 828. Following this, as shown in FIGS. 76A-76C, the plating mold 5682 and the underlying regions of seed layer 5680 are removed to complete the formation of transformer 800.

It should be understood that the above descriptions are examples of the present invention, and that various alternatives of the invention described herein may be employed in practicing the invention. For example, the structure of the primary coil in transformer 100 can be used in transformers 500 and 800, while the structure of the primary coil in transformers 500 and 800 can be used in transformer 100. Therefore, it is intended that the following claims define the scope of the invention and that structures and methods within the scope of these claims and their equivalents be covered thereby.

What is claimed is:

1. A transformer comprising:
   a non-conductive structure;
   a magnetic core structure including:
      a first magnetic structure that touches the non-conductive structure, the first magnetic structure having a hard axis that lies in a first direction, and a bottom surface that lies in a horizontal plane;
      a second magnetic structure that touches the non-conductive structure, the second magnetic structure having a hard axis that lies in a second direction different from the first direction, and a bottom surface; and
      a third magnetic structure that touches the non-conductive structure, the third magnetic structure having a hard axis that lies in the first direction, and a bottom surface that lies in the horizontal plane, the first, second, and third magnetic structures being spaced apart from each other; and
   a first coil that touches the non-conductive structure, the first coil being wrapped around the first magnetic structure so that magnetic field lines from the first coil extend along the hard axes of the first, second, and third magnetic structures.

2. The transformer of claim 1 wherein the bottom surface of the second magnetic structure lies above and spaced apart from the horizontal plane.

3. The transformer of claim 1 wherein the magnetic core structure further includes a fourth magnetic structure that touches the non-conductive structure, the fourth magnetic structure having a hard axis that lies in the second direction, and a bottom surface that lies above and spaced apart from the horizontal plane, the fourth magnetic structure being spaced apart from the first, second, and third magnetic structures, magnetic field lines from the first coil within the first, second, third, and fourth magnetic structures extending along substantially only the hard axes of the first, second, third, and fourth magnetic structures.

4. The transformer of claim 1 wherein the hard axes of the first and third magnetic structures are substantially parallel to a longitudinal axis of the first coil.

5. The transformer of claim 1 wherein magnetic field lines within the first, second, and third magnetic structures extend substantially only along the hard axes of the first, second, and third magnetic structures.

6. The transformer of claim 1 and further comprising a second coil that touches the non-conductive structure, the second coil being wrapped around only the third magnetic structure.

7. The transformer of claim 6 and further comprising a third coil that touches the non-conductive structure, the third coil being wrapped around only the second magnetic structure.

8. The transformer of claim 7:
wherein the magnetic core structure further includes a fourth magnetic structure that touches the non-conductive structure, the fourth magnetic structure having a hard axis that lies in the second direction, and being spaced apart from the first, second, and third magnetic structures, magnetic field lines within the first, second, third, and fourth magnetic structures extending along substantially only the hard axes of the first, second, third, and fourth magnetic structures; and
further comprising a fourth coil that touches the non-conductive structure, the fourth coil being wrapped around only the fourth magnetic structure.

9. A transformer comprising:
a non-conductive structure;
a magnetic core structure including:
  a first magnetic structure that touches the non-conductive structure, the first magnetic structure having a hard axis that lies in a first direction; and
  a second magnetic structure that touches the non-conductive structure, the second magnetic structure having a hard axis that lies in a second direction different from the first direction, the first and second magnetic structures being spaced apart from each other; and
a first coil that touches the non-conductive structure, the first coil being wrapped around only the first magnetic structure so that magnetic field lines from the first coil extend along the hard axes of the first and second magnetic structures.

10. The transformer of claim 9 wherein magnetic field lines within the first and second magnetic structures extend substantially only along the hard axes of the first and second magnetic structures.

11. The transformer of claim 9:
wherein the magnetic core structure further includes a third magnetic structure that touches the non-conductive structure, the third magnetic structure having a hard axis that lies in the first direction, the third magnetic structure being spaced apart from the first and second magnetic structures; and
further comprising a second coil that touches the non-conductive structure, the second coil being wrapped around only the third magnetic structure.

12. The transformer of claim 11 wherein the hard axes of the first and third magnetic structures are substantially parallel to a longitudinal axis of the first coil.

13. The transformer of claim 11 and further comprising a third coil that touches the non-conductive structure, the third coil being wrapped around the second magnetic structure.

14. The transformer of claim 13 wherein the magnetic core structure further includes a fourth magnetic structure that touches the non-conductive structure, the fourth magnetic structure having a hard axis that lies in the second direction, the fourth magnetic structure being spaced apart from the first, second, and third magnetic structures, magnetic field lines from the first coil within the first, second, third, and fourth magnetic structures extending along substantially only the hard axes of the first, second, third, and fourth magnetic structures; and
further comprising a fourth coil that touches the non-conductive structure, the fourth coil being wrapped around only the fourth magnetic structure.

15. The transformer of claim 9 and further comprising:
a first die having a first substrate and a first metal interconnect structure that touches the first substrate and the non-conductive structure; and
a second die having:
  a second substrate;
  a second metal interconnect structure that touches the second substrate;
  a non-conductive member that touches the second metal interconnect structure;
  a magnetic core structure including:
    a third magnetic structure that touches the non-conductive member, the third magnetic structure having a hard axis that lies in the first direction; and
    a fourth magnetic structure that touches the non-conductive member, the fourth magnetic structure having a hard axis that lies in the second direction, the third and fourth magnetic structures being spaced apart from each other and from the first and second magnetic structures, magnetic field lines from the first coil extending along the hard axes of the third and fourth magnetic structures; and
  a second coil that touches the non-conductive member, the second coil being wrapped around the third magnetic structure.

16. The transformer of claim 15 wherein magnetic field lines within the first, second, third, and fourth magnetic structures extend substantially only along the hard axes of the first, second, third, and fourth magnetic structures.

17. A method of forming a transformer comprising:
forming a non-conductive structure;
forming a magnetic core structure including:
  forming a first magnetic structure that touches the non-conductive structure, the first magnetic structure having a hard axis that lies in a first direction, and a bottom surface that lies in a horizontal plane;
  forming a second magnetic structure that touches the non-conductive structure, the second magnetic structure having a hard axis that lies in a second direction different from the first direction, and a bottom surface; and
  forming a third magnetic structure that touches the non-conductive structure, the third magnetic structure having a hard axis that lies in the first direction, and a bottom surface that lies in the horizontal plane, the first, second, and third magnetic structures being spaced apart from each other; and
forming a first coil that touches the non-conductive structure, the first coil being wrapped around the first magnetic structure so that magnetic field lines from the first coil extend along the hard axes of the first, second, and third magnetic structures.

18. The method of claim 17 wherein the bottom surface of the second magnetic structure lies above and spaced apart from the horizontal plane.

19. The method of claim 17 and further comprising forming a second coil that touches the non-conductive structure, the second coil being wrapped around only the third magnetic structure.

20. The method of claim 17 and further comprising forming a fourth magnetic structure that touches the non-conductive structure, the fourth magnetic structure having a hard axis that lies in the second direction, and a bottom surface that lies above and spaced apart from the horizontal plane, the fourth magnetic structure being spaced apart from the first, second, and third magnetic structures, magnetic field lines from the first coil within the first, second, third, and fourth magnetic structures extending along substantially only the hard axes of the first, second, third, and fourth magnetic structures.

* * * * *